US006727044B1

(12) United States Patent
Fujimaki et al.

(10) Patent No.: US 6,727,044 B1
(45) Date of Patent: Apr. 27, 2004

(54) METHOD FOR PRODUCING LITHOGRAPHIC PRINTING PLATE, LITHOGRAPHIC PRINTING ORIGINAL PLATE FOR LASER SCAN EXPOSURE, AND PHOTOPOLYMERIZABLE COMPOSITION

(75) Inventors: Kazuhiro Fujimaki, Shizuoka (JP); Yasuo Okamoto, Shizuoka (JP); Tatsuji Higashi, Shizuoka (JP); Tadahiro Sorori, Shizuoka (JP)

(73) Assignee: Fuji Photo Film Co., Ltd., Ashigara (JP)

( * ) Notice: Subject to any disclaimer, the term of this patent is extended or adjusted under 35 U.S.C. 154(b) by 0 days.

(21) Appl. No.: 09/289,194

(22) Filed: Apr. 9, 1999

(30) Foreign Application Priority Data

Apr. 9, 1998 (JP) .......................................... 10-116232
Sep. 29, 1998 (JP) .......................................... 10-291396

(51) Int. Cl.[7] .......................... G03C 1/725; G03F 7/30

(52) U.S. Cl. .............................. 430/284.1; 430/281.1; 430/286.1; 430/300; 430/302

(58) Field of Search ............................... 430/905, 906, 430/908, 913, 300, 302, 286.1, 281.1, 284.1, 285.1

(56) References Cited

U.S. PATENT DOCUMENTS

| | | | | | |
|---|---|---|---|---|---|
| 4,590,287 | A | | 5/1986 | Riediker et al. | 556/53 |
| 5,053,317 | A | * | 10/1991 | Joerg et al. | 430/281.1 |
| 5,204,222 | A | * | 4/1993 | Gersdorf et al. | 430/281.1 |
| 5,290,663 | A | * | 3/1994 | Huynh-Tran | 430/270.1 |
| 5,340,685 | A | * | 8/1994 | Sekiya et al. | 430/175 |
| 5,341,799 | A | * | 8/1994 | Fifield et al. | 528/49 |
| 5,723,260 | A | * | 3/1998 | Tsuji et al. | 430/278.1 |
| 5,800,965 | A | * | 9/1998 | Tsuji et al. | 430/287.1 |
| 5,837,422 | A | * | 11/1998 | Sasaki et al. | 430/284.1 |
| 6,010,824 | A | * | 1/2000 | Komano et al. | 430/281.1 |
| 6,242,101 | B1 | * | 6/2001 | Schwalm et al. | 428/423.1 |
| 6,331,376 | B1 | * | 12/2001 | Kojima et al. | 430/284.1 |
| 6,391,936 | B1 | * | 5/2002 | Noren et al. | 522/93 |

FOREIGN PATENT DOCUMENTS

| | | |
|---|---|---|
| EP | 0 372 361 | 6/1990 |
| EP | 0 602 292 | 6/1994 |
| GB | 2 020 297 | 11/1979 |

* cited by examiner

*Primary Examiner*—Janet Baxter
*Assistant Examiner*—Yvette C. Thornton
(74) *Attorney, Agent, or Firm*—Burns, Doane, Swecker & Mathis, LLP

(57) ABSTRACT

A method for producing a lithographic printing plate is disclosed, comprising performing the plate-making by scan exposing a lithographic printing original plate comprising a hydrophilic support having thereon a photosensitive layer containing i) at least one polyurethane resin binder, ii) at least one compound having an addition polymerizable ethylenically unsaturated bond, and iii) at least one photopolymerization initiation system. Also disclosed are a photosensitive composition for use in the photosensitive layer of the lithographic printing original plate.

6 Claims, No Drawings

METHOD FOR PRODUCING LITHOGRAPHIC PRINTING PLATE, LITHOGRAPHIC PRINTING ORIGINAL PLATE FOR LASER SCAN EXPOSURE, AND PHOTOPOLYMERIZABLE COMPOSITION

FIELD OF THE INVENTION

The present invention relates to a lithographic printing original plate, more specifically, a lithographic printing original plate for the plate-making process by scan exposure based on digital signals. Furthermore, the present invention relates to a method for producing a lithographic printing plate using the original plate and relates to a photopolymerizable composition for use in the photosensitive layer of the lithographic printing original plate.

BACKGROUND OF THE INVENTION

Heretofore, a PS plate comprising a hydrophilic support having thereon a lipophilic photosensitive resin has been widely used as a lithographic printing plate. According to the production method thereof in usual, a plate is subjected to mask exposure (plane exposure) through a lithographic film and then the non-image area is dissolved and removed to obtain a desired printing plate.

In recent years, digitization technology of electrically processing, storing and outputting an image information using a computer has been popularized. To cope with the digitization technology, various new methods for outputting an image have been proposed and are actually used. This tendency has yielded the demand for a computer-to-plate (CTP) technique where a printing plate can be directly produced by scanning a highly directive light such as laser light according to a digitized image information and a lithographic film can be dispensed with. As a result, it has become an important technical concern to obtain a printing original plate suitable for the CTP production.

As one of the systems for obtaining a lithographic printing plate capable of scan exposure, a constitution such that a photopolymerizable composition layer having a very excellent photosensitive speed is provided as the photosensitive resin layer formed on a hydrophilic support and an oxygen-impermeable protective layer is further provided thereon, is used in many proposals heretofore made. Some of these proposals are available on the market. The photopolymerizable composition used fundamentally comprises an ethylenically unsaturated compound, a photopolymerization initiator system and a binder resin, and the image formation proceeds as follows. The photopolymerization initiation system absorbs light to generate active radicals and thereby cause addition polymerization of the ethylenically unsaturated compound, and then the photosensitive layer is insolubilized.

In most of conventional proposals on the scan exposure-type lithographic printing plate using a photopolymerization system photosensitive layer, use of a specific photopolymerization initiation system having excellent photosensitivity is disclosed. A large number of high-sensitivity initiation systems are described, for example, in Bruce M. Monroe et al., *Chemical Revue.*, 93, 435 (1993) and R. S. Davidson, *Journal of Photochemistry and Biology A: Chemistry*, 73, 81 (1993).

Some of the initiation systems disclosed have very excellent photosensitivity and by using a photopolymerization photosensitive layer containing such an initiation system, a lithographic printing original plate capable of forming an image with an economical scan exposure light source of approximately from 30 to 200 mW, such as Ar laser (488 nm) or FD-YAG laser (532 nm), can be obtained. However, the lithographic printing original plate obtained is by no means satisfied with respect to the practical performance.

More specifically, the scan exposure-type lithographic printing plate according to conventional techniques has a serious problem that the exposure latitude is narrow. For example, if the laser scanning rate is increased to reduce the plate-making time, a sufficiently long press life cannot be obtained or the dot area ratio decreases in the printing process. On the other hand, if the exposure energy is increased, fogging occurs due to light scattering inherent in the scan exposure optical system.

The technique for obtaining the above-described photopolymerizable composition is important over a wide range even in the industrial field other than CTP, for example, in the field of laser imaging such as photoformation, holography and color hard copy, in the field of manufacture of electronic materials such as photoresist, and in the field of photocurable resin materials such as ink, coating material and adhesive, and demands therefor are more and more increasing.

SUMMARY OF THE INVENTION

A first object of the present invention is to provide a method for producing a lithographic printing plate using a laser scanning lithographic printing original plate which can provide a printing plate having a sufficiently long press life even by high-speed scan exposure and causes little fluctuation in the printing performance of the printing plate depending on the exposure conditions.

A second object of the present invention is to provide a method for producing a lithographic printing plate using the above-described lithographic printing original plate which additionally has excellent developability with an aqueous developer.

A third object of the present invention is to provide a method for producing a lithographic printing plate using the above-described lithographic printing original plate which additionally has good storage stability.

A fourth object of the present invention is to provide a lithographic printing original plate which can simplify the exposure system.

A fifth object of the present invention is to provide a lithographic printing original plate which has high photosensitization rate and excellent storage stability.

A sixth object of the present invention is to provide a photopolymerizable composition suitable for the photosensitive layer of a lithographic printing plate having those superior properties.

As a result of extensive investigations to obtain the above-described objects, the present inventors have found that when a photosensitive layer containing i) at least one polyurethane resin binder, ii) at least one compound having an addition polymerizable ethylenically unsaturated bond, and iii) at least one photopolymerization initiation system is used, the lithographic printing original plate obtained can have a sufficiently long press life even in the conditions of high-speed scan exposure and be reduced in the exposure condition dependency of the printing performance such as fluctuation in the dot area ratio.

More specifically, the present invention is characterized in that a lithographic printing plate is produced using a lithographic printing original plate comprising a hydrophilic support having provided thereon a photosensitive layer containing i) at least one polyurethane resin binder, ii) at least one compound having an addition polymerizable ethylenically unsaturated bond, and iii) at least one photopolymerization initiation system, and processed by scan exposure.

The polyurethane resin is particularly preferably a polyurethane resin having a structural unit derived from a compound selected from the group consisting of a polyether diol compound, a polyester diol compound and a polycarbonate diol compound.

When a urethane resin containing such a component is used, the printing original plate obtained can have good storage stability in particular. This is considered because the urethane resin has good compatibility with other components in the photosensitive layer.

An original plate obtained using a polyurethane resin binder having a carboxyl group in an amount of 0.4 meq/g or more has excellent developability with an aqueous developer and is advantageous in that an organic solvent not preferred in view of labor or environmental conservation can be dispensed with in the development step.

By further providing a protective layer containing a water-soluble oxygen-impermeable substance on the photosensitive layer, the original plate can be prevented from inhibition of the exposure image formation by oxygen in the outside air.

Out of the compounds having an addition polymerizable ethylenically unsaturated bond, when a compound having a urethane structure is used, a photocured product having excellent strength can be obtained. This is considered to result from the interaction between the urethane group in the polyurethane resin and the urethane group in the polymerizable compound photopolymerized.

The photopolymerization initiation system preferably contains at least one titanocene compound, more preferably a sensitizing dye capable of efficiently absorbing a scan source laser ray and a titanocene compound. By using such a photopolymerization system, a photosensitive layer having high photosensitization rate and excellent storage stability can be obtained. Accordingly, a photopolymerizable composition for use in the photosensitive layer preferably contains this component.

These effects in the present invention are described below. In a photosensitive layer using a conventional photopolymerization system, the ethylenically unsaturated compound is polymerized as the exposure proceeds and at last causes insolubilization (formation of an image). At this stage, the strength of the photosensitive layer is insufficient in view of the press life. As the exposure energy increases, the image strength is intensified with the progress of polymerization and the press life is improved according to the exposure value. On the other hand, the photosensitive layer according to the present invention is considered to have high image strength even at the stage of low exposure and low polymerization degree and already reach a high press life with the exposure value of causing insolubilization. Accordingly, even in the conditions of high speed scan exposure, a sufficiently high press life can be attained. Furthermore, the dependency of the layer strength on the exposure value in the high exposure region is relatively small and thereby, it seems that the fluctuation in the printing performance by the exposure condition can be greatly reduced.

With respect to the use of a specific binder resin capable of giving those effects, JP-B-7-120040 (the term "JP-B" as used herein means an "examined Japanese patent publication"), JP-B-7-120041, JP-B-7-120042, JP-B-8-12424, JP-A-63-287944 (the term "JP-A" as used herein means an "unexamined published Japanese patent application"), JP-A-63-287947 and JP-A-1-271741 disclose a lithographic printing plate using a polyurethane resin binder. However, scan exposure is not suggested in any means in these patent publications and improvement of the press life in high scan exposure conditions is never involved.

DETAILED DESCRIPTION OF THE INVENTION

The present invention is described in detail below.

The scan exposure-type lithographic printing plate for use in the present invention comprises a hydrophilic support having provided thereon a photosensitive layer containing i) at least one polyurethane resin binder, ii) at least one compound having an addition polymerizable ethylenically unsaturated bond, and iii) at least one photopolymerization initiation system.

The i) polyurethane resin binder for use in the present invention is described.

(1) Polyurethane Resin

The polyurethane resin used as an essential component in the photosensitive layer of the present invention is a polyurethane resin having a basic skeleton comprising a structural unit as a reaction product of at least one diisocyanate compound represented by formula (1)' and at least one diol compound represented by formula (1)":

$$OCN-X_0-NCO \quad (1)'$$

$$HO-Y_0-OH \quad (1)''$$

(wherein $X_0$ and $Y_0$ each represents a divalent organic residue).

The polyurethane resin used as an essential component in the photosensitive layer of the present invention is preferably a polyurethane resin having a carboxyl group in an amount of 0.4 meq/g or more. The polyurethane resin which is suitably used is a polyurethane having a basic skeleton comprising a structural unit as a reaction product of a diisocyanate compound represented by formula (1) with at least one diol compound represented by formulae (2), (3) and (4) and/or a structural unit derived from a compound obtained by ring-opening a tetracarboxylic acid dianhydride with a diol compound:

$$OCN-L_8-NCO \quad (1)$$

(2)

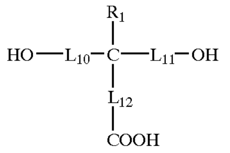

(3)

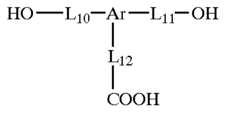

-continued (4)

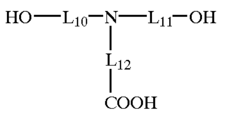

wherein $L_8$ represents a divalent aliphatic or aromatic hydrocarbon group which may have a substituent and if desired, $L_8$ may contain another functional group which does not react with an isocyanate group, such as ester, urethane, amide or ureido;.

$R_1$ represents a hydrogen atom or an alkyl, aralkyl, aryl, alkoxy or aryloxy group which may have a substituent (examples of the substituent include a cyano group, a nitro group, a halogen atom (e.g., —F, —Cl, —Br, —I), $—CONH_2$, $—COOR_{113}$, $—OR_{113}$, $—NHCONHR_{113}$, $—NHCOOR_{113}$, $—NHCOR_{113}$ and $—OCONHR_{113}$ (wherein $R_{113}$ represents an alkyl group having from 1 to 10 carbon atoms or an aralkyl group having from 7 to 15 carbon atoms)), preferably a hydrogen atom, an alkyl group having from 1 to 8 carbon atoms or an aryl group having from 6 to 15 carbon atoms;

$L_{10}$, $L_{11}$ and $L_{12}$, which may be the same or different, each represents a single bond or a divalent aliphatic or aromatic hydrocarbon group which may have a substituent (preferred examples of the substituent include an alkyl group, an aralkyl group, an aryl group, an alkoxy group and a halogeno group), preferably an alkylene group having from 1 to 20 carbon atoms or an arylene group having from 6 to 15 carbon atoms, more preferably an alkylene group having from 1 to 8 carbon atoms, and if desired, $L_{10}$, $L_{11}$ and $L_{12}$ each may have another functional group which does not react with the isocyanate group, such as carbonyl, ester, urethane, amido, ureido or ether, provided that two or three of $R_1$, $L_{10}$, $L_{11}$ and $L_{12}$ may form a ring; and Ar represents a trivalent aromatic hydrocarbon group which may have a substituent, preferably an aromatic group having from 6 to 15 carbon atoms.

a) Diisocyanate Compound

Specific examples of the diisocyanate compound represented by formula (1) include:

aromatic diisocyanate compounds such as 2,4-tolylene diisocyanate, 2,4-tolylene diisocyanate dimer, 2,6-tolylene diisocyanate, p-xylylene diisocyanate, m-xylylene diisocyanate, 4,4'-diphenylmethane diisocyanate, 1,5-naphthylene diisocyanate and 3,3'-dimethylbiphenyl-4,4'-diisocyanate; aliphatic diisocyanate compounds such as hexamethylene diisocyanate, trimethylhexamethylene diisocyanate, lysine diisocyanate and dimeric acid diisocyanate; alicyclic diisocyanate compounds such as isophorone diisocyanate, 4,4'-methylenebis(cyclohexylisocyanate), methylcyclohexane-2,4(or 2,6)-diisocyanate and 1,3-(isocyanatomethyl)cyclohexane; and diisocyanate compounds as a reaction product of a diol and a diisocyanate, such as an adduct of 1 mol of 1,3-butylene glycol and 2 mol of tolylene diisocyanate.

b) Diol Compound Having Carboxyl Group

Specific examples of the diol compound having a carboxyl group, represented by formula (2), (3) or (4) include:

3,5-dihydroxybenzoic acid, 2,2-bis(hydroxymethyl) propionic acid, 2,2-bis(2-hydroxyethyl)propionic acid, 2,2-bis(3-hydroxypropyl)propionic acid, bis (hydroxymethyl)acetic acid, bis(4-hydroxyphenyl) acetic acid, 2,2-bi-(hydroxymethyl)butyric acid, 4,4-bis(4-hydroxyphenyl)pentanoic acid, tartaric acid, N,N-dihydroxyethylglycine and N,N-bis(2-hydroxyethyl)-3-carboxy-propionamide.

In the present invention, the tetracarboxylic acid dianhydride for use in the synthesis of the polyurethane resin is preferably a compound represented by formula (5), (6) or (7):

(5)

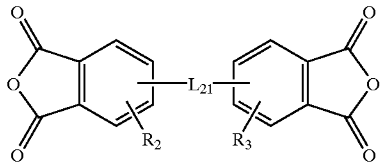

(6)

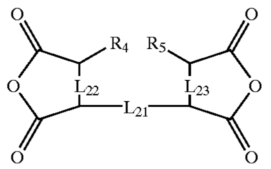

(7)

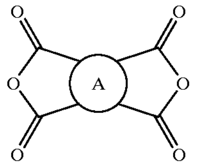

wherein $L_{21}$ represents a single bond, a divalent aliphatic or aromatic hydrocarbon group which may have a substituent (preferred examples of the substituent include an alkyl group, an aralkyl group, an aryl group, an alkoxy group, a halogeno group, an ester group or an amido group), —CO—, —SO—, $—SO_2—$, —O— or —S—, preferably a single bond, a divalent aliphatic hydrocarbon group having from 1 to 15 carbon atoms, —CO—, $—SO_2—$, —O— or —S—; $R_2$ and $R_3$, which may be the same or different, each represents a hydrogen atom, an alkyl group, an aralkyl group, an aryl group, an alkoxy group or a halogeno group, preferably a hydrogen atom, an alkyl group having from 1 to 8 carbon atoms, an aryl group having from 6 to 15 carbon atoms, an alkoxy group having from 1 to 8 carbon atoms or a halogeno group, and two of $L_{21}$, $R_2$ and $R_3$ may be combined to form a ring; $R_4$ and $R_5$, which may be the same or different, each represents a hydrogen atom, an alkyl group, an aralkyl group, an aryl group or a halogeno group, preferably a hydrogen atom, an alkyl group having from 1 to 8 carbon atoms or an aryl group having from 6 to 15 carbon atoms, and two of $L_{21}$, $R_4$ and $R_5$ may be combined to form a ring; $L_{22}$ and $L_{23}$, which may be the same or different, each represents a single bond, a double bond or a divalent aliphatic hydrocarbon group, p referably a single bond, a double bond or a methylene group; and A represents a mononuclear or polynuclear aromatic ring, preferably an aromatic ring having from 6 to 18 carbon atoms.

Specific examples of the compound represented by formula (5), (6) or (7) include:

aromatic tetracarboxylic acid dianhydrides such as pyromellitic acid dianhydride, 3,3',4,4'-benzophenone tetracarboxylic acid dianhydride, 3,3',4,4'-diphenyl tetracarboxylic acid dianhydride, 2,3,6,7-naphthalene tetracarboxylic acid dianhydride, 1,4,5,8-naphthalene tetracarboxylic acid dianhydride, 4,4'-sulfonyl diphthalic acid dianhydride, 2,2-bis(3,4-dicarboxyphenyl) propane dianhydride, bis(3,4-dicarboxyphenyl)ether dianhydride, 4,4'-[3,3'-(alkylphosphoryldiphenylene)- bis(iminocarbonyl)]diphthalic acid dianhydride, an adduct of hydroquinone diacetate and trimellitic acid anhydride, and an adduct of diacetyldiamine and a trimellitic acid anhydride; alicyclic tetracarboxylic acid dianhydride such as 5-(2,5-dioxotetrahydrofuryl)-3-methyl-3-cyclohexene-1,2-dicarboxylic acid anhydride (EPICRON B-4400, produced by Dainippon Ink & Chemicals, Inc.), 1,2,3,4-cyclopentane tetracarboxylic acid dianhydride, 1,2,4,5-cyclohexane tetracarboxylic acid dianhydride and tetrahydrofuran tetracarboxylic acid dianhydride; and aliphatic tetracarboxylic acid dianhydride such as 1,2,3,4-butane tetracarboxylic acid dianhydride and 1,2,4,5-pentane tetracarboxylic acid dianhydride.

For introducing a structural unit derived from a compound obtained by ring-opening the tetracarboxylic acid dianhydride with a diol compound, for example, the following methods may be used:

a) a method of reacting an alcohol-terminated compound obtained by ring-opening a tetracarboxylic acid dianhydride with a diol compound, and a diisocyanate compound; and b) a method of reacting an alcohol-terminated urethane compound obtained by reacting a diisocyanate compound in the condition of an excess diol compound.

Specific examples of the diol compound used here include: ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecane-dimethanol, hydrogenated bisphenol A, hydrogenated bisphenol F, an ethylene oxide adduct of bisphenol A, a propylene oxide adduct of bisphenol A, an ethylene oxide adduct of bisphenol F, a propylene oxide adduct of bisphenol F, an ethylene oxide adduct of hydrogenated bisphenol A, a propylene oxide adduct of hydrogenated bisphenol A, hydroquinonedihydroxyethyl ether, p-xylylene glycol, dihydroxyethylsulfone, bis(2-hydroxyethyl)-2,4-tolylene dicarbamate, 2,4-tolylene-bis(2-hydroxyethylcarbamide), bis (2-hydroxyethyl)-m-xylylene dicarbamate and bis(2-hydroxyethyl) isophthalate.

c) Other Diol Compound

The polyurethane resin for use in the present invention is a polyurethane resin having a structure as a reaction product with at least one of a polyether diol compound, a polyester diol compound and a polycarbonate diol compound.

The polyether diol compound includes the compounds represented by formulae (A), (B), (C), (D) and (E), and a random copolymer of an ethylene oxide having a hydroxyl group at the terminal with a propylene oxide.

(A)

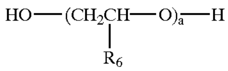

(B)

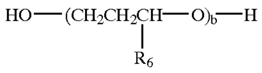

(C)

$$HO—(CH_2CH_2CH_2CH_2—O)_c—H$$

-continued (D)

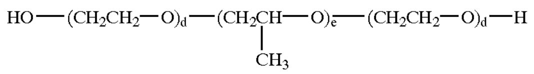

(E)

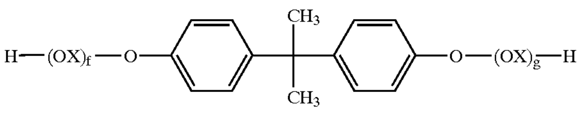

wherein $R_6$ represents a hydrogen atom or a methyl group, X represents:

$—CH_2CH_2—$ 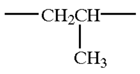

wherein a, b, c, d, e, f and g each represents an integer of 2 or greater, preferably from 2 to 100.

Specific examples of the polyether diol compound represented by formula (A) or (B) include: diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycol having an average molecular weight of 1,000, polyethylene glycol having an average molecular weight of 1,500, polyethylene glycol having an average molecular weight of 2,000, polyethylene glycol having an average molecular weight of 3,000, polyethylene glycol having an average molecular weight of 7,500, polypropylene glycol having an average molecular weight of 400, polypropylene glycol having an average molecular weight of 700, polypropylene glycol having an average molecular weight of 1,000, polypropylene glycol having an average molecular weight of 2,000, polypropylene glycol having an average molecular weight of 3,000 and polypropylene glycol having an average molecular weight of 4,000.

Specific examples of the polyether diol compound represented by formula (C) include:

PTMG650, PTMG1000, PTMG20000 and PTMG3000, all produced by Sanyo Chemical Industries Co., Ltd.

Specific examples of the polyether diol compound represented by formula (D) include:

NEWPOL PE-61, NEWPOL PE-62, NEWPOL PE-64, NEWPOL PE-68, NEWPOL PE-71, NEWPOL PE-74, NEWPOL PE-75, NEWPOL PE-78, NEWPOL PE-108, NEWPOL PE-128 and NEWPOL PE-61, all produced by Sanyo Chemical Industries Co., Ltd.

Specific examples of the polyether diol compound represented by formula (E) include:

NEWPOL BPE-20, NEWPOL BPE-20F, NEWPOL BPE-20NK, NEWPOL BPE-20T, NEWPOL BPE-20G, NEWPOL BPE-40, NEWPOL BPE-60, NEWPOL BPE-100, NEWPOL BPE-180, NEWPOL BP-2P, NEWPOL BPE-23P, NEWPOL BPE-3P and NEWPOL BPE-5P, all produced by Sanyo Chemical Industries Co., Ltd.

Specific examples of the random copolymer of an ethylene oxide having a hydroxyl group at the terminal with a propylene oxide include:

NEWPOL 50HB-100, NEWPOL 50HB-260, NEWPOL 50HB-400, NEWPOL 50HB-660, NEWPOL 50HB- 2000 and NEWPOL 50HB-5100, all produced by Sanyo Chemical Industries Co., Ltd.

The polyester diol compound includes a compound represented by formula (8) or (9):

(8)

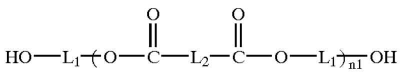

(9)

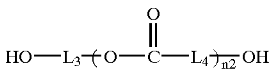

wherein $L_1$, $L_2$ and $L_3$, which may be the same or different, each represents a divalent aliphatic or aromatic hydrocarbon group, $L_4$ represents a divalent aliphatic hydrocarbon group, and $n_1$ and $n_2$ each represents an integer of 2 or greater. $L_1$, $L_2$ and $L_3$ each is preferably an alkylene group, an alkenylene group an alkynylene group or an arylene group. $L_4$ is preferably an alkylene group. $L_1$, $L_2$, $L_3$ and $L_4$ each may have another functional group which does not react with the isocyanate group, such as an ether group, a carbonyl group, an ester group, a cyano group, an olefin group, a urethane group, an amido group, a ureido group or a halogen atom. $n_1$ and $n_2$ each is preferably an integer of from 2 to 100.

The polycarbonate diol compound includes a compound represented by formula (10):

(10)

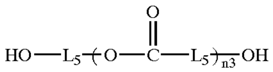

wherein $L_5$ represents a divalent aliphatic or aromatic hydrocarbon group, preferably an alkylene group, an alkenylene group, an alkynylene group or an arylene group, and $L_5$ may have another functional group which does not react with the isocyanate group, such as an ether group, a carbonyl group, an ester group, a cyano group, an olefin group, a urethane group, an amido group, a ureido group or a halogen atom; and $n_3$ represents an integer of 2 or greater, preferably from 2 to 100.

Specific examples of the diol compound represented by formula (8), (9) or (10) are set forth below. In the following compounds, n is an integer of 2 or greater.

(No.1)

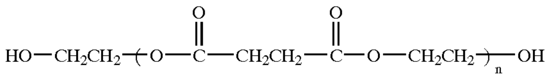

(No.2)

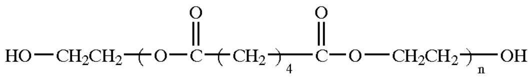

(No.3)

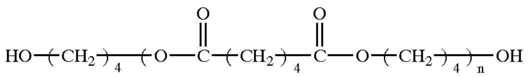

(No.4)

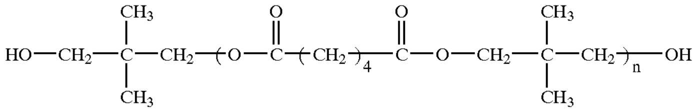

(No.5)

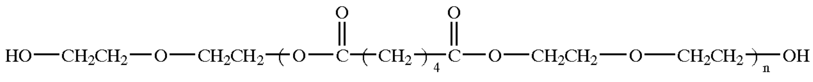

(No.6)

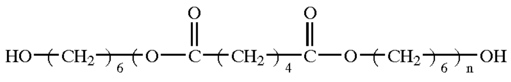

(No.7)

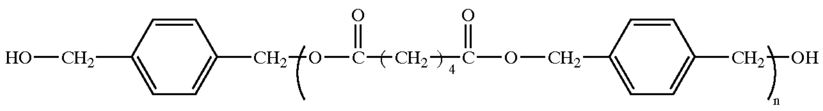

(No.8)

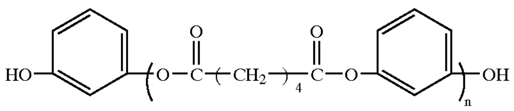

(No.9)

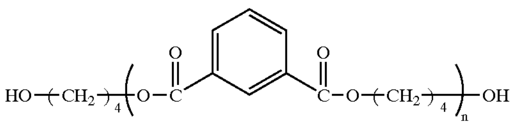

(No.10)

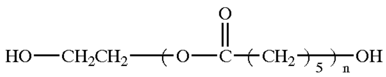

(No.11)

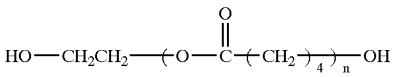

(No.12)

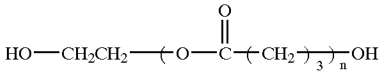

(No.13)

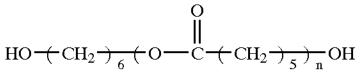

-continued (No.14)

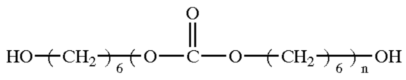

(No.15)

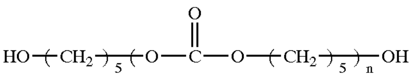

(No.16)

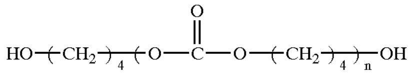

(No.17)

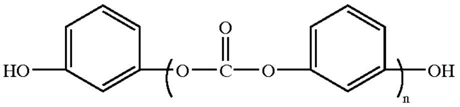

(No.18)

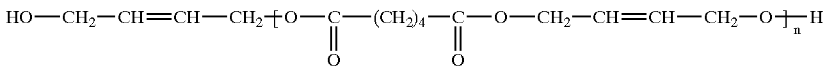

(No.19)

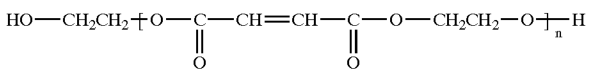

(No.20)

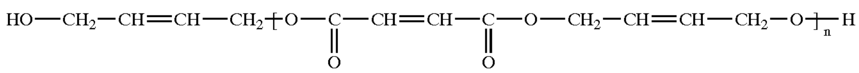

(No.21)

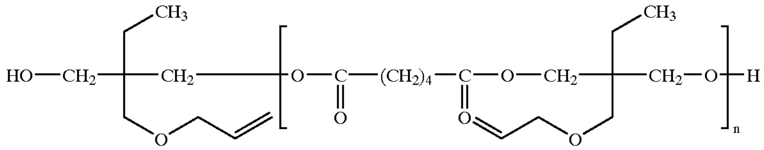

(No.22)

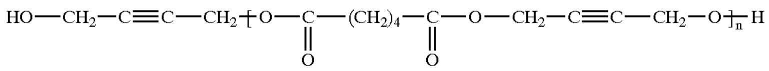

(No.23)

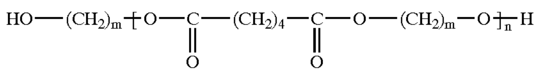

m = 2.4

Furthermore, a diol compound which has no carboxyl group but may have another substituent incapable of reacting with isocyanate, may also be used in combination.

Such a diol compound includes the following compounds:

$$HO—L_6—O—CO—L_7—CO—O—L_6—OH \quad (11)$$

$$HO—L_7—CO—O—L_6—OH \quad (12)$$

wherein $L_6$ and $L_7$, which may be the same or different, each represents a divalent aliphatic hydrocarbon group, aromatic hydrocarbon group or heterocyclic group which may have a substituent (examples of the substituent include an alkyl group, an aralkyl group, an aryl group, an alkoxy group, an aryloxy group and a halogen atom (e.g., —F, —Cl, —Br, —I)), and if desired, $L_6$ and $L_7$ each may have another functional group which does not react with the isocyanate group, such as a carbonyl group, an ester group, a urethane group, an amido group or a ureido group, provided that $L_6$ and $L_7$ may form a ring together.

Specific examples of the compound represented by formula (11) or (12) are set forth below.

(No.101)

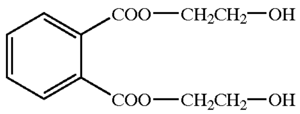

(No.102)

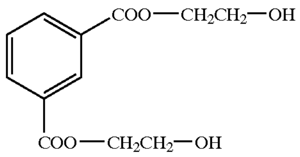

(No.103)

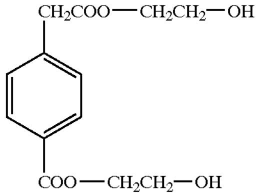

(No.104)

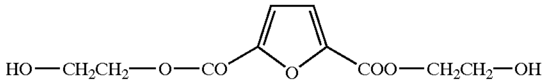

-continued (No.105)

$HO-CH_2CH_2-O-CO-CH{=}CH-COO-CH_2CH_2-OH$ (No.106)

$HO-CH_2CH_2-O-COC_{11}H_{22}COO-CH_2CH_2-OH$ (No.107)

$HO-CH_2CH_2-O-COC_{12}H_{24}COO-CH_2CH_2-OH$ (No.108)

$HO-CH_2CH_2-O-COC_{14}H_{28}COO-CH_2CH_2-OH$ (No.109)

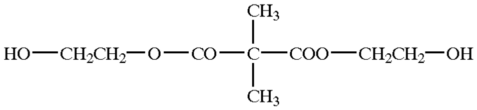

(No.110)

$HO-CH_2CH_2-O-CO-C{\equiv}C-COO-CH_2CH_2-OH$ (No.111)

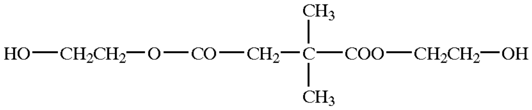

(No.112)

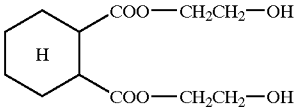

(No.113)

$HO-CH_2CH_2-O-CO-CH_2-O-CH_2-COO-CH_2CH_2-OH$ (No.114)

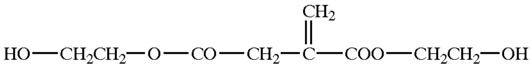

(No.115)

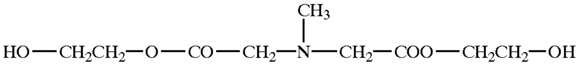

(No.116)

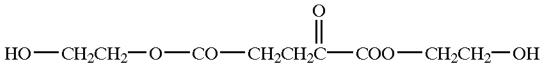

(No.117)

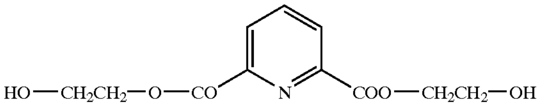

(No.118)

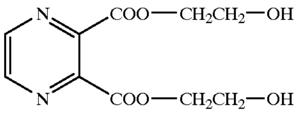

(No.119)

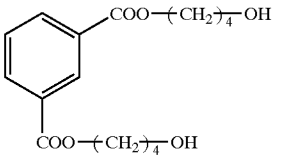

(No.120)

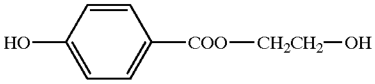

-continued (No.121)

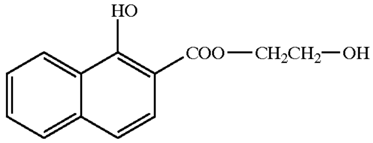

(No.122)

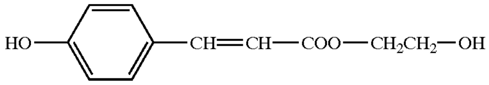

(No.123)

$HO-CH_2CH_2-COO-CH_2CH_2-OH$ (No.124)

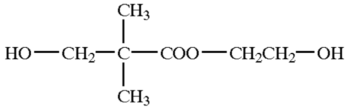

(No.125)

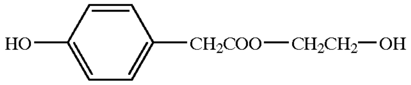

(No.126)

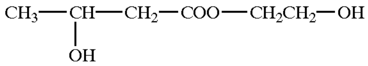

(No.127)

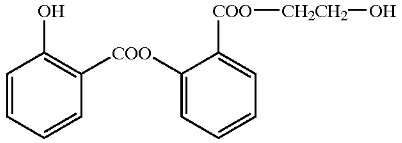

(No.128)

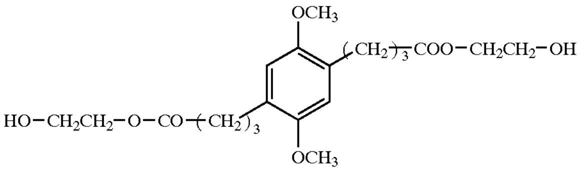

Diol compounds shown below may also be suitably used.

(15)

$HO(CH_2)_cOH$ (16)

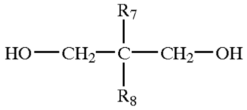

(17)

$HO-CH_2-C{\equiv}C-CH_2-OH$ (18)

$HO-CH_2-CH{=}CH-CH_2-OH$ wherein $R_7$ and $R_8$, which may be the same or different, each represents an alkyl group which may have a substituent, and c has the same meaning as defined above and represents an integer of 2 or greater, preferably from 2 to 100.

Specific examples of the diol compound represented by formula (15), (16), (17) or (18) include the following compounds:

for formula (15), ethylene glycol, 1,3-propane diol, 1,4-butane diol, 1,5-pentane diol, 1,6-hexane diol, 1,7-heptane diol and 1,8-octane diol;

for formula (16), compounds shown below:

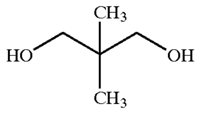
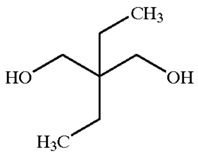
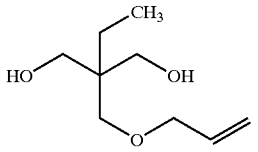
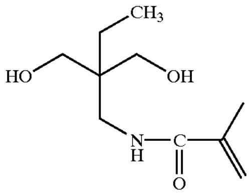
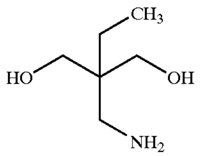
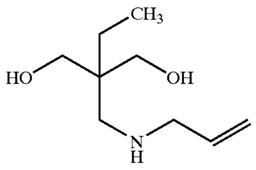
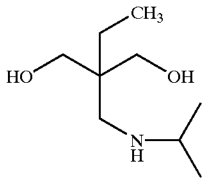

-continued

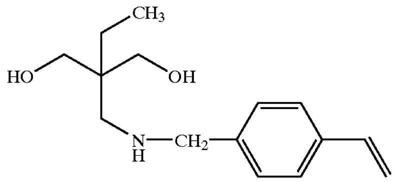

for formula (17), 2-butene-1,4-diol; and for formula (18), cis-2-butene-1,4-diol and trans-2-butene-1,4-diol.

Furthermore, the diol compounds shown below may also be suitably used:

$$HO—L_6—NH—CO—L_7—CO—NH—L_6—OH \quad (19)$$

$$HO—L_7—CO—NH—L_6—OH \quad (20)$$

wherein $L_6$ and $L_7$, which may be the same or different, each represents a divalent aliphatic hydrocarbon group, aromatic hydrocarbon group or heterocyclic group which may have a substituent (examples of the substituent include an alkyl group, an aralkyl group, an aryl group, an alkoxy group, an aryloxy group and a halogen atom (e.g., —F, —Cl, —Br, —I)), and if desired, $L_6$ and $L_7$ each may have another functional group which does not react with the isocyanate group, such as a carbonyl group, an ester group, a urethane group, an amido group or a ureido group, provided that $L_6$ and $L_7$ may form a ring together.

Specific examples of the compound represented by formula (19) or (20) include the following compounds:

(No.201)

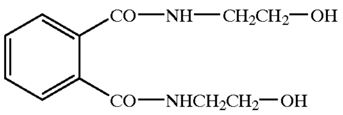

(No.202)

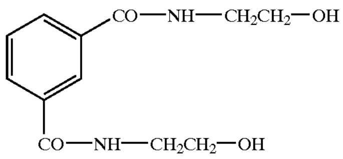

(No.203)

$HO—CH_2CH_2—NH—CO—CH{=}CH—CO—NH—CH_2CH_2—OH$ (No.204)

$HO—CH_2CH_2—NH—CO—C{\equiv}C—CO—NH—CH_2CH_2—OH$ (No.205)

$HO—CH_2CH_2—NH—CO—(CH_2)_2—CO—NH—CH_2CH_2—OH$ (No.206)

$HO—CH_2CH_2—NH—CO—(CH_2)_3—CO—NH—CH_2CH_2—OH$ (No.207)

$HO—CH_2CH_2—NH—CO—(CH_2)_5—CO—NH—CH_2CH_2—OH$ (No.208)

$HO—CH_2CH_2—NH—CO—(CH_2)_8—CO—NH—CH_2CH_2—OH$ (No.209)

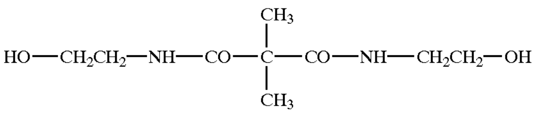

(No.210)

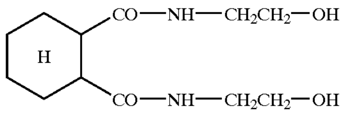

(No.211)

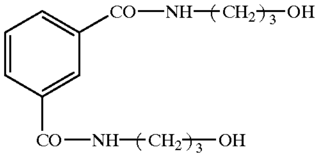

(No.212)

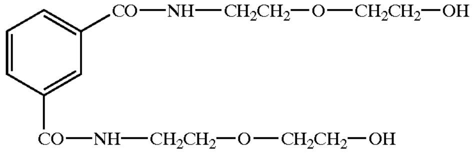

(No.213)

$HO—(CH_2)_3—NH—(CH_2)_3—NH—CO—(CH_2)_2—CO—NH—(CH_2)_3—OH$ (No.214)

$HO—CH_2CH_2—O—CH_2CH_2—NH—CO—(CH_2)_4—CO—NH—CH_2CH_2—O—CH_2CH_2—OH$ (No.215)

$HO—CH_2CH_2—NH—CO—CH_2—O—CH_2—CO—NH—CH_2CH_2—OH$ (No.216)

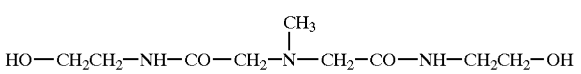

-continued (No.217)

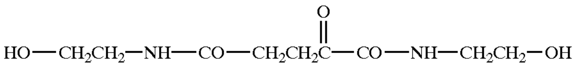

(No.218)

$HO—CH_2CH_2—NH—CO—CH_2—S—CH_2—CO—NH—CH_2CH_2—OH$ (No.219)

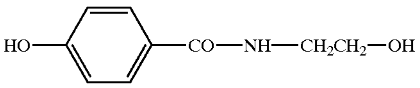

(No.220)

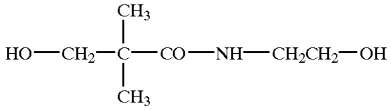

Furthermore, the diol compounds shown below may also be suitable used.

$$HO—Ar_2—(L_{16}—Ar_3)_n—OH \quad (21)$$

$$HO—Ar_2—L_{16}—OH \quad (22)$$

wherein $L_{16}$ represents a divalent aliphatic hydrocarbon group which may have a substituent (preferred examples of the substituent include an alkyl group, an aralkyl group, an aryl group, an alkoxy group, an aryloxy group and a halogeno group), and if desired, $L_{16}$ may have another functional group which does not react with the isocyanate group, such as an ester group, a urethane group, an amido group or a ureido group;

$Ar_2$ and $Ar_3$, which may be the same or different, each represents a divalent aromatic hydrocarbon group which may have a substituent, preferably an aromatic group having from 6 to 15 carbon atoms; and n represents an integer of from 0 to 10.

Specific examples of the diol compound represented by formula (21) or (22) include: catechol, resorcin, hydroquinone, 4-methylcatechol, 4-t-butylcatechol, 4-acetylcatechol, 3-methoxycatechol, 4-phenylcatechol, 4-methylresorcin, 4-ethylresorcin, 4-t-butylresorcin, 4-hexylresorcin, 4-chlororesorcin, 4-benzylresorcin, 4-acetylresorcin, 4-carbomethoxyreorcin, 2-methylresorcin, 5-methylresorcin, t-butylhydroquinone, 2,5-di-t-butylhydroquinone, 2,5-di-t-amylhydroquinone, tetramethylhydroquinone, tetrachlorohydroquinone, methylcarboaminohydroquinone, methylureidohydroquinone, methylthiohydroquinone, benzonorbornene-3,6-diol, bisphenol A, bisphenol S, 3,3'-dichlorobisphenol S, 4,4'-dihydroxy-benzophenone, 4,4'-dihydroxybiphenyl, 4,4'-thiodiphenol, 2,2'-dihydroxydiphenylmethane, 3,4-bis(p-hydroxyphenyl) hexane, 1,4-bis(2-(p-hydroxyphenyl)propyl)benzene, bis(4-hydroxyphenyl)methylamine, 1,3-dihydroxynaphthalene, 1,4-dihydroxynaphthalene, 1,5-dihydroxynaphthalene, 2,6-dihydroxynaphthalene, 1,5-dihydroxyanthraquinone, 2-hydroxybenzyl alcohol, 4-hydroxybenzyl alcohol, 2-hydroxy-3,5-di-t-butylbenzyl alcohol, 4-hydroxy-3,5-di-t-4 butylbenzyl alcohol, 4-hydroxyphenethyl alcohol, 2-hydroxyethyl-4-hydroxybenzoate, 2-hydroxyethyl-4-hydroxyphenylacetate and resorcin mono-2-hydroxyethyl ether.

The diol compounds shown below may also be suitably used.

(23)

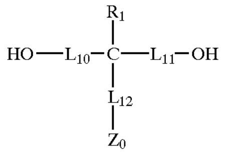

(24)

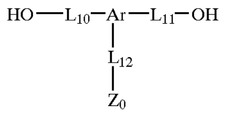

(25)

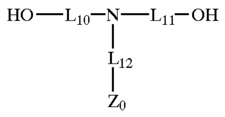

wherein $R_1$ represents a hydrogen atom or an alkyl, aralkyl, aryl, alkoxy or aryloxy group which may have a substituent (examples of the substituent include a cyano group, a nitro group, a halogen atom (e.g., —F, —Cl, —Br, —I), $—CONH_2$, $—COOR_{113}$, $—OR_{113}$, $—NHCONHR_{113}$, $—NHCOOR_{113}$, $—NHCOR_{113}$, $—OCONHR_{113}$ and $—CONHR_{113}$ (wherein $R_{113}$ represents an alkyl group having from 1 to 10 carbon atoms or an aralkyl group having from 7 to 15 carbon atoms)) preferably a hydrogen atom, an alkyl group having from 1 to 8 carbon atoms or an aryl group having from 6 to 15 carbon atoms;

$L_{10}$, $L_{11}$ and $L_{12}$, which may be the same or different, each represents a single bond or a divalent aliphatic or aromatic hydrocarbon group which may have a substituent (preferred examples of the substituent include an alkyl group, an aralkyl group, an aryl group, an alkoxy group and a halogen atom), preferably an alkylene group having from 1 to 20 carbon atoms or an arylene group having from 6 to 15 carbon atoms, more preferably an alkylene group having from 1 to 8 carbon atoms), and if desired, $L_{10}$, $L_{11}$ and $L_{12}$ each may have another functional group which does not react with the isocyanate group, such as a carbonyl group, an ester group, a urethane group, an amido group, an ureido group or an ether group, provided that two or three of $R_1$, $L_{10}$, $L_{11}$ and $L_{12}$ may form a ring together;

Ar represents a trivalent aromatic hydrocarbon group which may have a substituent, preferably an aromatic group having from 6 to 15 carbon atoms; and $Z_0$ represents

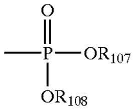

or

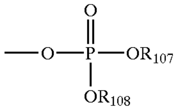

wherein $R_{107}$ and $R_{108}$, which may be the same or different, each represents a hydrogen atom, sodium, potassium, an alkyl group or an aryl group, preferably a hydrogen atom, an alkyl group having from 1 to 8 carbon atoms or an aryl group having from 6 to 15 carbon atoms.

The diol compound containing a phosphonic acid, a phosphoric acid and/or an ester group thereof, represented by formula (23), (24) or (25) is synthesized, for example, by the method described below.

The synthesis is performed by protecting, if desired, the hydroxyl group of a halogen compound represented by the following formula (26), (27) or (28), then phosphonate esterifying the compound according to the Michaelis-Arbuzov reaction shown by formula (29), and further if desired, hydrolyzing it with hydrogen bromide or the like:

(26)

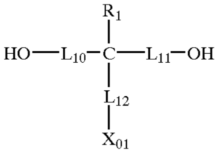

(27)

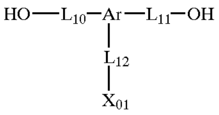

(28)

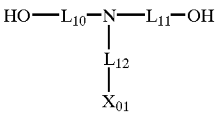

(29)

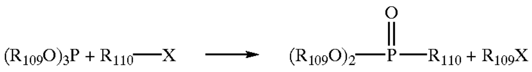

wherein $R_1$, $L_{10}$, $L_{11}$, $L_{12}$ and Ar are the same as defined in formulae (23), (24) and (25); $R_{109}$ represents an alkyl group or an aryl group, preferably an alkyl group having from 1 to 8 carbon atoms or an aryl group having from 6 to 15 carbon atoms; $R_{110}$ is a residue excluding $X_{01}$ in formula (26), (27) or (28); and $X_{01}$ represents a halogen atom, preferably Cl, Br or I.

Also, the synthesis may be performed by a method of reacting the compound with a phosphorus oxychloride represented by the following (30) and then hydrolyzing it:

(30)

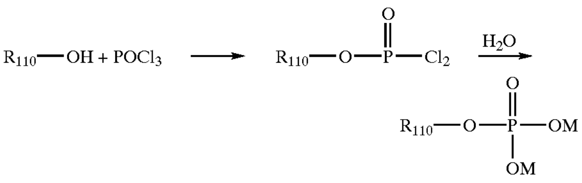

wherein $R_{110}$ is the same as defined in formula (29), and M represents a hydrogen atom, sodium or potassium.

In the case where the polyurethane resin of the present invention has a phosphonic acid group, it may be synthesized by reacting a diisocyanate compound represented by formula (1) with a diol compound having a phosphonic acid ester group, represented by formula (23), (24) or (25) to form a polyurethane resin and then hydrolyzing the resin with hydrogen bromide or the like.

Similarly to the diol compound, an amino group-containing compound shown below may also be reacted with the diisocyanate compound represented by formula (1) to form a urea structure and thereby incorporate the structure into the structure of the polyurethane resin:

(31)

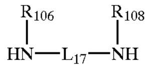

(32)

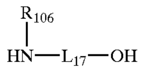

wherein $R_{106}$ and $R_{108}$, which may be the same or different, each represents a hydrogen atom or an alkyl, aralkyl or aryl group which may have a substituent (examples of the substituent include an alkoxy group, a halogen atom (e.g., —F, —Cl, —Br, —I), an ester group and a carboxyl group), preferably a hydrogen atom, an alkyl group having from 1 to 8 carbon atoms which may have a carboxyl group as a substituent, or an aryl group having from 6 to 15 carbon atoms; and $L_{17}$ represents a divalent aliphatic hydrocarbon group, aromatic hydrocarbon group or heterocyclic group which may have a substituent (examples of the substituent include an alkyl group, an aralkyl group, an aryl group, an alkoxy group, an aryloxy group, a halogen atom (e.g., —F, —Cl, —Br, —I) and a carboxyl group), and if desired, $L_{17}$ may have another functional group which does not react with the isocyanate group, such as a carbonyl group, an ester group, a urethane group or an amido group, provided that two of $R_{106}$, $R_{17}$ and $R_{108}$ may form a ring together.

Specific examples of the compound represented by formula (31) or (32) include:

aliphatic diamine compounds such as ethylenediamine, propylenediamine, tetramethylenediamine, pentamethylenediamine, hexamethylenediamine, heptamethylenediamine, octamethylenediamine, dodecamethylenediamine, propane-1,2-diamine, bis(3-aminopropyl)methylamine, 1,3-bis(3-aminopropyl) tetramethylsiloxane, piperazine, 2,5-dimethylpiperazine, N-(2-aminoethyl)piperazine, 4-amino-2,2,6,6-tetramethylpiperidine, N,N-dimethylethylenediamine, lysine, L-cystine and isophoronediamine; aromatic diamine compounds such as o-phenylenediamine, m-phenylenediamine, p-phenylenediamine, 2,4-tolylenediamine, benzidine, o-ditoluidine, o-dianisidine, 4-nitro-m-phenylenediamine, 2,5-dimethoxy-p-phenylenediamine, bis-(4-aminophenyl)sulfone, 4-carboxy-o-phenylenediamine, 3-carboxy-m-phenylenediamine, 4,4'-diaminophenyl ether and 1,8-naphthalenediamine; heterocyclic amine compounds such as 2-aminoimidazole, 3-aminotriazole, 5-amino-1H-tetrazole, 4-aminopyrazole, 2-amino-benzimidazole, 2-amino-5-carboxytriazole, 2,4-diamino-6-methyl-S-triazine, 2,6-diaminopyridine, L-histidine, DL-tryptophan and adenine; and alcohol and aminophenol compounds such as ethanolamine, N-methylethanolamine, N-ethylethanolamine, 1-amino-2-propanol, 1-amino-3-propanol, 2-aminoethoxyethanol, 2-aminothioethoxyethanol, 2-amino-2-methyl-1-propanol, p-aminophenol, m-aminophenol, o-aminophenol, 4-methyl-2-aminophenol, 2-chloro-4-aminophenol, 4-methoxy-3-aminophenol, 4-hydroxybenzylamine, 4-amino-1-naphthol, 4-aminosalicylic acid, 4-hydroxy-N-phenylglycine, 2-aminobenzyl alcohol, 4-aminophenethyl alcohol, 2-carboxy-5-amino-1-naphthol and L-tyrosine.

The polyurethane resin of the present invention is synthesized by reacting the above-described isocyanate compound and diol compound under heating in an aprotic solvent in the presence of known catalysts having an activity according to the reactivity of respective compounds. The molar ratio of the diisocyanate compound and the diol compound used is preferably from 0.8:1 to 1.2:1. If the isocyanate group remains at the polymer terminal, the reaction product may be treated with an alcohol or an amine, so that a polyurethane resin having no remaining isocyanate group can be finally synthesized.

The polyurethane resin of the present invention must contain a carboxyl group in an amount of 0.4 meq/g or more, preferably from 0.4 to 3.5 meq/g.

The polyurethane resin of the present invention preferably has a weight average molecular weight of 1,000 or more, more preferably from 5,000 to 500,000.

These polymer compounds may be used either individually or in combination. The amount of the polymer contained in the photosensitive composition is from about 5 to 95 wt %, preferably from about 10 to 90 wt %.

i) More preferred specific examples of the polyurethane resin include the following compounds, but the present invention is by no means limited thereto. Most of the following specific compounds are shown by a combination of a diisocyanate compound and a diol compound used. A carboxyl group content is also shown as an acid value.

| Poly(urethane-urea) Resin | Diisocyanate Compound Used (mol %) | Diol Compound and Diamine, Amino-alcohol or Urea Compound Used (mol %) | Acid Value (meq/g) |
|---|---|---|---|
| (1) | 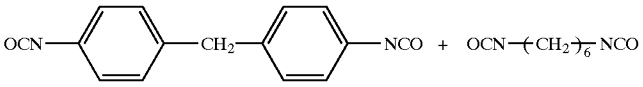 (50) (50) | 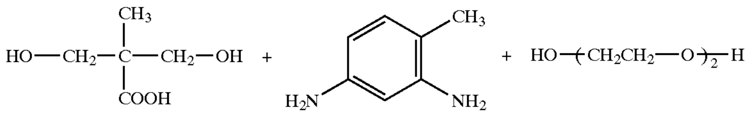 (45) (30) (25) | 1.33 |
| (2) | $OCN-(CH_2)_6-NCO$ (100) | 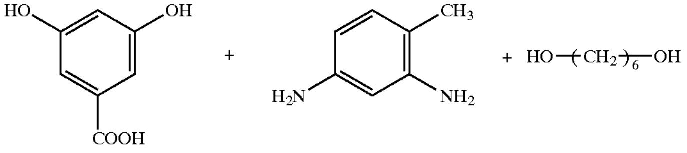 (40) (30) (30) | 1.28 |
| (3) | $OCN-(CH_2)_6-NCO$ (100) | 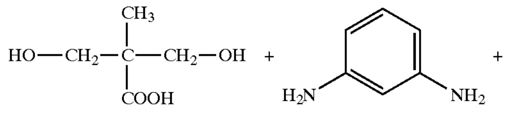 (40) (30) $HO-CH_2CH_2-SO_2-CH_2CH_2-OH$ (30) | 1.25 |
| (4) | 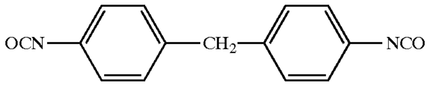 (100) | 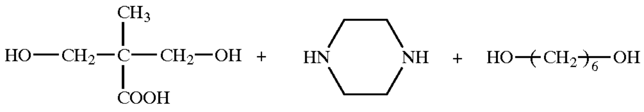 (50) (10) (40) | 1.30 |
| (5) | 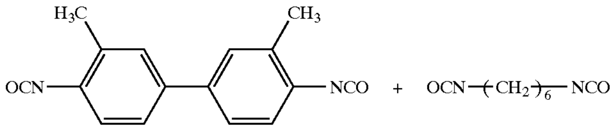 (50) (50) | 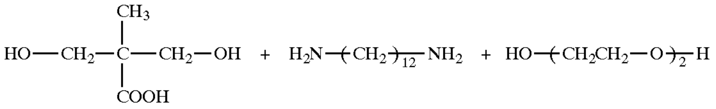 (50) (10) (40) | 1.37 |

-continued
| | | | |
|---|---|---|---|
| (6) | 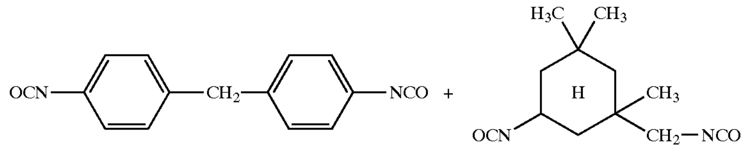 (50) (50) | 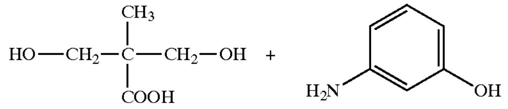 (50) (50) | 1.34 |
| (7) | 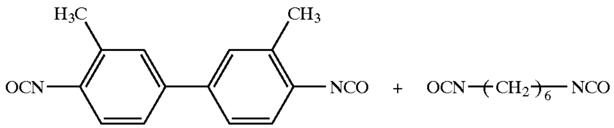 (40) (60) | 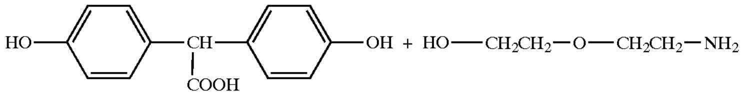 (50) (50) | 1.26 |
| (8) | 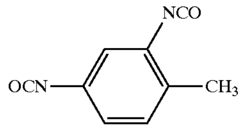 (100) | 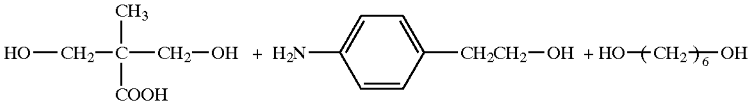 (40) (40) (20) | 1.25 |
| (9) | 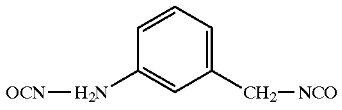 (100) | 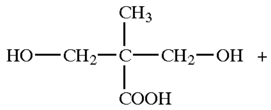 (60) 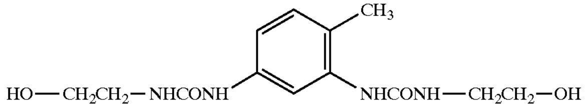 (40) | 1.50 |
| (10) | 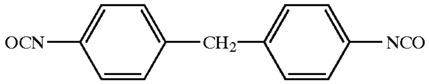 (100) | 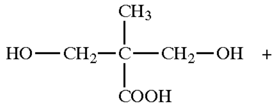 (60) 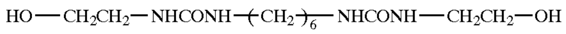 (40) | 1.30 |

-continued
| Poly(urethane-ester) Resin | Diisocyanate Compound Used (mol %) | Diol Compound Used (mol %) | Acid Value (meq/g) |
|---|---|---|---|
| (11) | 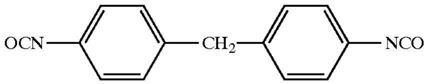 (60) + $OCN-(CH_2)_6-NCO$ (40) | 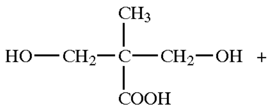 (60) 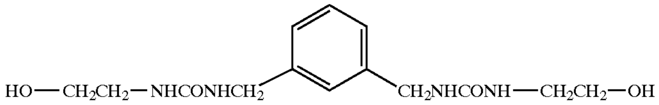 (40) | 1.38 |
| (12) | 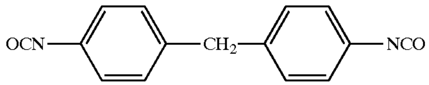 (50) + $OCN-(CH_2)_6-NCO$ (50) | 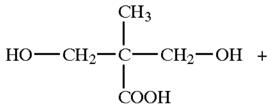 (50) 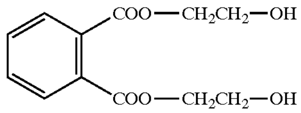 (50) | 1.21 |
| (13) | $OCN-(CH_2)_6-NCO$ (100) | 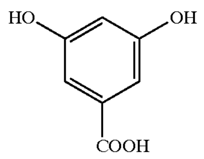 (40) + 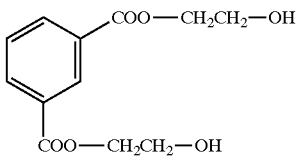 (60) | 1.03 |
| (14) | 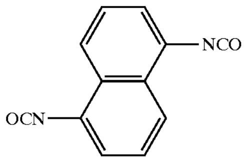 (100) | 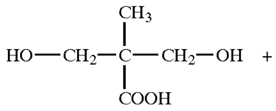 (50) $HO-CH_2CH_2-O-CO-CH=CH-COO-CH_2CH_2-OH$ (50) | 1.28 |

-continued
| | | | |
|---|---|---|---|
| (15) | 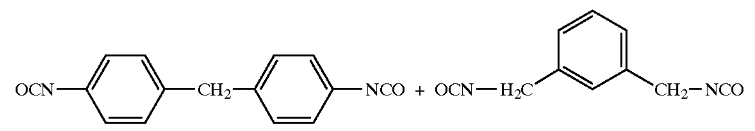 (60) (40) | 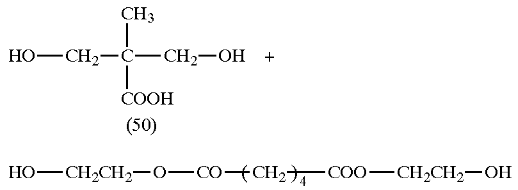 (50) (50) | 1.20 |
| (16) | 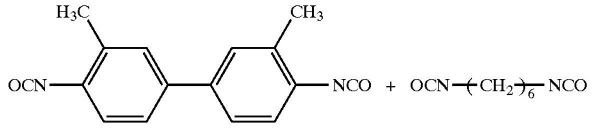 (70) (30) | 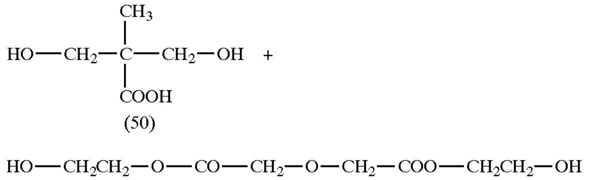 (50) (50) | 1.19 |
| (17) | 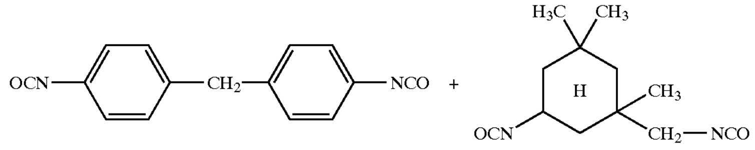 (70) (30) | 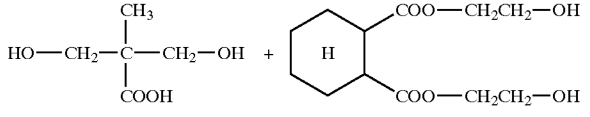 (50) (50) | 1.11 |
| (18) | 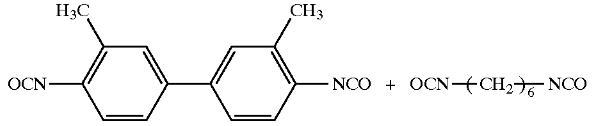 (40) (30) | 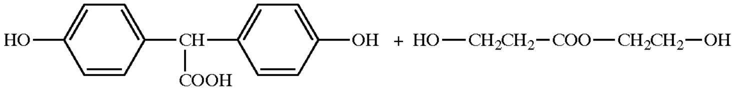 (50) (50) | 1.24 |
| (19) | 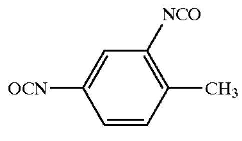 (100) | 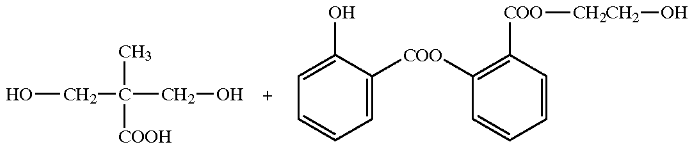 (50) (50) | 1.25 |

-continued
| Poly(urethane-amide) Resin | Diisocyanate Compound Used (mol %) | Diol Compound Used (mol %) | Acid Value (meq/g) |
|---|---|---|---|
| (20) | 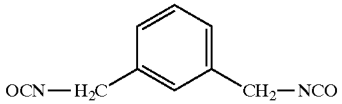<br>(100) | 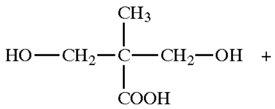 +<br>(55)<br>$HO-CH_2CH_2-O-CO-(CH_2)_3-COO-CH_2CH_2-OH$<br>(45) | 1.38 |
| (21) | 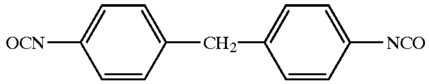 + $OCN-(CH_2)_6-NCO$<br>(50) (50) | 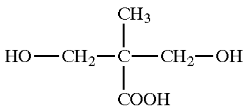 + 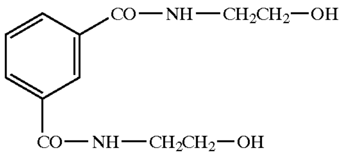<br>(50) (50) | 1.22 |
| (22) | $OCN-(CH_2)_6-NCO$<br>(100) | 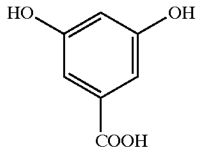 +<br>(40)<br>$HO-CH_2CH_2-NH-CO-CH{=}CH-CO-NH-CH_2CH_2-OH$<br>(60) | 1.12 |
| (23) | 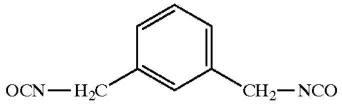<br>(100) | 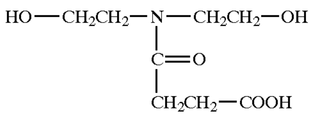 +<br>(50)<br>$HO-CH_2CH_2-NH-CO-(CH_2)_2-CO-NH-CH_2CH_2-OH$<br>(50) | 1.25 |

-continued
| | | | |
|---|---|---|---|
| (24) | 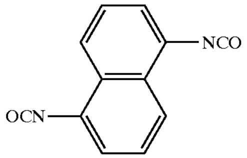<br>(100) | 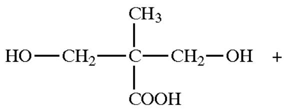<br>(50)<br>$HO-CH_2CH_2-NH-CO-(CH_2)_3-CO-NH-CH_2CH_2-OH$<br>(50) | 1.23 |
| (25) | 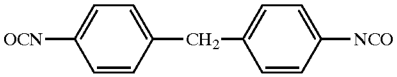 + 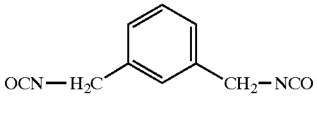<br>(60) (40) | 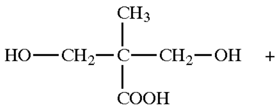<br>(50)<br>$HO-CH_2CH_2-NH-CO-(CH_2)_2-CO-NH-CH_2CH_2-OH$<br>(50) | 1.12 |
| (26) | 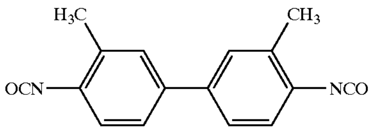 + $OCN-(CH_2)_6-NCO$<br>(60) (40) | 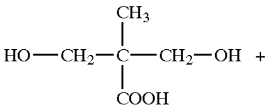 + 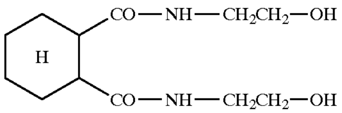<br>(55) (45) | 1.31 |
| (27) | 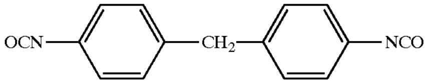 + 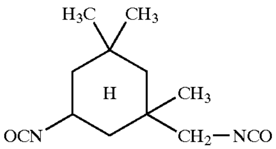<br>(50) (50) | 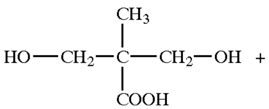 + 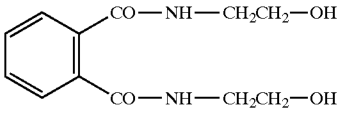<br>(55) (45) | 1.27 |
| (28) | 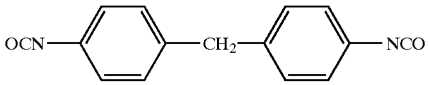<br>(100) | 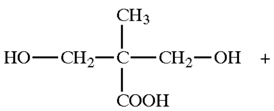<br>(60)<br>$H-(O-CH_2CH_2)_2-NH-CO-(CH_2)_2-CO-NH-(CH_2CH_2-O)_2-H$<br>(40) | 1.27 |

-continued
| Polyurethane Resin | Diisocyanate Compound Used (mol %) | Diol Compound Used (mol %) | Acid Value (meq/g) |
|---|---|---|---|
| (29) | 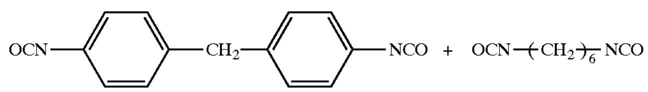 (50) (50) | 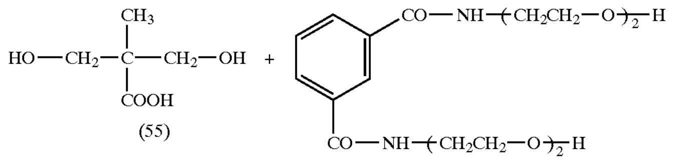 (55) (45) | 1.24 |
| (30) | 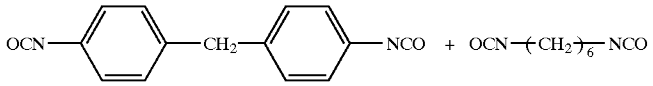 (70) (30) | 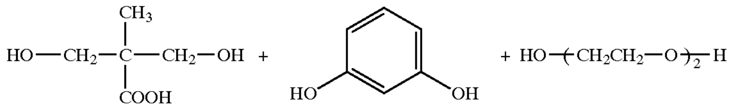 (45) (40) (15) | 1.27 |
| (31) | 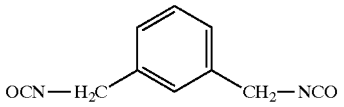 (100) | 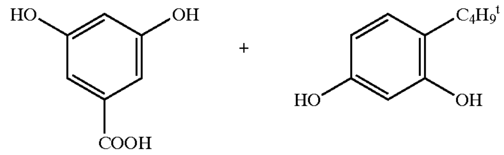 (40) (60) | 1.13 |
| (32) | 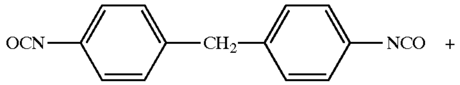 (50) 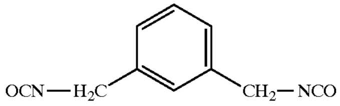 (50) | 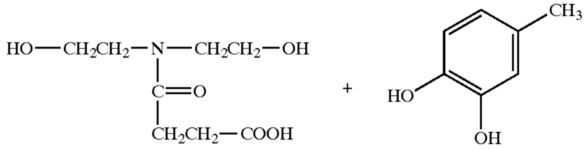 (50) (50) | 1.26 |
| (33) | 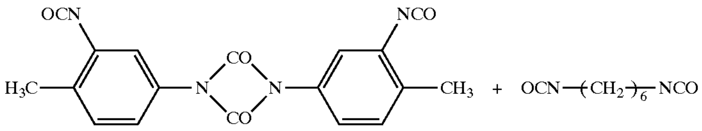 (50) (50) | 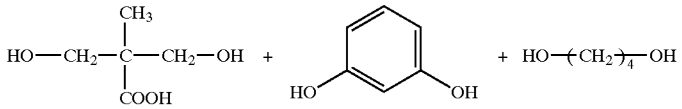 (50) (30) (20) | 1.25 |

-continued
| | | | |
|---|---|---|---|
| (34) | 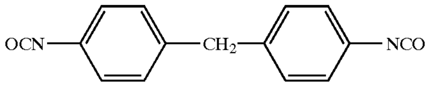 (100) | 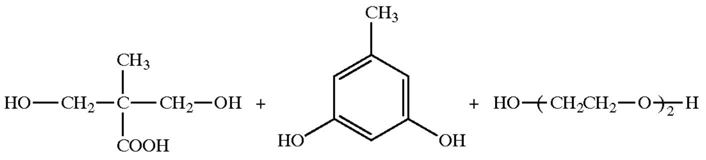 (50) (20) (30) | 1.29 |
| (35) | 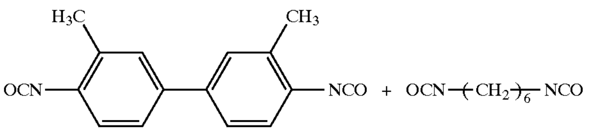 (70) (30) | 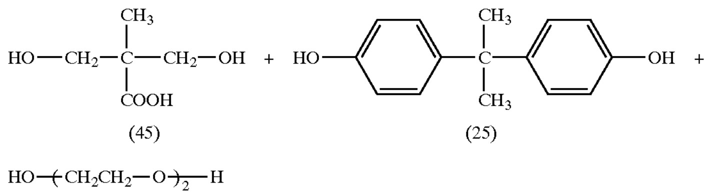 (45) (25) (30) | 1.15 |
| (36) | 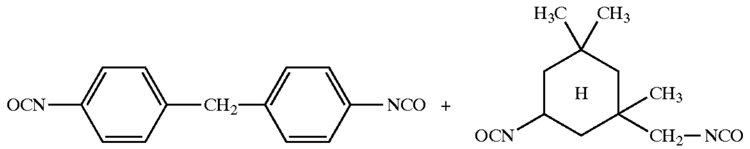 (60) (40) | 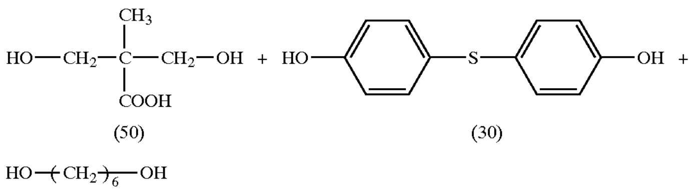 (50) (30) (20) | 1.23 |
| (37) | 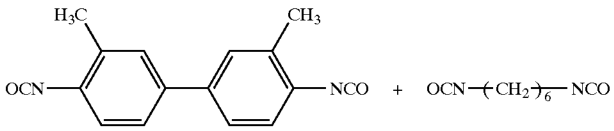 (40) (60) | 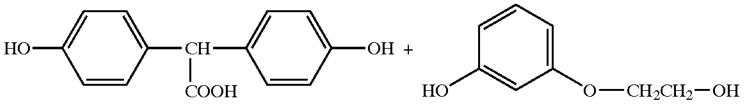 (50) (50) | 1.21 |
| (38) | 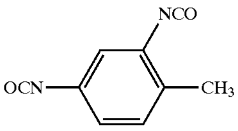 (100) | 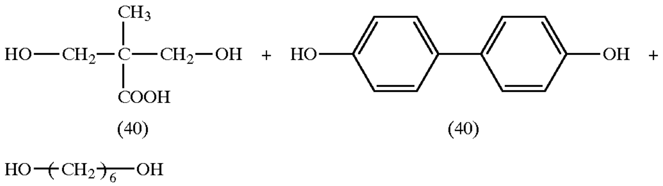 (40) (40) (20) | 1.20 |

-continued
| | | | |
|---|---|---|---|
| (39) | 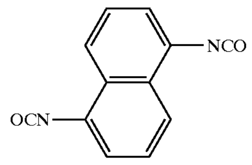 (100) | 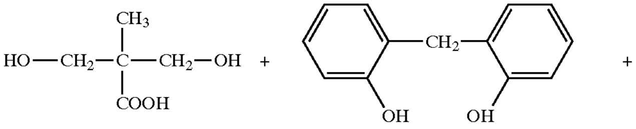 (40) (40) $HO\text{-}(CH_2CH_2\text{-}O)_2\text{-}H$ (20) | 1.08 |
| (40) | 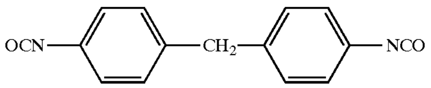 (100) | 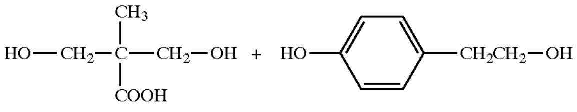 (50) (50) | 1.26 |
| (41) | 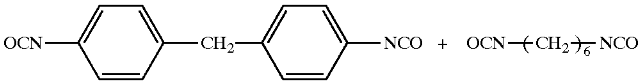 (50) (50) | 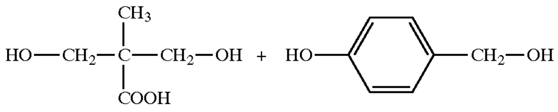 (40) (60) | 1.16 |
| Polyurethane Resin | Structure (mol %) | Acid Value (meq/g) |
|---|---|---|
| (42) | 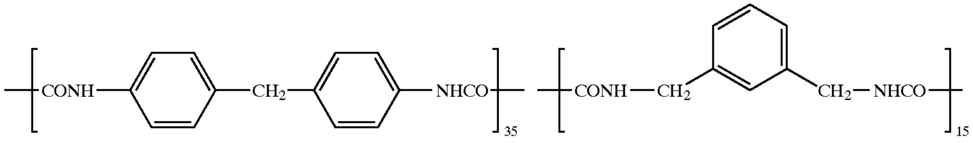 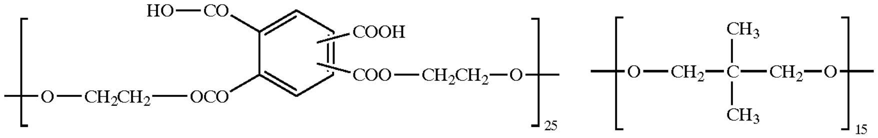 | 2.18 |

-continued
| | | |
|---|---|---|
| (43) | 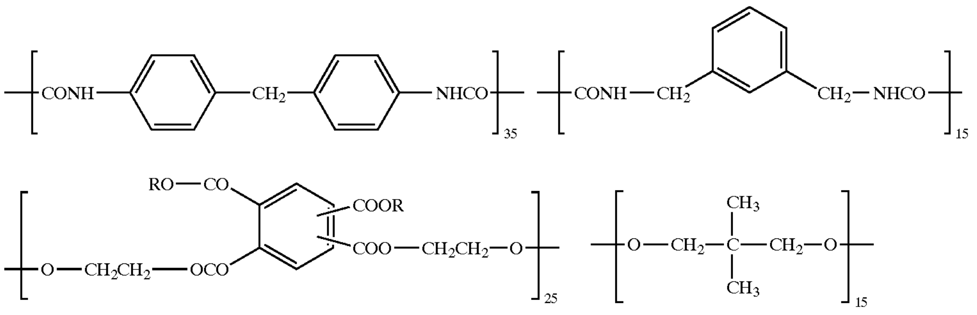 | 1.21 |
| (44) | 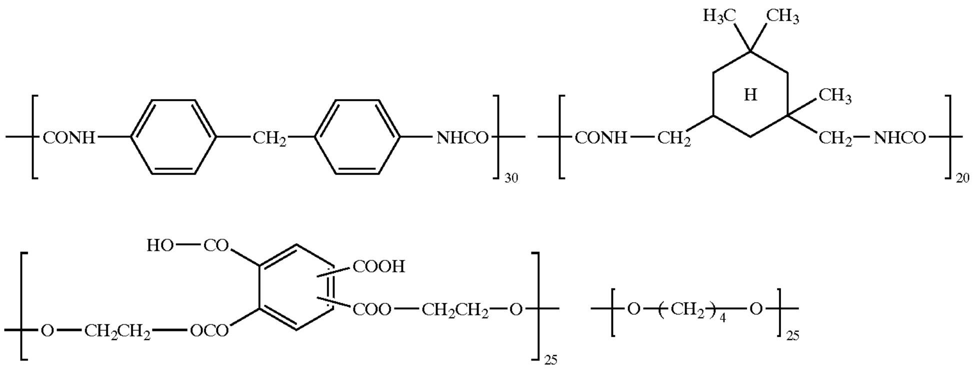 | 2.16 |
| (45) | 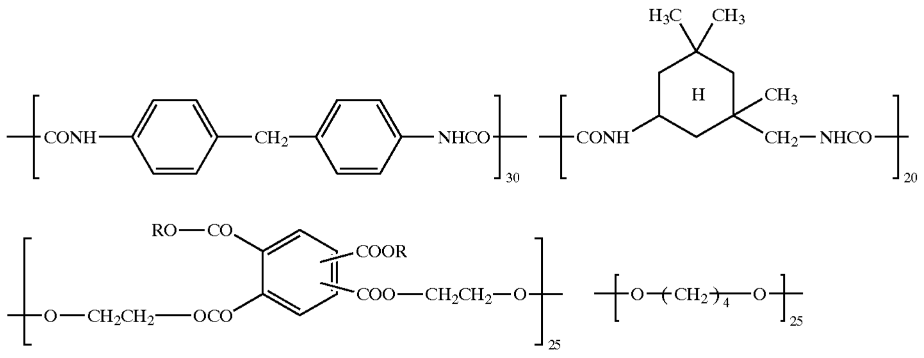 | 1.18 |

-continued
(46)
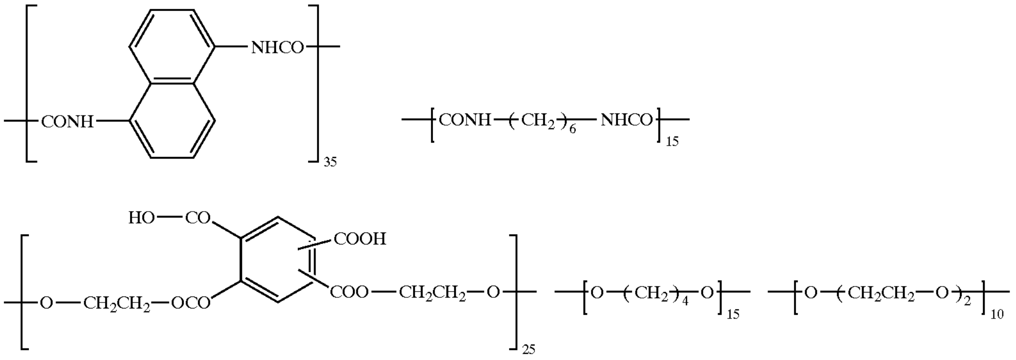
2.32
(47)
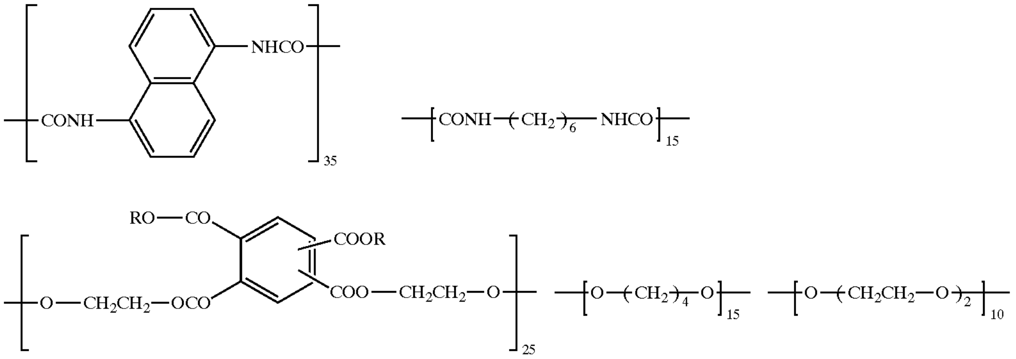
1.20

-continued
(48) 1.12
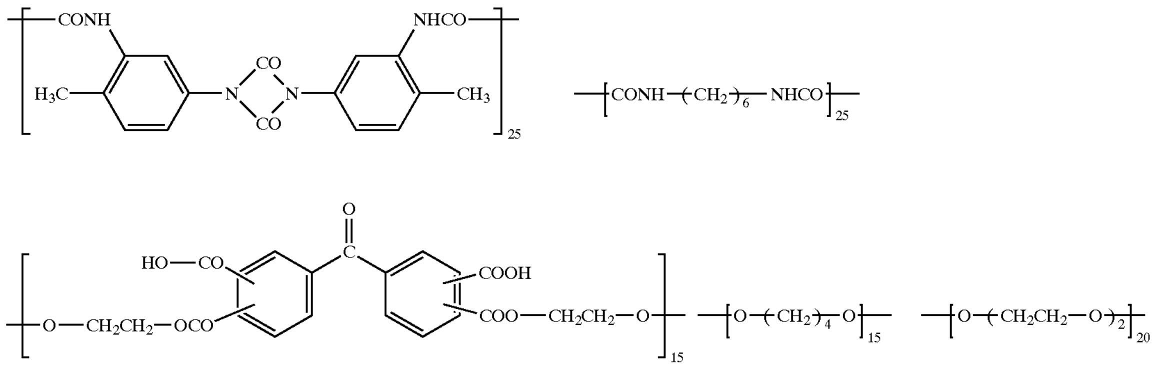
(49) 1.19
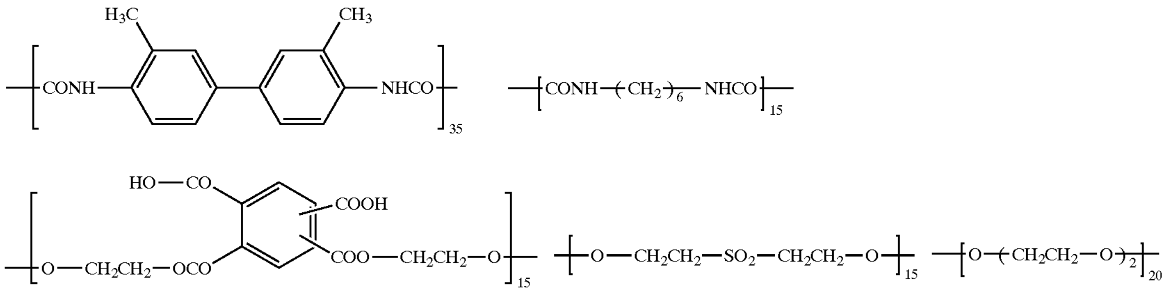
(50) 2.27
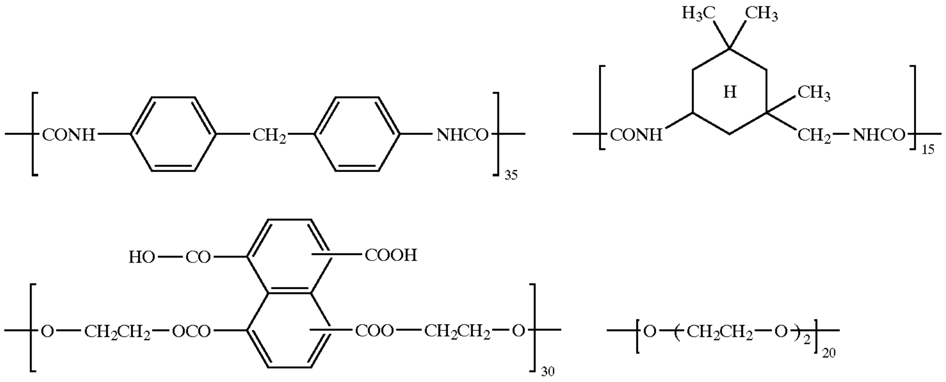

-continued
| | | |
|---|---|---|
| (51) | 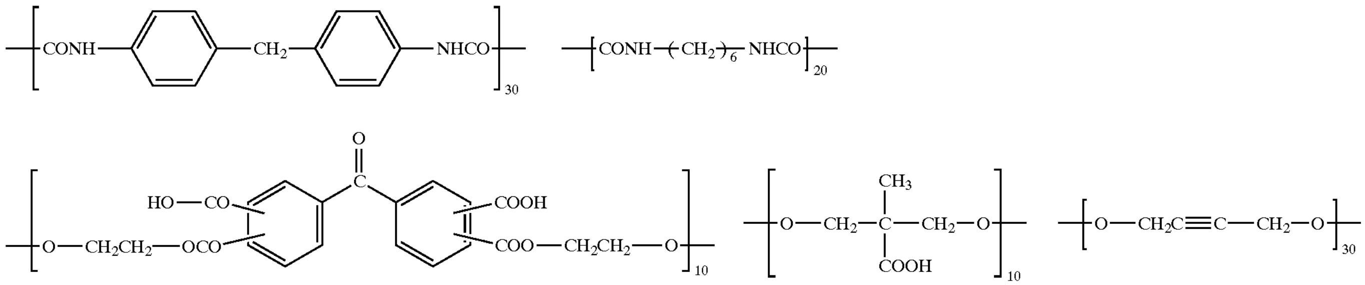 | 2.16 |
| (52) | 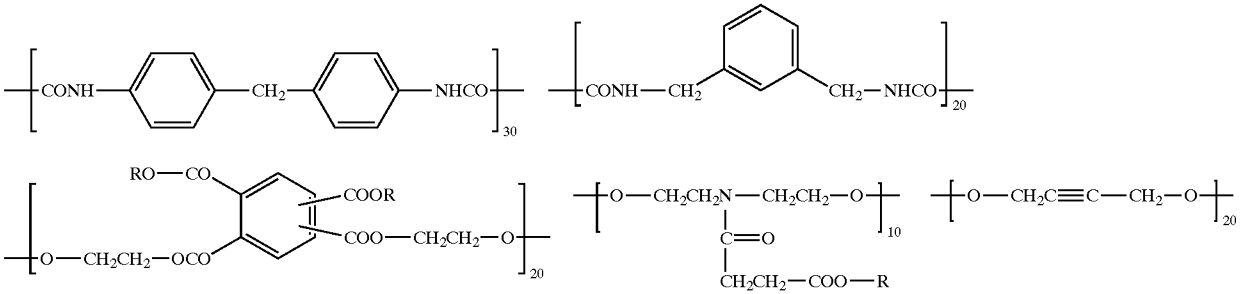 | 1.25 |
| (53) | 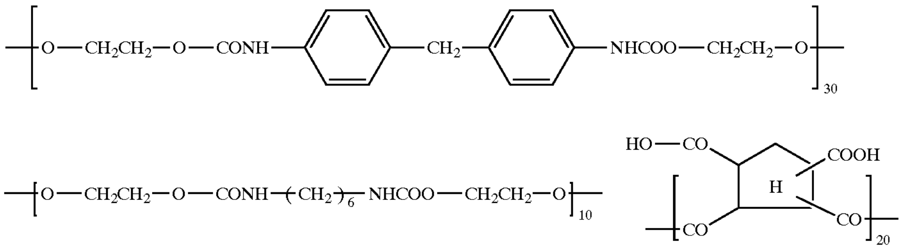 | 1.30 |
R = H -continued
| Polyurethane Resin | Diisocyanate Compound Used (mol %) | Diol Compound Containing Phosphonic Acid, Phosphoric Acid or Ester Group Thereof Used (mol %) | Diol Compound Used (mol %) | Acid Value (meq/g) |
|---|---|---|---|---|
| (54) | 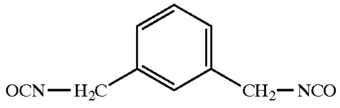 (100) | 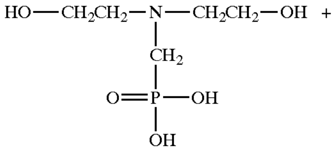 + 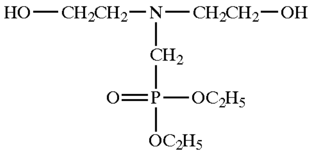 (30) | 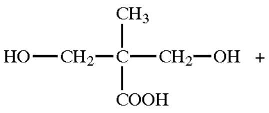 (30) + $HO-(CH_2)_6-OH$ (40) | 1.45 |
| (55) | 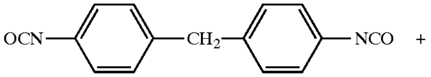 (60) + 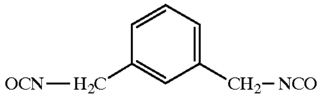 (40) | 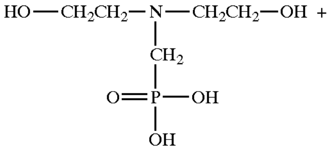 + 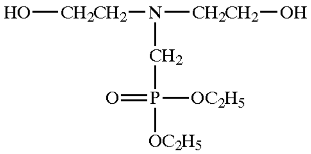 (20) | 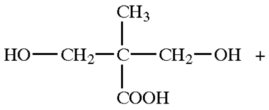 (35) + $HO-CH_2CH_2-SO_2-CH_2CH_2-OH$ (45) | 1.24 |

-continued
| | | | | |
|---|---|---|---|---|
| (56) | 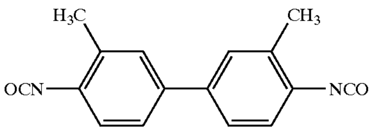 (100) | 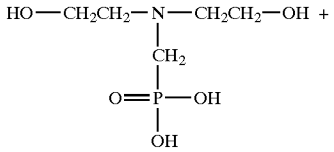 + 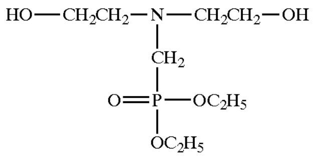 (25) | 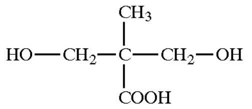 (30) + $HO-(CH_2)_4-OH$ (20) + $HO-(CH_2CH_2-O)_2-H$ (25) | 1.16 |
| (57) | 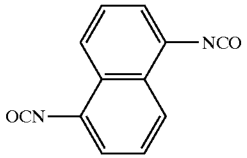 (100) | 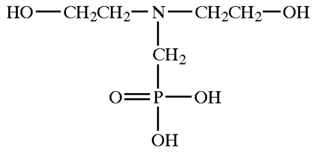 (10) | 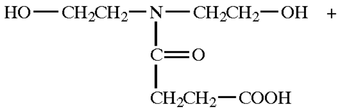 (35) + $HO-(CH_2)_4-OH$ (20) + $HO-(CH_2CH_2-O)_2-H$ (35) | 1.19 |
| (58) | 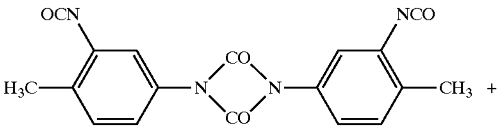 (50) + $OCN-(CH_2)_6-NCO$ (50) | 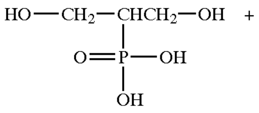 + 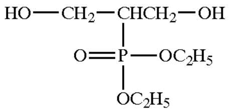 (30) | 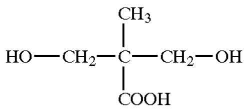 (25) + $HO-(CH_2)_5-OH$ (20) + $HO-(CH_2CH_2)_2-OH$ (25) | 1.20 |

-continued
(59)
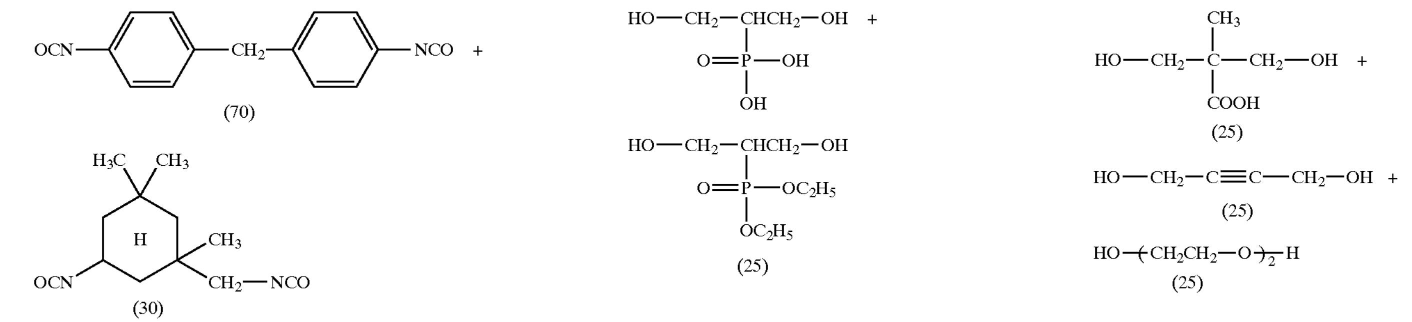
1.15
(60)
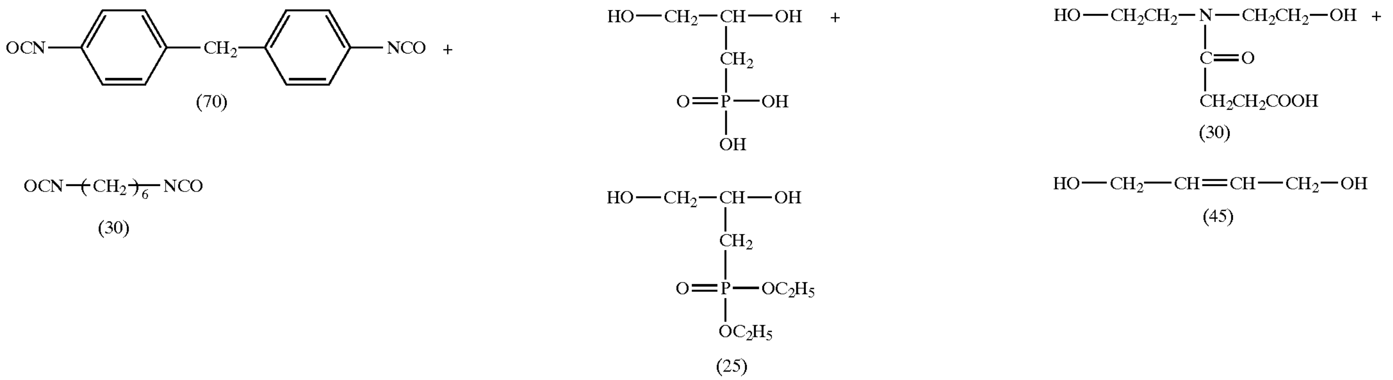
1.28
(61)
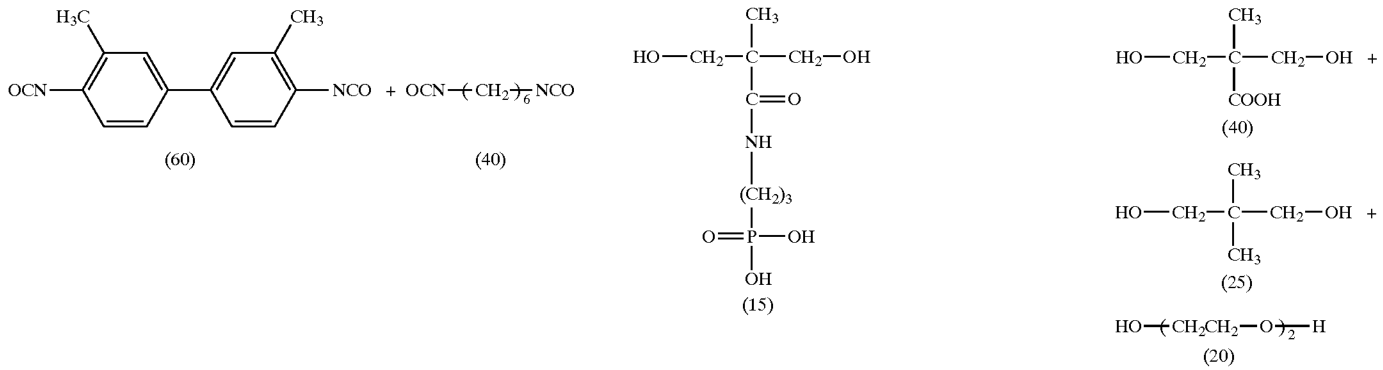
1.44

-continued
(62) 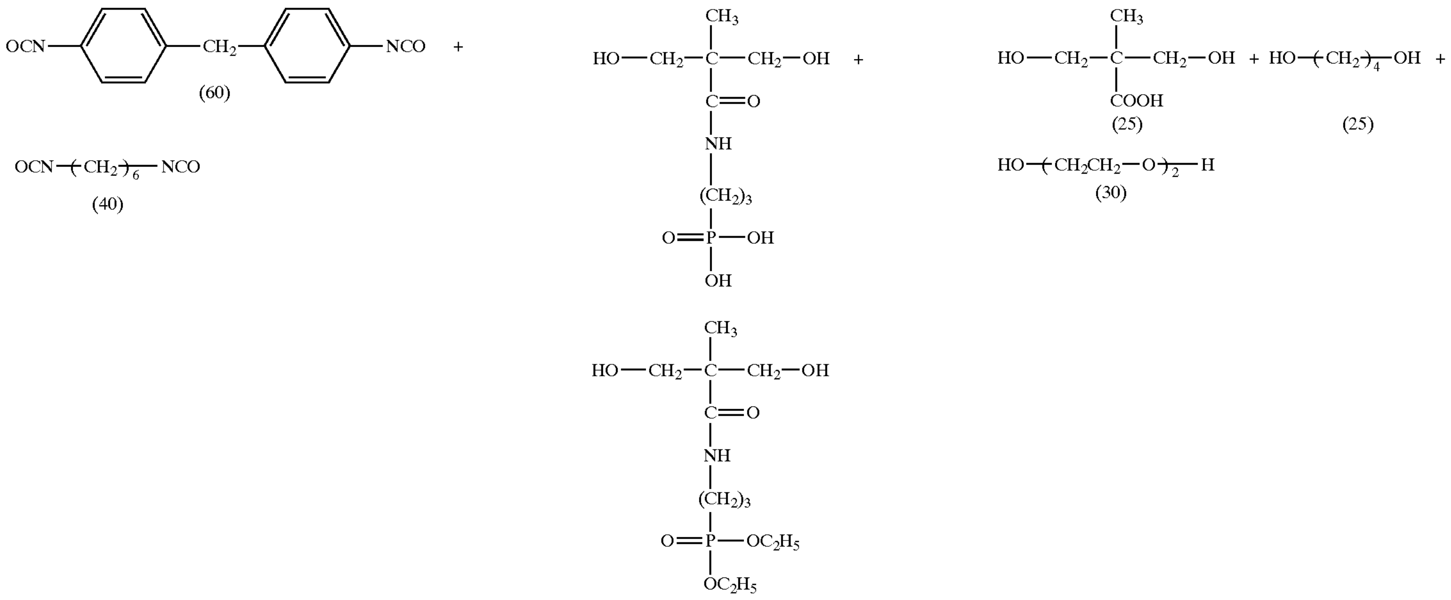
(60) (40) (20) (25) (25) (30)
1.22
(63) 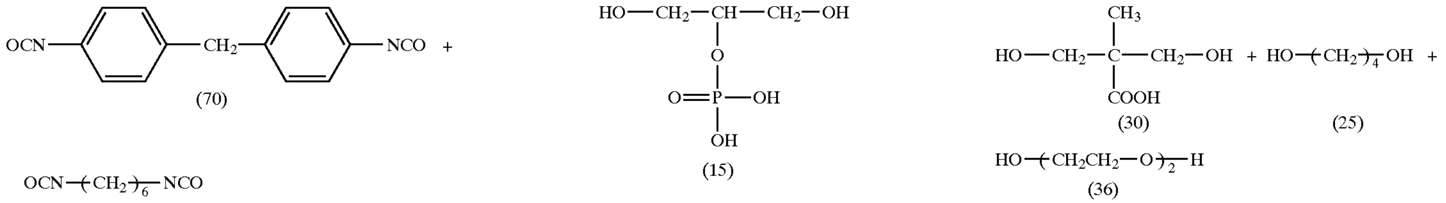
(70) (30) (15) (30) (25) (36)
1.21

-continued
| | | | | |
|---|---|---|---|---|
| (64) | 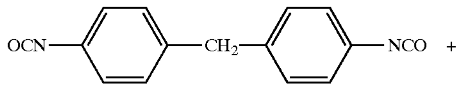 (70) 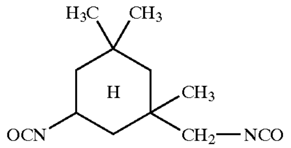 (30) | 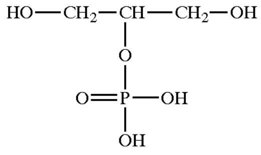 (20) | 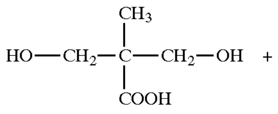 (35) $HO—CH_2—CH{=}CH—CH_2—OH$ (45) | 1.50 |
| (65) | 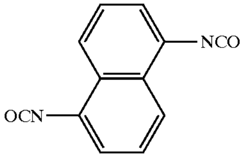 + $OCN—(CH_2)_6—NCO$ (60) (40) | 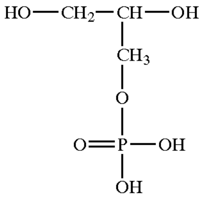 (15) | 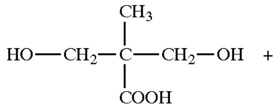 (40) $HO—CH_2CH_2—SO_2—CH_2CH_2—OH$ (45) | 1.53 |
| (66) | 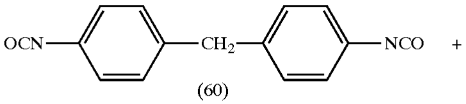 (60) $OCN—(CH_2)_6—NCO$ (40) | 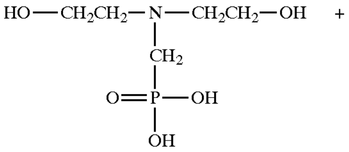 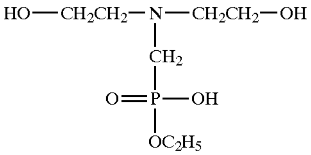 (30) | $HO—(CH_2)_4—OH$ + $HO—(CH_2CH_2—O)_2—H$ (25) (35) | 0.85 |

-continued
| Polyurethane Resin | Diisocyanate Compound Used (mol %) | Diisocyanate Compound Used (mol %) | Residual Carboxyl Group Content |
|---|---|---|---|
| (67) | $OCN-(CH_2)_6-NCO$ (100) | 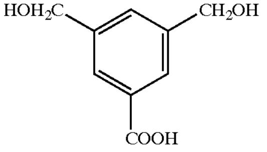 + (50) 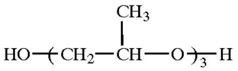 + 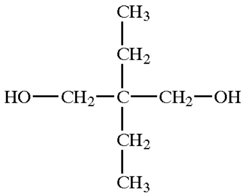 (25) (25) | 1.39 |
| (68) | 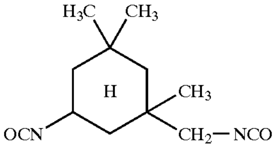 (100) | 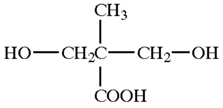 + $HO-(CH_2CH_2CH_2O)_4-H$ + (50) (15) $HO-(CH_2)_6-OH$ + $HO-(CH_2)_3-OH$ (15) (20) | 1.33 |

-continued
| | | | |
|---|---|---|---|
| (69) | 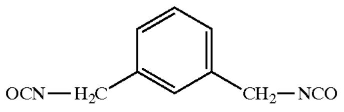 | 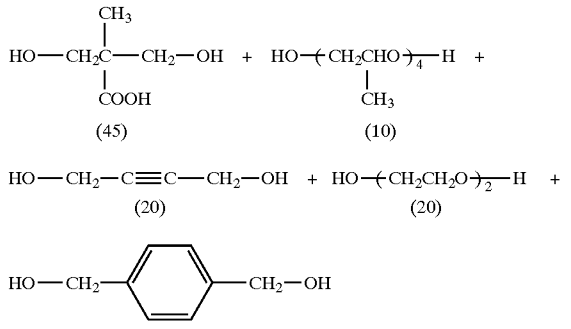 | 1.29 |
| (70) | 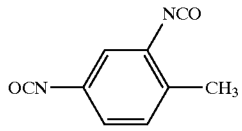 | 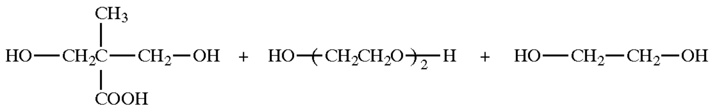 | 1.20 |
| (71) | 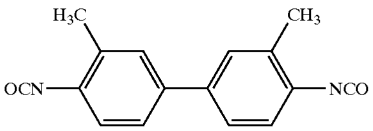 | 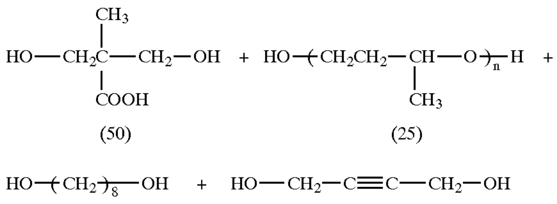 n' = 6 | 0.98 |
| (72) | 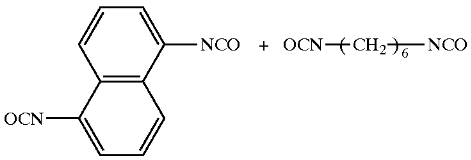 | 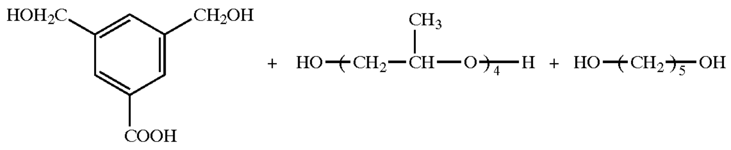 | 1.28 |

-continued
| | | | |
|---|---|---|---|
| (73) | 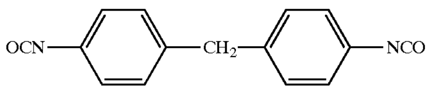 (50) + $OCN-(CH_2)_6-NCO$ (50) | 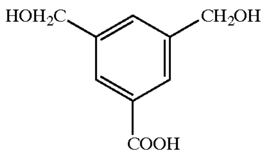 (50) + $HO-(CH_2CH_2O)_2-H$ + $HO-(CH_2)_4-OH$ | 1.35 |
| Polyurethane Resin | Diisocyanate Compound Used (mol %) | Diol Compound Used (mol %) | Residual Carboxyl Group Content |
| (74) | 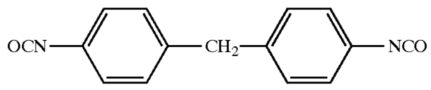 (60) + $OCN-(CH_2)_6-NCO$ (40) | 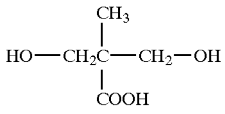 (40) + $HO-(CH_2CH_2O)_2-H$ (35) + $HO-(CH_2)_2-OH$ (25) | 1.16 |
| (75) | 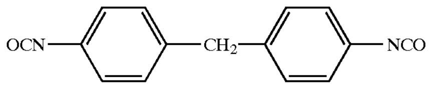 (70) + $OCN-(CH_2)_6-NCO$ (30) | 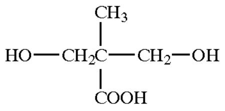 (45) + $HO-(CH_2CH_2O)_2-H$ (35) + 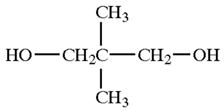 (20) | 1.23 |
| (76) | 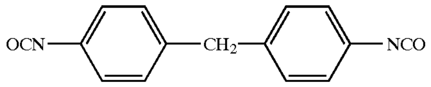 (40) + 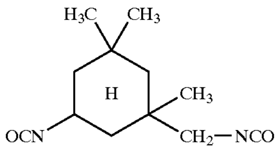 (60) | 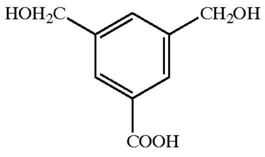 (45) + $HO-(CH_2CH_2O)_4-H$ (25) + $HO-(CH_2)_6-OH$ (30) | 1.05 |
| (77) | 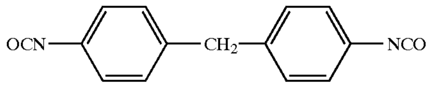 (70) + 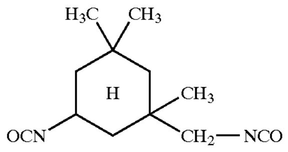 (30) | 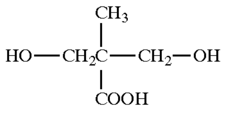 (45) + $HO-(CH_2CH_2O)_2-H$ (35) + $HO-(CH_2)_4-OH$ (20) | 1.18 |

-continued

| Polyurethane Resin | Diisocyanate Compound Used (mol %) | Diol Compound Used (mol %) | Acid Value (meq/g) |
|---|---|---|---|
| (78) | 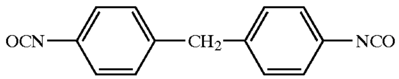 (60) + 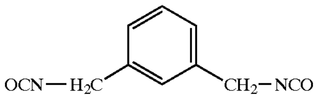 (40) | 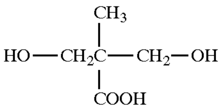 (40) + $HO\text{-}(CH_2CH_2O)_3\text{-}H$ (40) + 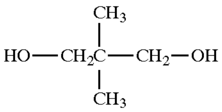 (20) | 1.03 |
| (79) | 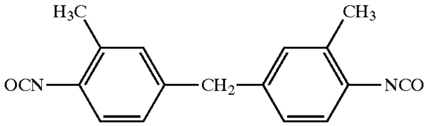 (60) + $OCN\text{-}(CH_2)_6\text{-}NCO$ (40) | 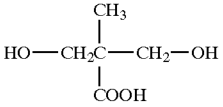 (40) + $HO\text{-}(CH_2CH_2O)_2\text{-}H$ (35) + 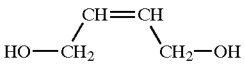 (25) | 1.10 |
| (80) | 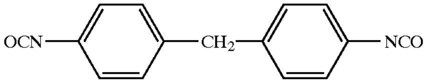 (70) + $OCN\text{-}(CH_2)_6\text{-}NCO$ (30) | 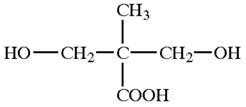 (58) + Compound No. 10 (hydroxyl group valence: 56.9 mgKOH/g) (10) + $HO\text{—}CH_2CH_2\text{—}OH$ (32) | 1.03 |
| (81) | 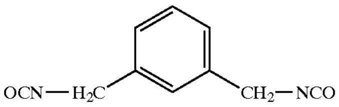 (100) | 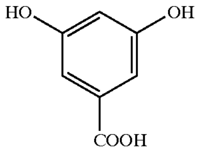 (80) + Compound No. 2 (hydroxyl group valence: 54.7 mgKOH/g) (20) | 1.08 |
| (82) | 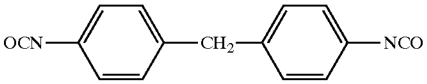 (50) + 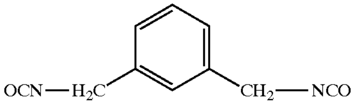 (50) | 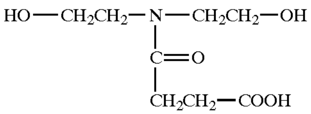 (85) + Compound No. 2 (hydroxyl group valence: 54.7 mgKOH/g) (15) | 1.22 |

-continued
(83)
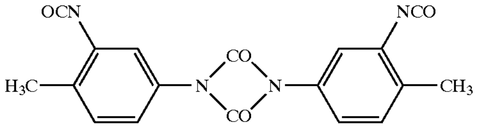 + $OCN-(CH_2)_6-NCO$
(50) (50)
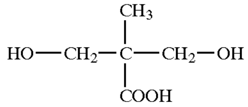 + Compound No. 2 (hydroxyl group valence: 54.7 mgKOH/g)
(90) (10)
1.54
(84)
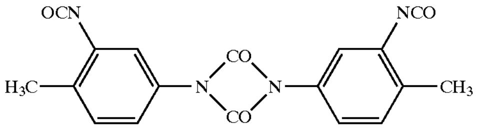 + $OCN-(CH_2)_6-NCO$
(50) (50)
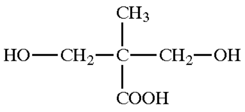 + Compound No. 2 (hydroxyl group valence: 54.7 mgKOH/g) + $Br-CH_2CH_2-OH$
(90) (10)
1.06
(85)
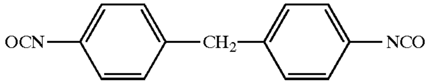
(100)
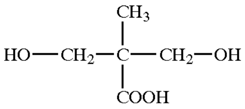 + Compound No. 14 (hydroxyl group valence: 55.2 mgKOH/g)
(85) (15)
1.24
(86)
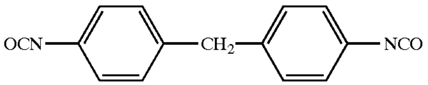 + 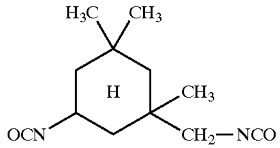
(60) (40)
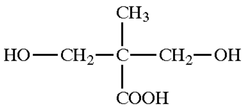 + Compound No. 14 (hydroxyl group valence: 55.2 mgKOH/g)
(90) (10)
1.57
(87)
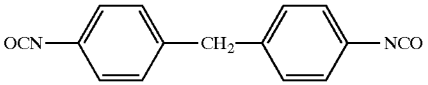 + 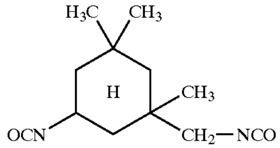
(60) (40)
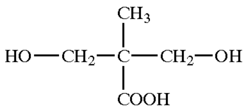 + Compound No. 14 (hydroxyl group valence: 55.2 mgKOH/g) + $Br-CH_2CH_2-OH$
(90) (10)
1.10

-continued
| | | | |
|---|---|---|---|
| (88) | 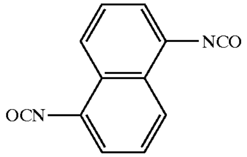 (100) | 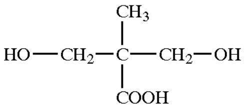 + Compound No. 3 (hydroxyl group valence: 74.8 mgKOH/g)<br>(85) (15) | 1.52 |
| (89) | 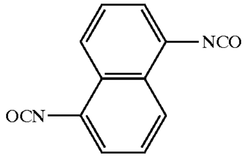 (100) | 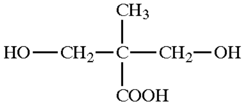 + Compound No. 3 (hydroxyl group valence: 74.8 mgKOH/g) + $OH—CH_2CH_2—OH$<br>(60) (15) (25) | 1.10 |
| (90) Sunthesis Example 1 | 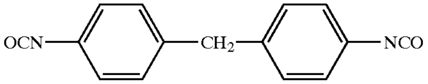 + $OCN—(CH_2)_6—NCO$<br>(80) (20) | 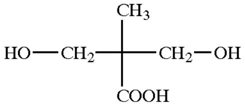 + Compound No. 5 (hydroxyl group valence: 56.9 mgKOH/g)<br>(90) (10) | 1.40 |
| (91) Sunthesis Example 2 | 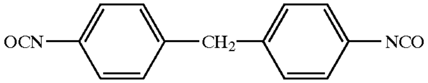 (100) | 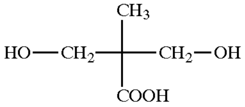 + Compound No. 5 (hydroxyl group valence: 56.9 mgKOH/g)<br>(90) (10) | 1.30 |
| (92) | 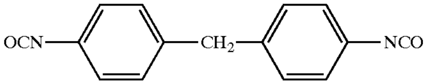 + $OCN—(CH_2)_6—NCO$<br>(80) (20) | 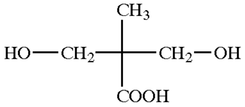 + Compound No. 15 (hydroxyl group valence: 55.7 mgKOH/g)<br>(90) (10) | 1.52 |

-continued
| | | | |
|---|---|---|---|
| (93) | 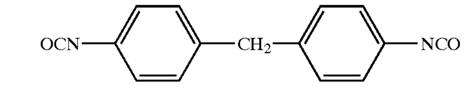 (80) + $OCN-(CH_2)_6-NCO$ (20) | 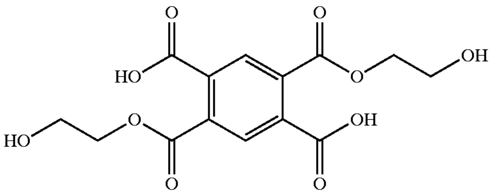 (75) + Compound No. 23 (hydroxyl group valence: 55.8 mgKOH/g) (25) | 1.20 |
| (94) | 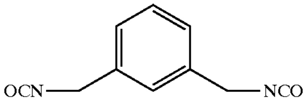 (100) | 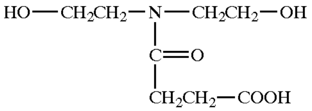 (90) + Compound No. 3 (hydroxyl group valence: 56.9 mgKOH/g) (10) | 1.34 |
| (95) | 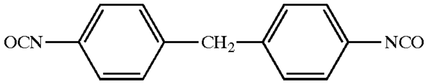 (60) + 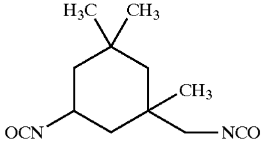 (40) | 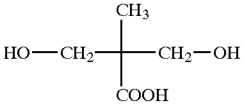 (85) + Compound No. 2 (hydroxyl group valence: 56.9 mgKOH/g) (15) | 1.01 |
| (96) | 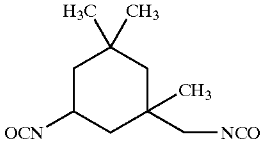 (80) + $OCN-(CH_2)_6-NCO$ (20) | 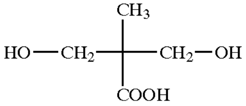 (90) + Compound No. 23 (hydroxyl group valence: 55.8 mgKOH/g) (10) | 1.58 |
| (97) | 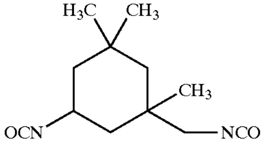 (80) + $OCN-(CH_2)_6-NCO$ (20) | 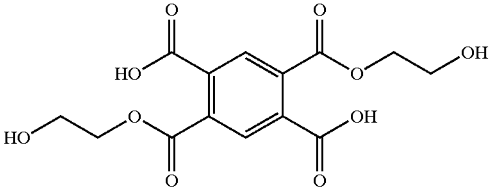 (75) + Compound No. 9 (hydroxyl group valence: 55.8 mgKOH/g) (25) | 1.38 |

-continued
| | | |
|---|---|---|
| (98) | 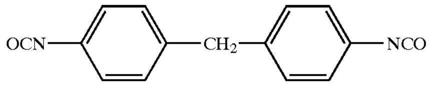 (80) + $OCN-(CH_2)_6-NCO$ (20) 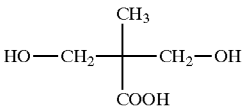 (90) + Compound No. 21 (hydroxyl group valence: 54.3 mgKOH/g) (10) | 1.47 |
| (99) | 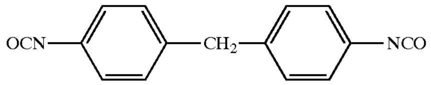 (80) + $OCN-(CH_2)_6-NCO$ (20) 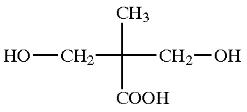 (90) + Compound No. 18 (hydroxyl group valence: 56.3 mgKOH/g) (10) | 1.41 |
| (100) | 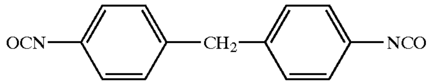 (80) + $OCN-(CH_2)_6-NCO$ (20) 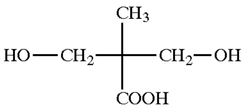 (85) + Compound No. 23 (hydroxyl group valence: 55.8 mgKOH/g) (10) + 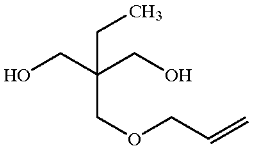 (5) | 1.13 |

-continued
| | | | |
|---|---|---|---|
| (101) | 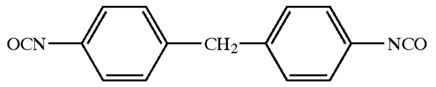 + 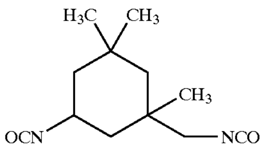<br>(60) (40) | 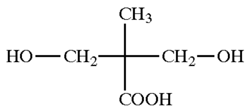 + Compound No. 23 (hydroxyl group valence: 55.8 mgKOH/g) +<br>(80) (10)<br>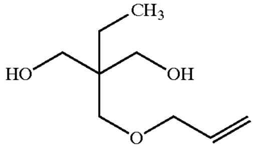<br>(10) | 1.09 |
| (102) | 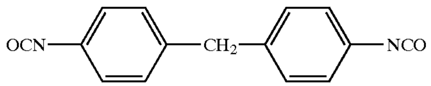 + OCN—$(CH_2)_6$—NCO<br>(80) (20) | 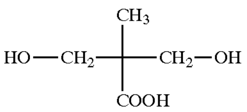 + Compound No. 22 (hydroxyl group valence: 56.3 mgKOH/g)<br>(90) (10) | 1.41 |
| (103) | 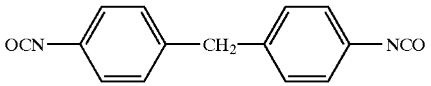<br>(100) | 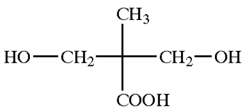 + Compound No. 4 (hydroxyl group valence: 56.4 mgKOH/g)<br>(90) (10) | 1.39 |

-continued
| | | | |
|---|---|---|---|
| (104) | 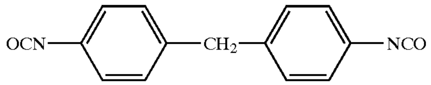 (80) + $OCN-(CH_2)_6-NCO$ (20) | 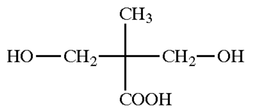 (80) + Compound No. 4 (hydroxyl group valence: 56.4 mgKOH/g) (10) + 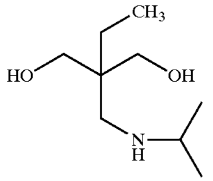 (10) | 1.09 |
| (105) | 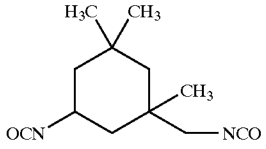 (100) | 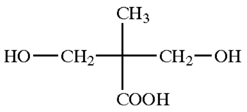 (90) + Compound No. 4 (hydroxyl group valence: 56.4 mgKOH/g) (10) | 1.45 |
| (106) | 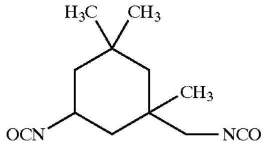 (100) | 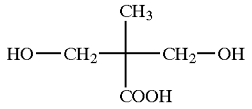 (80) + Compound No. 23 (hydroxyl group valence: 55.8 mgKOH/g) (10) + 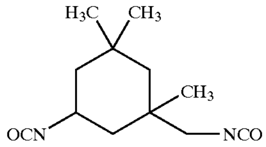 (10) | 1.43 |

-continued
| | | | |
|---|---|---|---|
| (107) | 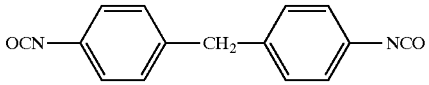 (80) 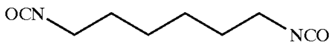 (20) | 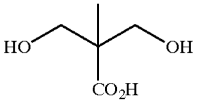 (80) 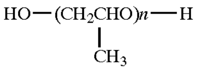 Average molecular weight: 1000 n = 17 (20) | 1.40 |
| (108) | 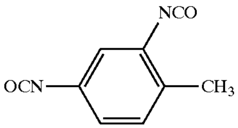 (80) + 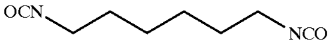 (20) | 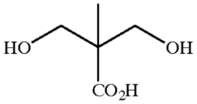 (80) 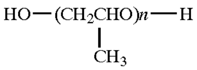 Average molecular weight: 1000 n = 17 (20) | 1.70 |
| (109) | 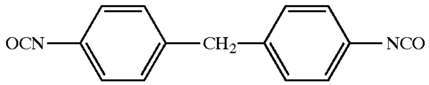 (80) 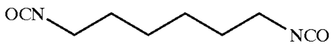 (20) | 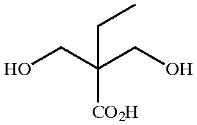 (80) + 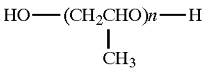 Average molecular weight: 1000 n = 17 (20) | 1.40 |
| (110) | 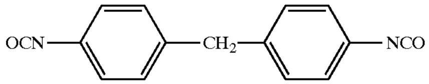 (80) 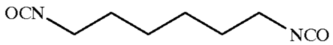 (20) | 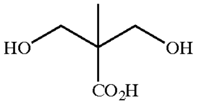 (89) + 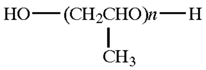 Average molecular weight: 2000 n = 34 (11) | 1.40 |

-continued
| | | | |
|---|---|---|---|
| (111) | 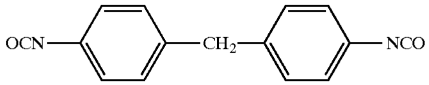<br>(80)<br>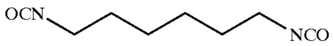<br>(20) | 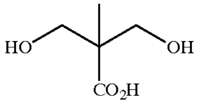<br>(92)<br>+<br>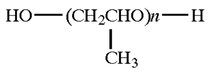<br>Average molecular weight: 3000<br>n = 51<br>(8) | 1.44 |
| (112) | 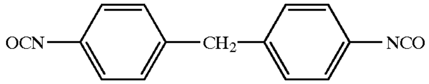<br>(80)<br>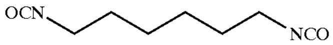<br>(20) | 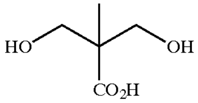<br>(75)<br>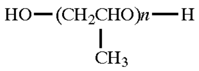<br>Average molecular weight: 700<br>n = 12<br>(25) | 1.36 |
| (113) | 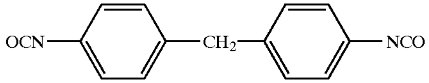<br>(80)<br>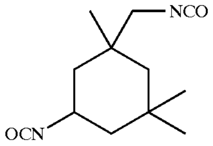<br>(20) | 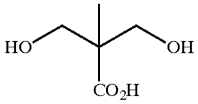<br>(85)<br>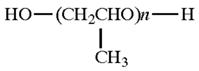<br>Average molecular weight: 1000<br>n = 17<br>(15) | 1.47 |

-continued
| | | | |
|---|---|---|---|
| (114) | 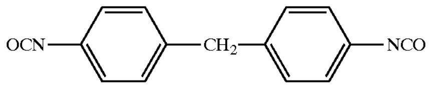 (80) 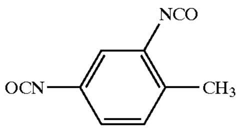 (20) | 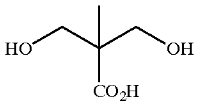 (80) 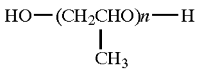 Average molecular weight: 1000 n = 17 (20) | 1.38 |
| (115) | 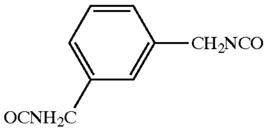 (80) + 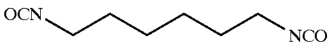 (20) | 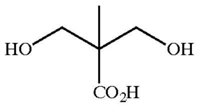 (80) 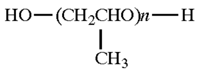 Average molecular weight: 1000 n = 17 (20) | 1.53 |
| (116) | 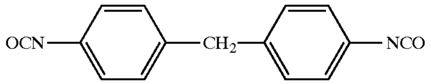 (80) 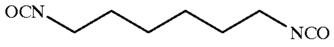 (20) | 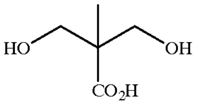 (80) + $HO—(CH_2CH_2CH_2CH_2O)n—H$ Average molecular weight: 1000 n = 14 (20) | 1.40 |

-continued
| | | | |
|---|---|---|---|
| (117) | 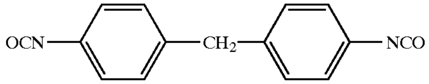 (80) 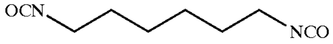 (20) | 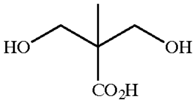 (88) + HO—$(CH_2CH_2CH_2CH_2O)_n$—H Average molecular weight: 2000 n = 28 (12) | 1.40 |
| (118) | 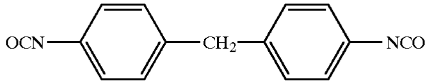 (80) 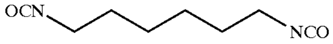 (20) | 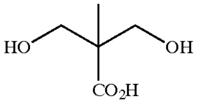 (80) + NEWPOLE 50HB-400 (20) | 1.30 |
| (119) | 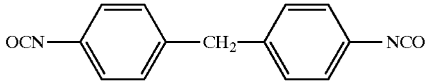 (80) 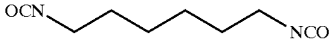 (20) | 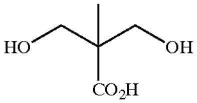 (85) NEWPOLE 50HB-2000 (15) | 1.35 |
| (120) | 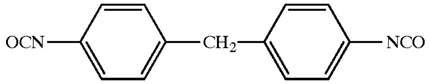 (80) 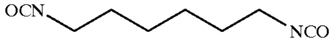 (20) | 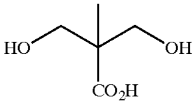 (90) + NEWPOLE PE-71 (10) | 1.30 |

-continued
| | | | |
|---|---|---|---|
| (121) | 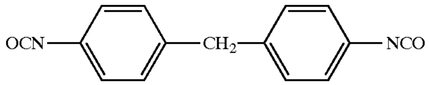<br>(80)<br>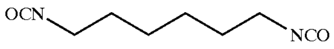<br>(20) | 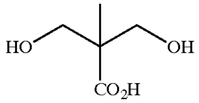 + NEWPOLE BP-2P<br>(70) (30) | 1.40 |
| (122) | 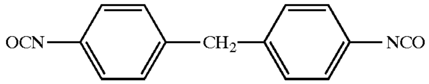<br>(80)<br>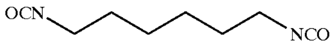<br>(20) | 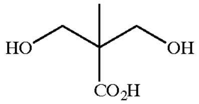 + NEWPOLE BPE-40<br>(70) (30) | 1.32 |

The ii) compound having an addition polymerizable ethylenically unsaturated bond for use in the present invention is described below.

(A) Addition Polymerizable Compound

The addition polymerizable compound having at least one ethylenically unsaturated double bond for use in the present invention is selected from the compounds having at least one, preferably two or more terminal ethylenically unsaturated bonds. These compounds are widely known in this art and may be used in the present invention without any particular limitation. These compounds have a chemical form such as a monomer, a prepolymer (i.e., dimer, trimer or oligomer) or a mixture or copolymer thereof. Examples of the monomer and a copolymer thereof include unsaturated carboxylic acids (e.g., acrylic acid, methacrylic acid, itaconic acid, crotonic acid, isocrotonic acid, maleic acid), and esters and amides thereof. Of these, esters of an unsaturated carboxylic acid with an aliphatic polyhydric alcohol compound and amides of an unsaturated carboxylic acid with an aliphatic polyhydric amine compound are preferred. Also, an unsaturated carboxylic acid ester having a nucleophilic substituent such as a hydroxyl group, an amino group or a mercapto group, an addition reaction product of an amide with a monofunctional or polyfunctional isocyanate or epoxy, and a dehydration condensation reaction product with a monofunctional or polyfunctional carboxylic acid may be suitably used. Furthermore, an addition reaction product of an unsaturated carboxylic acid ester or amide having an electrophilic substituent such as an isocyanate group or an epoxy group with a monofunctional or polyfunctional alcohol, amine or thiol, and a displacement reaction product of an unsaturated carboxylic acid ester or amide having a desorptive substituent such as a halogen group or a tosyloxy group with a monofunctional or polyfunctional alcohol, amine or thiol may also be suitable used. In addition, a compound substituted by an unsaturated phosphonic acid, styrene or vinyl ether in place of the above-described unsaturated carboxylic acid may also be used.

The addition polymerizable compound having at least one ethylenically unsaturated double bond is particularly preferably a urethane-based addition polymerizable compound produced using the addition reaction of an isocyanate and a hydroxyl group.

Specific examples thereof include a vinylurethane compound having two or more polymerizable vinyl groups within one molecule, obtained by adding a vinyl monomer containing a hydroxyl group represented by the following formula (V) to a polyisocyanate compound having two or more isocyanate groups within one molecule described, for example, in JP-B-48-41708:

$$CH_2{=}C(R)COOCH_2CH(R')OH \qquad (V)$$

(wherein R and R' each represents H or $CH_3$).

Furthermore, urethane acrylates described in JP-A-51-37193, JP-B-2-32293 and JP-B-2-16765, and urethane compounds having an ethylene oxide-based skeleton described in JP-B-58-49860, JP-B-56-17654, JP-B-62-39417 and JP-B-62-39418. Specific examples of preferred urethane-based addition polymerizable compounds are set forth below. The compounds shown below are a reaction product of a polyisocyanate compound of the group (1) with an alcohol compound of the group (2).

Group (1)

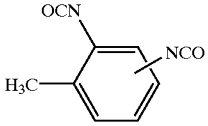

(2-, 4- and 2, 6-form)

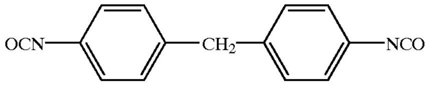

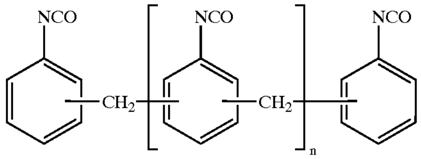

*n*: 0 or an integer of 1 or greater

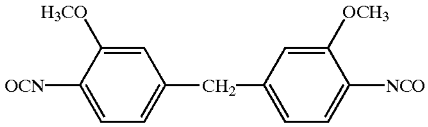

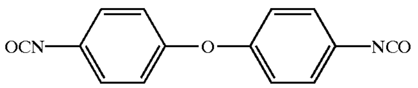

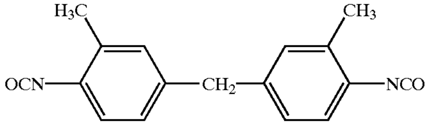

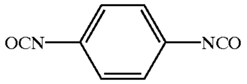

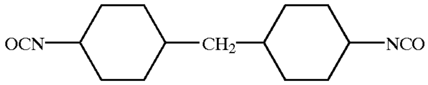

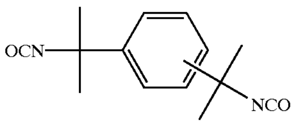

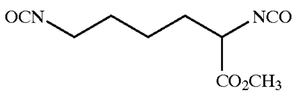

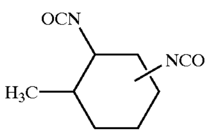

(2-, 4- and 2, 6-form)

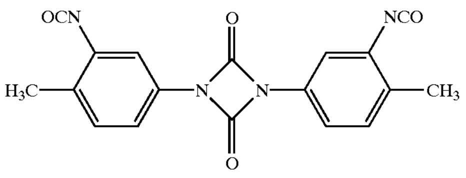

-continued
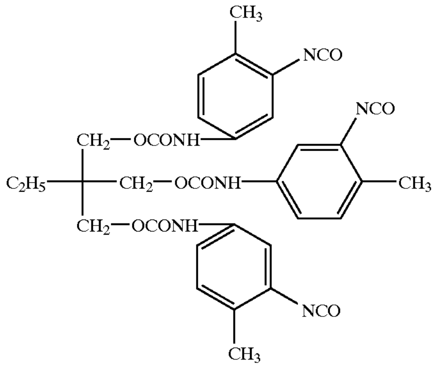
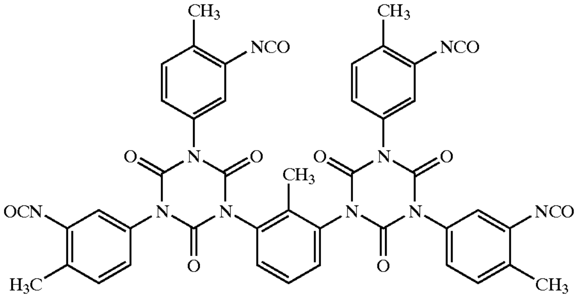
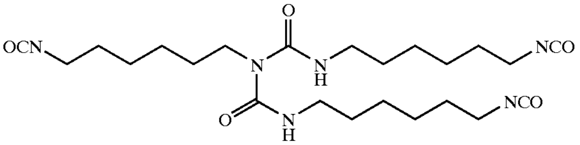
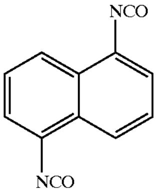
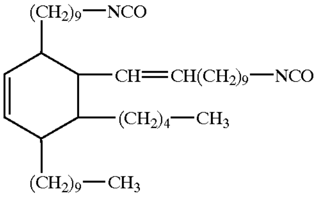
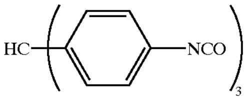
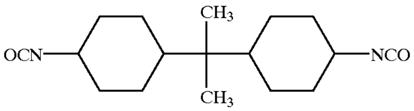
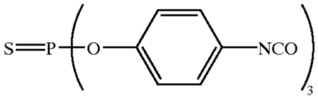
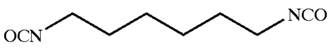
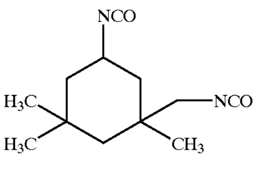
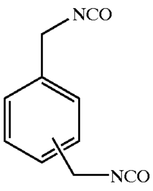
-continued
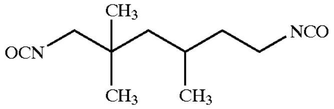
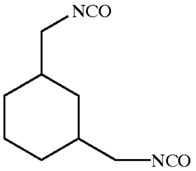
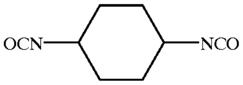
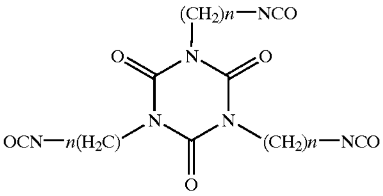
*n*: an integer of from 1 to 20
Group (2)
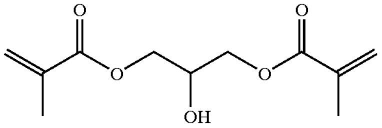
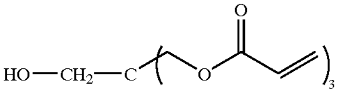
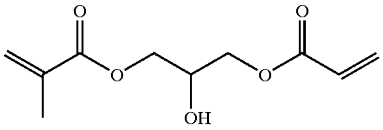
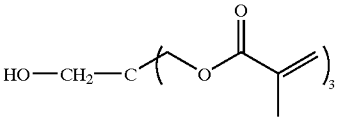
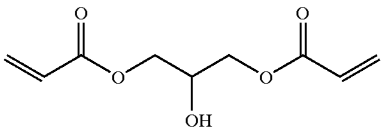
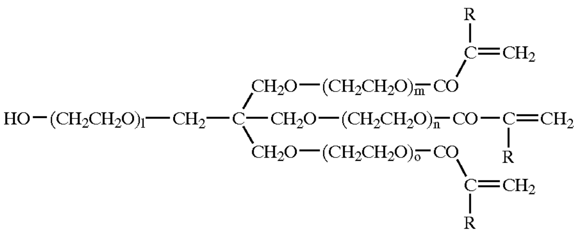
R: hydrogen or a methyl group
λ, *m*, *n*, *o*: an integer of from 1 to 20

-continued

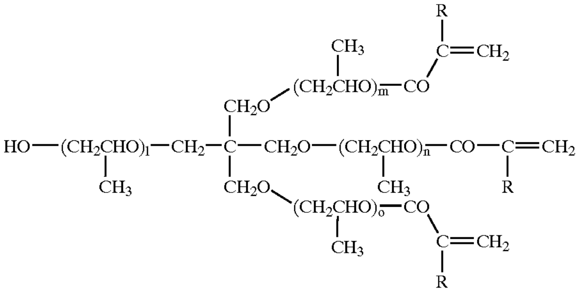

R: hydrogen or a methyl group

λ, *m*, *n*, *o*: an integer of from 1 to 20

These compounds are commercially available under the trade names: Urethane Acrylate M-1100, M-1200, M-1210, M-1300 (all produced by Toa Gosel Co., Ltd.), EB210, EB4827, EB6700, EB220 (all produced by Dicel UCB), UVITHANE-782, UVITHANE-783, UVITHANE-788, UVITHANE-893 (all produced by MORTON THIOKOL Inc.), Art Resin UN-9000EP, Art Resin UN-9200A, Art Resin UN-900H, Art Resin UN-1255, Art Resin UN-5000, Art Resin UN-2111A, Art Resin UN-2500, Art Resin UN-3320HA, Art Resin UN-3320HB, Art Resin UN-3320HC, Art Resin UN-3320HS, Art Resin UN-6060P, Art Resin UN-6060PTM, Art Resin SH-380G, Art Resin SH-500, Art Resin SH-9832 (all produced by Negami Kogyo KK), NK Oligo U-4H, NK Oligo U-4HA, NK Oligo U-4P, NK Oligo U-4PA, NK Oligo U-4TX, NK Oligo U-4TXA, NK Oligo U-6LHA, NK Oligo U-6LPA-N, NK Oligo U-6LTXA, NK Oligo UA-6ELP, NK Oligo UA-6ELH, NK Oligo UA-6ELTX, NK Oligo UA-6PLP, NK Oligo U-6ELP, NK Oligo U-6ELH, NK Oligo U-8MDA, NK Oligo U-8MD, NK Oligo U-12LMA, NK Oligo U-12LM, NX Oligo U-6HA, Oligo U-108A, NK Oligo U-1084A, NK Oligo U-200AX, NK Oligo U-122A, NK Oligo U-340A, NX Oligo U-324A, NK Oligo UA-100 (all produced by Shin Nakamura Kagaku KK), AH-600, AT-600, UA-306H, AI-600, UA-101T, UA-101I, UA-101H, UA-306T, UA-306I, UF-8001 and UF-8003 (all produced by Kyoeisha Kagaku KK).

Specific examples of the ester monomer of an aliphatic polyhydric alcohol compound with an unsaturated carboxylic acid include: acrylic esters such as ethylene glycol diacrylate, triethylene glycol diacrylate, 1,3-butandiol diacrylate, tetramethylene glycol diacrylate, propylene glycol diacrylate, neopentyl glycol diacrylate, trimethylolpropane triacrylate, trimethylolpropane tri (acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate and polyester acrylate oligomer;

- methacrylic esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane;
- itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate;
- crotonic acid esters such as ethylene glycol dicrotonate, tetramethylene glycol dicrotonate, pentaerythritol dicrotonate and sorbitol tetradicrotonate;
- isocrotonic acid esters such as ethylene glycol diisocrotonate, pentaerythritol diisocrotonate and sorbitol tetraisocrotonate; and
- maleic acid esters such as ethylene glycol dimaleate, triethylene glycol dimaleate, pentaerythritol dimaleate and sorbitol tetramaleate.

Other than those esters, for example, aliphatic alcohol-based esters described in JP-B-46-27926, JP-B-51-47334 and JP-A-57-196231, esters having an aromatic skeleton described in JP-A-59-5240, JP-A-59-5241 and JP-A-2-226149, and esters containing an amino group described in JP-A-1-165613 may also be suitably used.

The above-described ester monomers may be used as a mixture.

Specific examples of the amide monomer of an aliphatic polyhydric amine compound with an unsaturated carboxylic acid include methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, xylylenebismethacrylamide.

Other preferred examples of the amide-based monomer include those having a cyclohexylene structure described in JP-B-54-21726.

Furthermore, by using an addition polymerizable compound having an amino structure or sulfide structure within the molecule described in JP-A-63-277653, JP-A-63-260909 and JP-A-1-105238, a photopolymerizable composition having a very excellent photosensitization rate can be obtained.

In addition, polyfunctional acrylates and methacrylates such as polyester acrylates described in JP-A-48-64183, JP-B-49-43191 and JP-B-52-30490 and epoxy acrylates obtained by reacting an epoxy resin with a (meth)acrylic acid may also be used. Furthermore, specific saturated compounds described in JP-B-46-43946, JP-B-1-40337 and JP-B-1-40336, and vinylphosphonic acid-based compounds described in JP-A-2-25493 may also be used. In some cases, a structure containing a perfluoroalkyl group described in JP-A-61-22048 may be suitably used. Also, those described in *Nippon Secchaku Kyokai-shi* (*Japan Adhesive Journal*), vol. 20, No. 7, pp. 300–308 (1984) as a photo-curable monomer or oligomer may be used.

Details on use of these addition polymerizable compounds, such as structure used, sole use or combination use, and the amount added, can be freely selected according to the performance design of the final photosensitive material. For example, the following items are taken into account. In view of the photosensitization rate, a structure having a larger amount of unsaturated groups per one molecule is preferred and in many cases, a bifunctional or greater functional compound is preferred. In order to intensify the strength of the image area, namely, the cured layer, a trifunctional or greater functional compound is preferred. By using compounds different in the functional number or polymerizable group (for example, acrylic acid ester, methacrylic acid ester, styrene-based compound or vinyl ether-based compound) in combination, both the photosensitivity and the strength can be effectively controlled. Compounds having a large molecular weight or compounds having high hydrophobicity ensure high photosensitization rate and excellent layer strength, but on the other hand, these are disadvantageous in some cases in view of the development rate or precipitation in the developer. The selection and form of the addition polymerizable compounds are important also in view of compatibility with other components in the photosensitive layer (e.g., binder polymer, initiator, coloring agent) or dispersibility. For example, by using a low purity compound or using two or more compounds in combination, the compatibility may be improved. Furthermore, a specific structure may be selected for the purpose of improving the adhesion of support or overcoat layer. With respect to the compounding ratio of the addition polymerizable compound in the photosensitive layer, the larger is more advantageous in view of sensitivity, however, if it is excessively large, phase separation may disadvantageously occur, there arise problems in the production due to the adhesive property of the photosensitive layer (for example, production failure ascribable to the transfer or adhesion of photosensitive components), or deposition from the developer may be generated. From these standpoints, the compounding ratio is in many cases preferably from 50 to 80 wt %, more preferably from 25 to 75 wt %. These compounds may be used either individually or in combination. In addition, on use of the addition polymerizable compound, appropriate structure, compounding and addition amount may be freely selected by taking account of the extent of polymerization inhibition due to oxygen, the resolution, the fogging property, the change of refractive index, the surface adhesion and the like. Furthermore, in some cases, a layer structure or coating method such as undercoating or overcoating may also be used.

The iii) photopolymerization initiation system for use in the present invention is described below.

(3) Photopolymerization Initiation System

The iii) photopolymerization initiation system as the third essential component of the photosensitive layer of the present invention contains a radical activator therein and an already known radical activator may be used therefor.

Preferred examples of the radical activator include (a) aromatic ketones, (b) aromatic onium salt compounds, (c) organic peroxides, (d) thio compounds, (e) hexaarylbiimidazole compounds, (f) ketooxime ester compounds, (g) borate compounds, (h) azinium compounds, (i) active ester compounds, (j) compounds having a carbon halogen bond and (k) metallocene compounds.

Preferred examples of (a) the aromatic ketone as one example of the radical activator include compounds having a benzophenone skeleton or thioxanthone skeleton described in J. P. Fouassier and J. F. Rabek, *Radiation Curing in Polymer Science and Technology*, pp. 77–117 (1993) and examples thereof are set forth below.

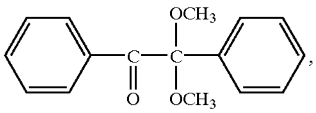

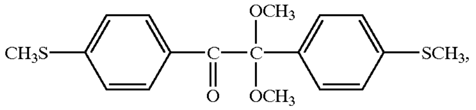

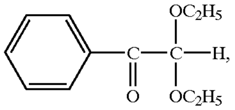

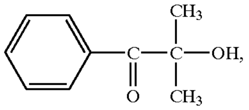

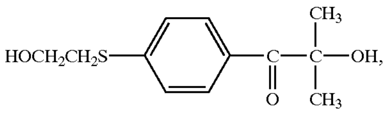

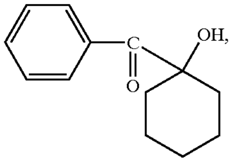

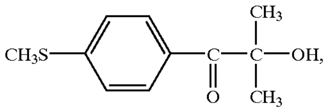

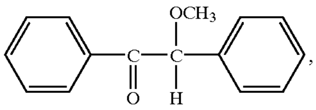

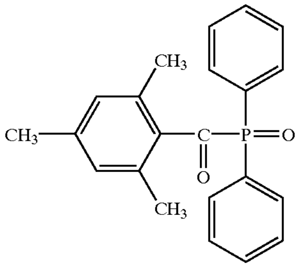

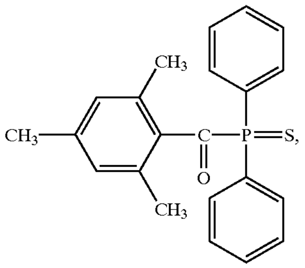

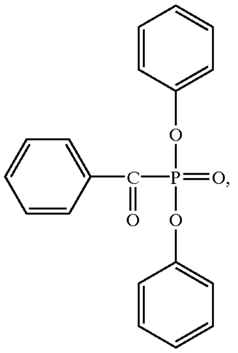

-continued
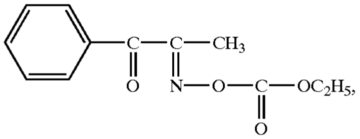
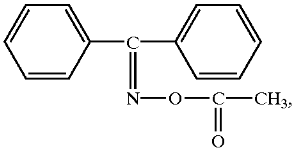
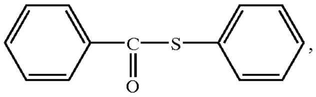,
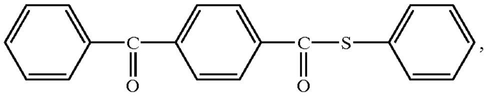,
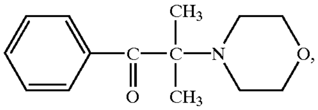
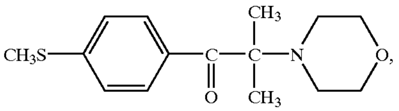
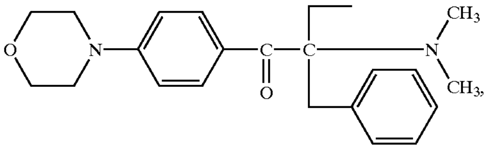
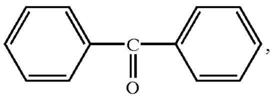,
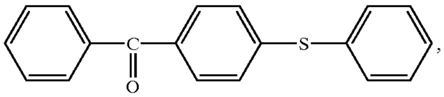,
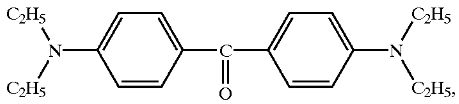
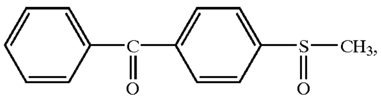
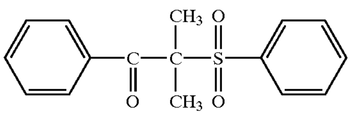,
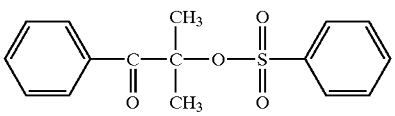
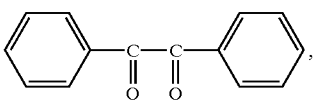,
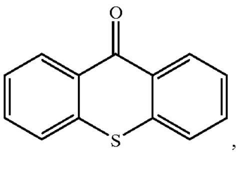,
-continued
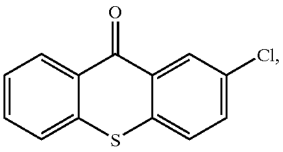
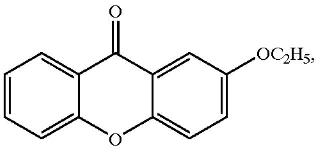
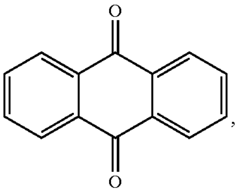, 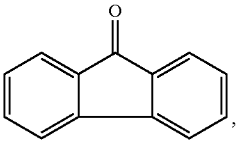,
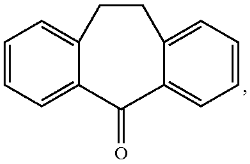,
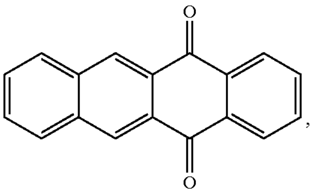,
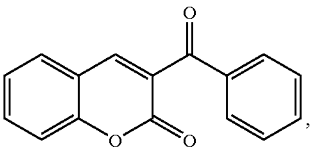,
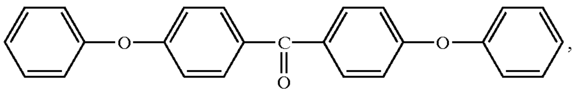,
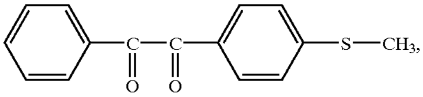
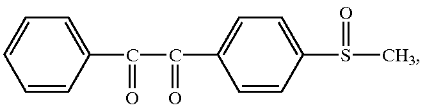
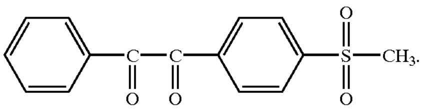
More preferred examples of (a) the aromatic ketone include α-thiobenzophenone compounds described in JP-B-47-6416, benzoin ethers described in JP-B-47-3981 such as

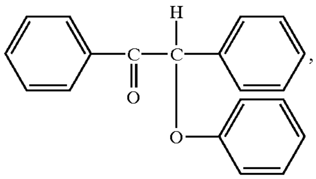
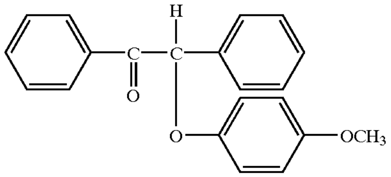
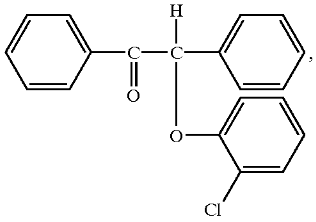
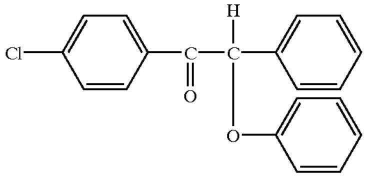
α-substituted benzoin compounds described in JP-B-47-22326 such as
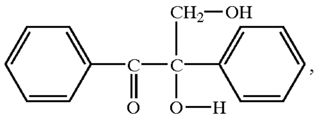
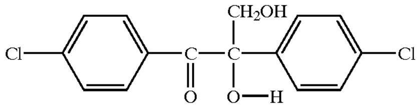
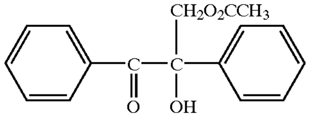
benzoin derivatives described in JP-B-47-23664, aroylphosphonic acid esters described in JP-A-57-30704, dialkoxybenzophenones described in JP-B-60-26483 such as
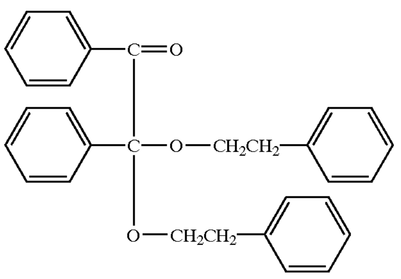
-continued
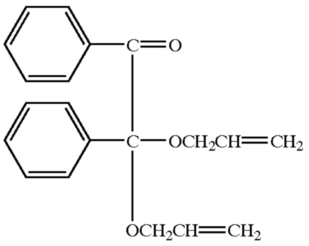
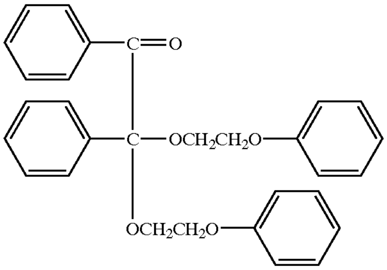
benzoin ethers described, in JP-B-60-26403 and JP-A-62-81345 such as
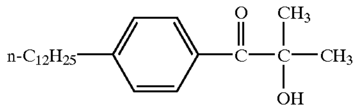
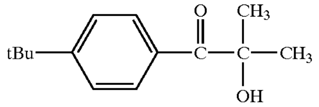
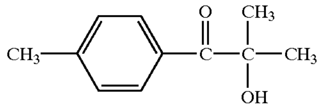
α-aminobenzophenones described in JP-B-1-34242, U.S. Pat. No. 4,318,791 and European patent 0234561A1 such as
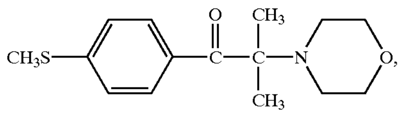
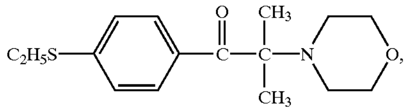
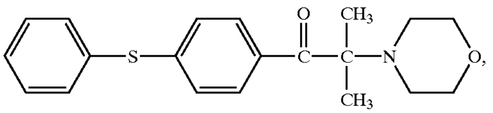
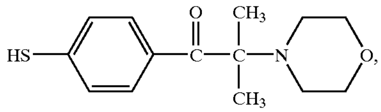
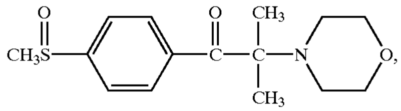

-continued

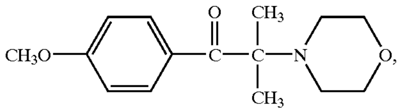

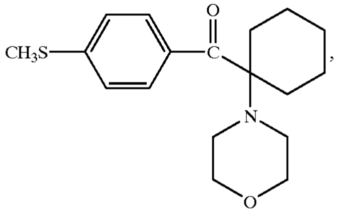

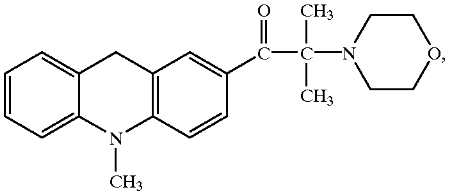

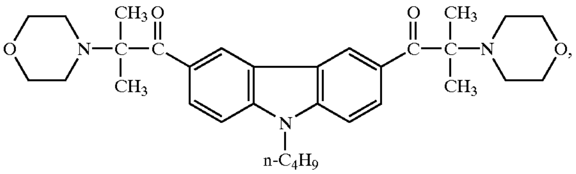

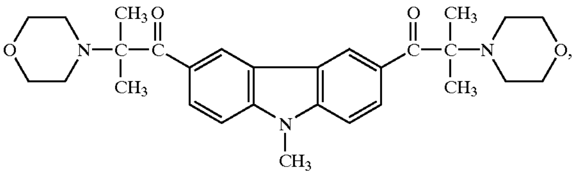

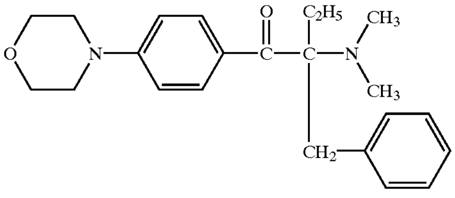

p-di(dimethylaminobenzenes described in JP-A-2-211452 such as

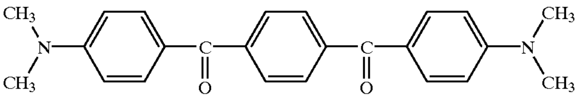

thio-substituted aromatic ketones described in JP-A-61-194062 such as

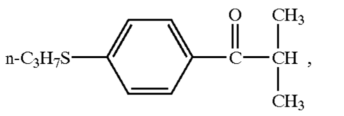

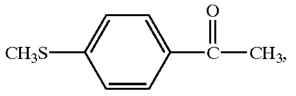

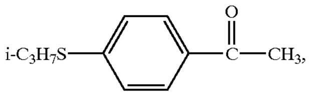

-continued

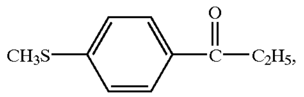

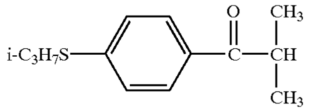

acylphosphine sulfides described in JP-B-2-9597 such as

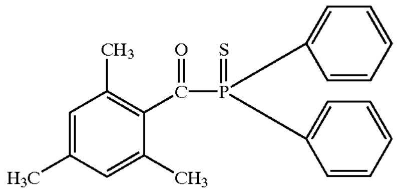

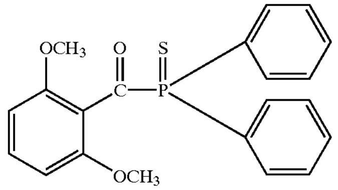

acylphosphines described in JP-B-2-9596 such as

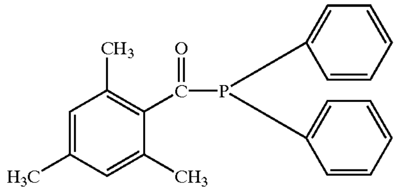

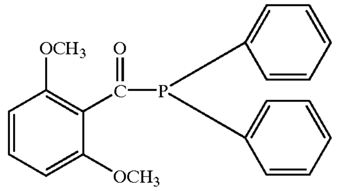

thioxanthones described in JP-B-63-61950 and coumarins described in JP-B-59-42864.

The (b) aromatic onium salt as another example of the radical activator includes an aromatic onium salt of elements belonging to Groups 15(5B), 16(6B) and 17(7B) of the Periodic Table, specifically, N, P, As, Sb, Bi, O, S, Se, Te and I. Examples of the aromatic onium salt include the compounds described in JP-B-52-14277, JP-B-52-14278 and JP-B-52-14279. Specific examples thereof include the following compounds.

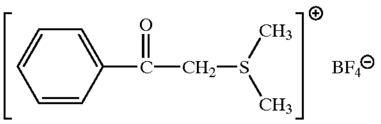

-continued
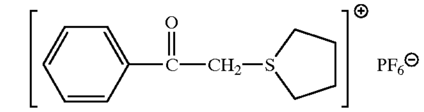
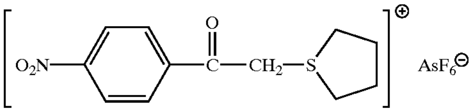
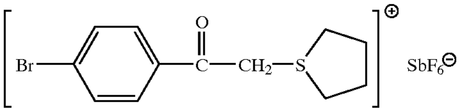
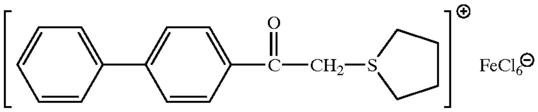
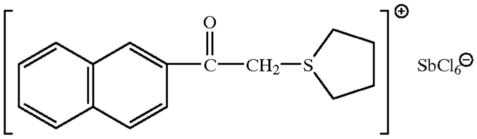
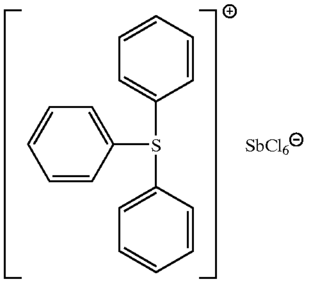
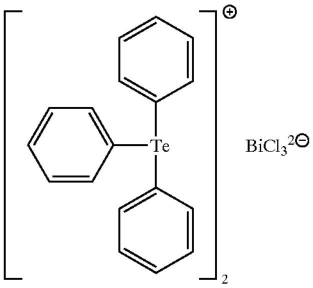
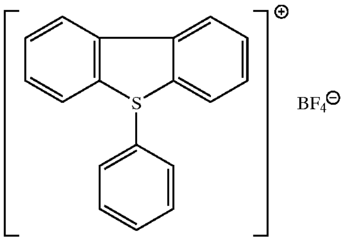
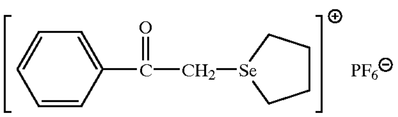
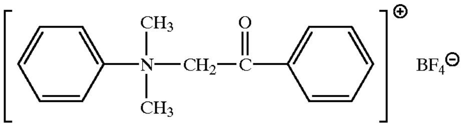
-continued
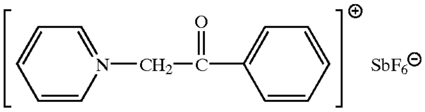
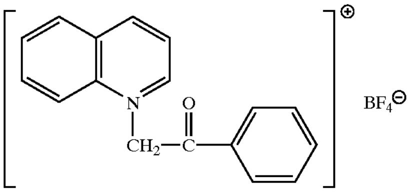
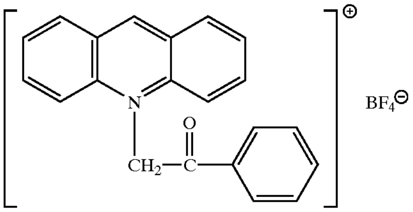
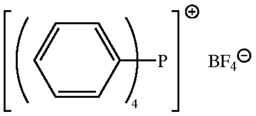
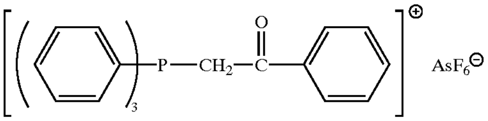
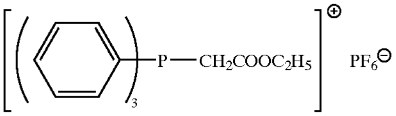
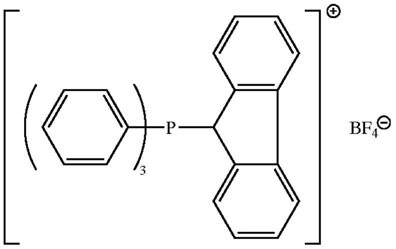
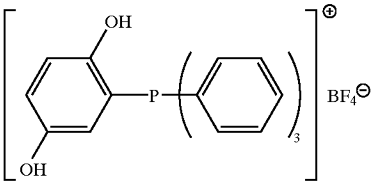
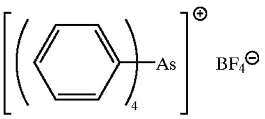
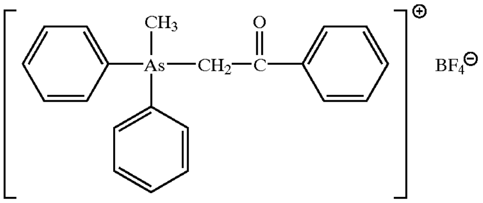

-continued

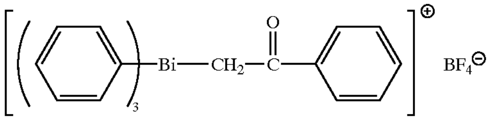

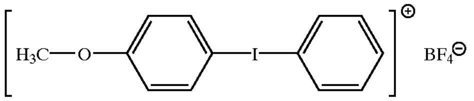

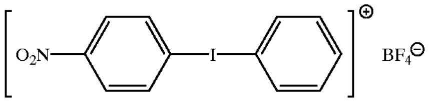

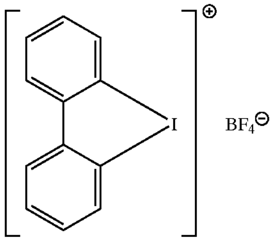

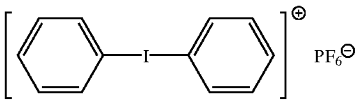

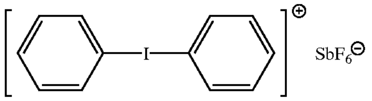

The (c) organic peroxide as still another example of the radical activator for use in the present invention includes almost all organic compounds having one or more oxygen-oxygen bond in the molecule and examples thereof include methyl ethyl ketone peroxide, cyclohexanone peroxide, 3,3,5-trimethylcyclohexanone peroxide, methylcyclohexanone peroxide, acetylacetone peroxide, 1,1-bis(t-butylperoxy)-3,3,5-trimethylcyclohexane, 1,1-bis(t-butylperoxy) cyclohexane, 2,2-bis(t-butylperoxy)butane, t-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-t-butyl peroxide, t-butylcumyl peroxide, dicumyl peroxide, bis(t-butylperoxyisopropyl)benzene, 2,5-dimethyl-2,5-di(t-butylperoxy)hexane, 2,5-dimethyl-2,5-di(t-butylperoxy) hexine-3, acetyl peroxide, isobutyryl peroxide, octanoyl peroxide, decanoyl peroxide, lauroyl peroxide, 3,5,5-trimethylhexanoyl peroxide, succinic peroxide, benzoyl peroxide, 2,4-dichlorobenzoyl peroxide, meta-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, t-butyl peroxyacetate, t-butyl peroxypivalate, t-butyl peroxyneodecanoate, t-butyl peroxyoctanoate, t-butyl peroxy-3,5,5-trimethylhexanoate, t-butyl peroxylaurate, t-butyl peroxybenzoate, di-t-butyl peroxyisophthalate, 2,5-dimethyl-2,5-di(benzoylperoxy) hexane, t-butyl maleic peroxide, t-butyl peroxyisopropylcarbonate, 3,3',4,4'-tetra-(t-butylperoxycarbonyl)benzophenone, 3,3',4,4'-tetra-(t-amylperoxycarbonyl)benzophenone, 3,3',4,4'-tetra-(t-hexylperoxycarbonyl)benzophenone, 3,3',4,4'-tetra(t-octylperoxycarbonyl)benzophenone, 3,3',4,4'-tetra (cumylperoxycarbonyl)benzophenone, 3,3',4,4'-tetra(p-isopropylcumylperoxycarbonyl)benzophenone, carbonyldi (t-butylperoxydihydrogendiphthalate) and carbonyldi(t-hexylperoxydihydrogen-diphthalate).

Among these, ester peroxides such as 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra (cumylperoxycarbonyl)benzophenone, 3,3',4,4'-tetra(p-isopropylcumylperoxycarbonyl)benzophenone and di-t-butyl diperoxyisophthalate are preferred.

The (d) thio compound as an example of the radical activator for use in the present invention is represented by the following formula [d]:

[d]

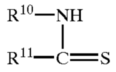 or 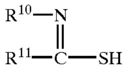

(wherein $R^{10}$ represents an alkyl group, an aryl group or a substituted aryl group and $R^{11}$ represents a hydrogen atom or an alkyl group or $R^{10}$ and $R^{11}$ may be combined with each other to represent a nonmetallic atom group necessary for forming a 5-, 6- or 7-membered ring which may contain a hetero atom selected from an oxygen atom, a sulfur atom and a nitrogen atom).

The alkyl group represented by $R^{10}$ in formula [d] is preferably an alkyl group having from 1 to 4 carbon atoms. The aryl group represented by $R^{10}$ is preferably an aryl group having from 6 to 10 carbon atoms such as phenyl and naphthyl and the substituted aryl group includes the above-described aryl groups substituted by a halogen atom such as chlorine, an alkyl group such as methyl, or an alkoxy group such as methoxy or ethoxy.

$R^{11}$ is preferably an alkyl group having from 1 to 4 carbon atoms.

Specific examples of the thio compound represented by formula [d] include the following compounds. The compounds are shown by a combination of $R^{10}$ and $R^{11}$ or the like.

| No. | $R^{10}$ | $R^{11}$ |
|---|---|---|
| 1 | H | H |
| 2 | H | $CH_3$ |
| 3 | $CH_3$ | H |
| 4 | $CH_3$ | $CH_3$ |
| 5 | $C_6H_5$ | $C_2H_5$ |
| 6 | $C_6H_5$ | $C_4H_9$ |
| 7 | $C_6H_4Cl$ | $CH_3$ |
| 8 | $C_6H_4Cl$ | $C_4H_9$ |
| 9 | $C_6H_4—CH_3$ | $C_4H_9$ |
| 10 | $C_6H_4—OCH_3$ | $CH_3$ |
| 11 | $C_6H_4—OCH_3$ | $C_2H_5$ |
| 12 | $C_6H_4OC_2H_5$ | $CH_3$ |
| 13 | $C_6H_4OC_2H_5$ | $C_2H_5$ |
| 14 | $C_6H_4OCH_3$ | $C_4H_9$ |
| 15 | $—(CH_2)_2—$ | |
| 16 | $—(CH_2)_2—S—$ | |
| 17 | $—CH(CH_3)—CH_2—S—$ | |
| 18 | $—CH_2—CH(CH_3)—S—$ | |
| 19 | $—C(CH_3)_2—CH_2—S—$ | |
| 20 | $—CH_2—C(CH_3)_2—S—$ | |

-continued

| No. | $R^{10}$ | $R^{11}$ |
|---|---|---|
| 21 | $-(CH_2)_2-O-$ | |
| 22 | $-CH(CH_3)-CH_2-O-$ | |
| 23 | $-C(CH_3)_2-CH_2-O-$ | |
| 24 | $-CH=CH-N(CH_3)-$ | |
| 25 | $-(CH_2)_3-S-$ | |
| 26 | $-(CH_2)_2-CH(CH_3)-S-$ | |
| 27 | $-(CH_2)_3-O-$ | |
| 28 | $-(CH_2)_5-$ | |
| 29 | $-C_6H_4-O-$ | |
| 30 | $-N=C(SCH_3)-S-$ | |
| 31 | $-C_6H_4-NH-$ | |
| 32 | 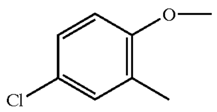 | |

The (e) hexaarylbiimidazole as another example of the radical activator for use in the present invention includes lophine dimers described in JP-B-45-37377 and JP-B-44-86516 such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4', 5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4',5,5'-tetraphenylbiimidazole.

The (f) ketooxime ester as another example of the radical activator for use in the present invention includes 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one and 2-ethoxycarbonyloxyimino-1-phenylpropan-1-one.

The (g) borate salt as still another example of the radical activator for use in the present invention includes the compound represented by the following formula [g]:

[g]

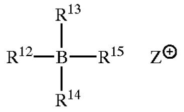

wherein $R^{12}$, $R^{13}$, $R^{14}$ and $R^{15}$, which may be the same or different, each represents a substituted or unsubstituted alkyl group, a substituted or unsubstituted aryl group, a substituted or unsubstituted alkenyl group, a substituted or unsubstituted alkynyl group or a substituted or unsubstituted heterocyclic group, two or more groups of $R^{12}$, $R^{13}$, $R^{14}$ and $R^{15}$ may be combined to form a cyclic structure, provided that at least one of $R^{12}$, $R^{13}$, $R^{14}$ and $R^{15}$ is a substituted or unsubstituted alkyl group, and $Z^+$ represents an alkali metal cation or a quaternary ammonium cation.

The alkyl group represented by $R^{12}$, $R^{13}$, $R^{14}$ or $R^{15}$ includes a linear, branched or cyclic alkyl group preferably having from 1 to 18 carbon atoms. Specific examples thereof include methyl, ethyl, propyl, isopropyl, butyl, pentyl, hexyl, octyl, stearyl, cyclobutyl, cyclopentyl and cyclohexyl. The substituted alkyl group includes the above-described alkyl groups substituted by a substituent such as a halogen atom (e.g., —Cl, —Br), a cyano group, a nitro group, an aryl group (preferably a phenyl group), a hydroxy group, $-N(R^{16})(R^{17})$ (wherein $R^{16}$ and $R^{17}$ each independently represents a hydrogen atom, an alkyl group having from 1 to 14 carbon atoms or an aryl group), $-COOR^{18}$ (wherein $R^{18}$ represents a hydrogen atom, an alkyl group having from 1 to 14 carbon atoms or an aryl group), $-OCOR^{19}$ or $-OR^{20}$ (wherein $R^{19}$ and $R^{20}$ each represents an alkyl group having from 1 to 14 carbon atoms or an aryl group).

The aryl group represented by $R^{12}$, $R^{13}$, $R^{14}$ or $R^{15}$ includes a mono-, di- or tricyclic aryl group such as a phenyl group and a naphthyl group and the substituted aryl group includes the above-described aryl groups substituted by a substituent described above for the substituted alkyl group or by an alkyl group having from 1 to 14 carbon atoms.

The alkenyl group represented by $R^{12}$, $R^{13}$, $R^{14}$ or $R^{15}$ includes a linear, branched or cyclic alkenyl group having from 2 to 18 carbon atoms and the substituent for the substituted alkenyl group includes the substituents described above for the substituted alkyl group.

The alkynyl group represented by $R^{12}$, $R^{13}$, $R^{14}$ or $R^{15}$ includes a linear or branched alkynyl group having from 2 to 28 carbon atoms and the substituent for the substituted alkynyl group includes the substituents described above for the substituted alkyl group.

The heterocyclic group represented by $R^{12}$, $R^{13}$, $R^{14}$ or $R^{15}$ includes a 5- or greater membered, preferably 5-, 6- or 7-membered heterocyclic group, containing at least one of N, S and O. The heterocyclic group may contain a condensed ring and may further have a substituent described above for the substituted alkyl group.

Specific examples of the compound represented by formula [g] include the compounds described in U.S. Pat. Nos. 3,567,453 and 4,343,891 and European Patent Nos. 109,772 and 109,773, and the compounds set forth below.

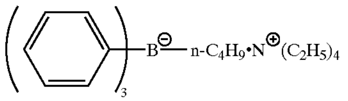

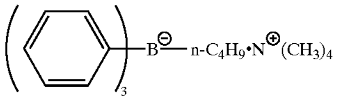

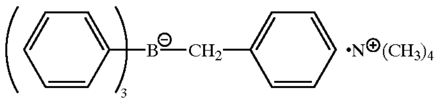

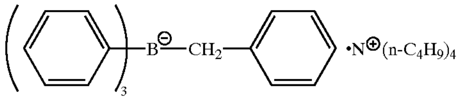

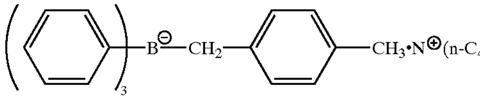

-continued

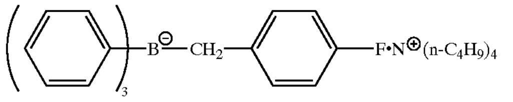

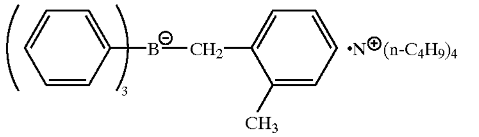

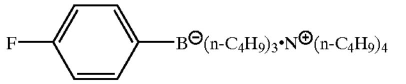

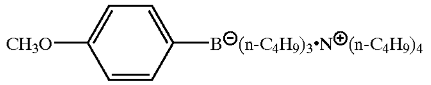

Examples of (h) the azinium salt compound as another example of the radical activator include the compounds having an N-O bond described in JP-A-63-138345, JP-A-63-142345, JP-A-63-142346, JP-A-63-143537 and JP-B-46-42363.

Examples of (i) the active ester compound as still another example of the radical activator include imidosulfonate compounds described in JP-B-62-6223 and active sulfonates described in JP-B-63-14340 and JP-A-59-174831.

Preferred examples of (j) the compound having a carbon-halogen bond as one example of the radical activator include ithe compounds represented by the following formulae [j-1] to [j-4], the carbonylmethylene heterocyclic compound having a trihalogenomethyl group represented by the following formula [j-5], the 4-halogeno-5-(halogenomethyl-phenyl) oxazole derivative represented by the following formula [j-6], and 2-halogenomethyl-phenyl-4-halogenooxazole derivative represented by the following formula [j-7]:

[j-1]

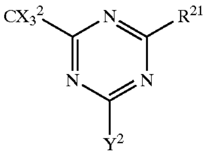

wherein $X^2$ represents a halogen atom, $Y^2$ represents $—CX_3^2$, $—NH_2$, $—NHR^{22}$, $—N(R^{22})_2$ or $—OR^{22}$ (wherein $R^{22}$ represents an alkyl group, a substituted alkyl group, an aryl group or a substituted aryl group) and $R^{21}$ represents $—CX_3^2$, an alkyl group, a substituted alkyl group, an aryl group, a substituted aryl group or a substituted alkenyl group;

[j-2]

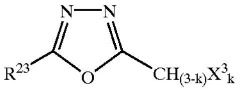

wherein $R^{23}$ represents an alkyl group, a substituted alkyl group, an alkenyl group, a substituted alkenyl group, an aryl group, a substituted aryl group, a halogen atom, an alkoxy group, a substituted alkoxyl group, a nitro group or a cyano group, $X^3$ represents a halogen atom and k represents an integer of from 1 to 3;

$$R^{24}—Z^2—CH_{(2-m)}X_m{}^3R^{25} \quad [j\text{-}3]$$

wherein $R^{24}$ represents an aryl group or a substituted aryl group and $R^{25}$ represents

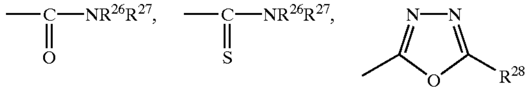

or a halogen atom, $Z^2$ represents —C(=O)—, —C(=S)— or $—SO_2—$, $R^{26}$ and $R^{27}$ each represents an alkyl group, a substituted alkyl group, an alkenyl group, a substituted alkenyl group, an aryl group or a substituted aryl group, $R^{28}$ is the same as $R^{22}$ in formula [j-1], $X^3$ represents a halogen atom, and m represents 1 or 2;

[j-4]

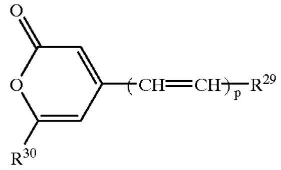

wherein $R^{29}$ represents an aryl group which may be substituted or a heterocyclic group which may be substituted, $R^{30}$ represents a trihaloalkyl or trihaloalkenyl group having from 1 to 3 carbon atoms, and p represents 1, 2 or 3;

[j-5]

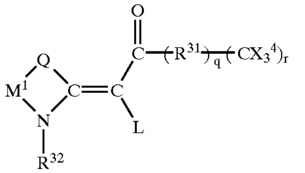

wherein L represents a hydrogen atom or a substituent represented by the formula: $CO—(R^{31})_q(CX_3{}^4)_r$, Q represents a sulfur atom, a selenium atom, an oxygen atom, a dialkylmethylene group, an alken-1,2-ylene group, 1,2-phenylene group or an N-$R^{31}$ group, $M^1$ represents a substituted or unsubstituted alkylene or alkenylene group or a 1,2-arylene group, $R^{32}$ represents an alkyl group, an aralkyl group or an alkoxyalkyl group, $R^{31}$ represents a carbocyclic or heterocyclic divalent aromatic group, $X^4$ represents a chlorine atom, a bromine atom or an iodine atom, and q=0 and r=1 or q=1 and r=1 or 2;

[j-6]

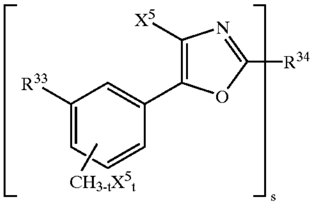

wherein $X^5$ represents a halogen atom, t represents an integer of from 1 to 3, s represents an integer of from 1 to 4, $R^{33}$ represents a hydrogen atom or a $CH_{3-t}X^5{}_t$ group, and $R^{34}$ represents an s-valent unsaturated organic group which may be substituted; and

[j-7]

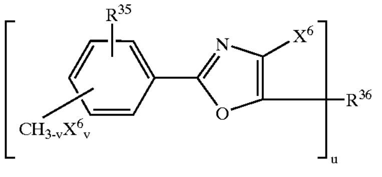

wherein $X^6$ represents a halogen atom, v represents an integer of from 1 to 3, u represents an integer of from 1 to 4, $R^{35}$ represents a $CH_{3-v}X^6{}_v$ group, and $R^{36}$ represents a u-valent unsaturated organic group which may be substituted.

Examples of the compound having a carbon-halogen bond include the compounds described in Wakabayashi et al, *Bull. Chem. Soc. Japan*, 42, 2924 (1969), such as 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine and 2-(α,α,β-trichloroethyl)-4,6-bis(trichloromethyl)-S-triazine; the compounds described in British Patent 1,388,492, such as 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine and 2-(p-methoxystyryl)-4-amino-6-trichloromethyl-S-triazine; the compounds described in JP-A-53-133428 such as 2-(4-methoxynaphtho-1-yl)-4,6-bis-trichloromethyl-S-triazine, 2-(4-ethoxynaphtho-1-yl)-4,6-bis-trichloromethyl-S-triazine, 2-[4-(2-ethoxyethyl)naphtho-1-yl]-4,6-bis-trichloromethyl-S-triazine, 2-(4,7-dimethoxynaphtho-1-yl)-4,6-bis-trichloromethyl-S-triazine and 2-(acenaphtho-5-yl)-4,6-bis-trichloromethyl-S-triazine; the compounds described in German Patent No. 3,337,024, such as

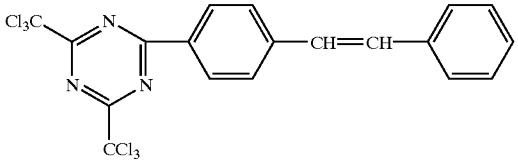

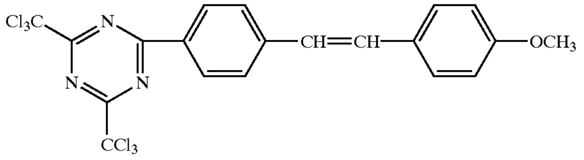

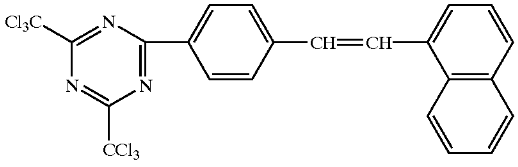

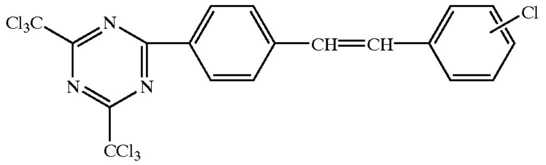

-continued

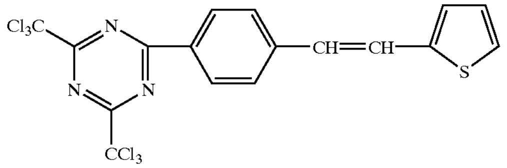

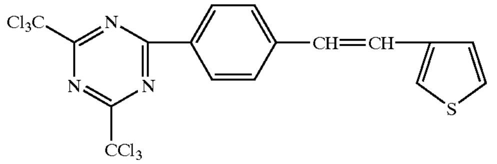

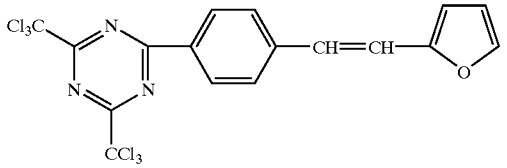

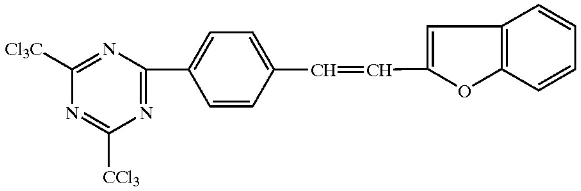

the compounds described in F. C. Schaefer et al., *J. Org. Chem.*, 29, 1527 (1964), such as 2-methyl-4,6-bis(tribromomethyl)-S-triazine, 2,4,6-tris(tribromomethyl)-S-triazine, 2,4,6-tris(dibromomethyl)-S-triazine, 2-amino-4-methyl-6-tribromomethyl-S-triazine and 2-methoxy-4-methyl-6-trichloromethyl-S-triazine;

the compounds described in JP-A-62-58241, for example, the compounds set forth below:

[化 97]

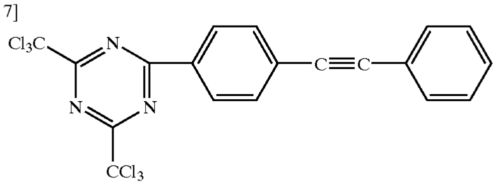

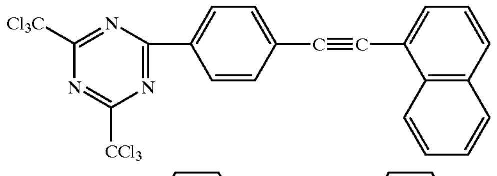

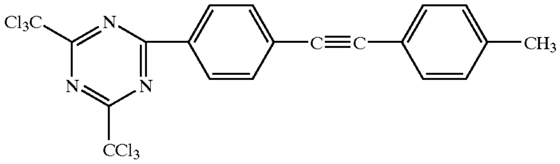

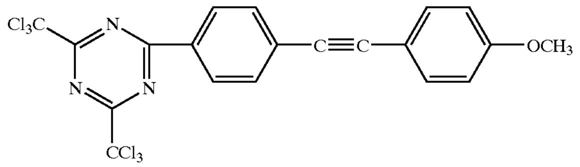

-continued
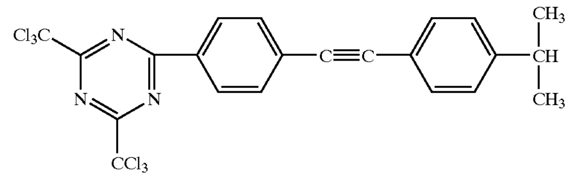
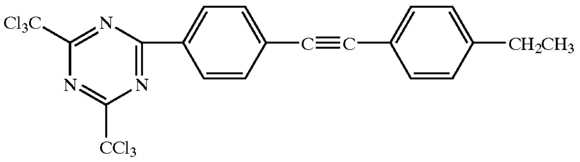
the compounds described in JP-A-5-281728, for example, the compounds set forth below:
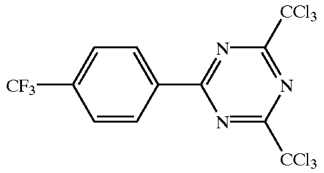
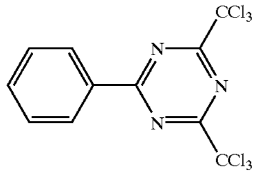
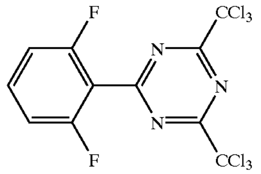
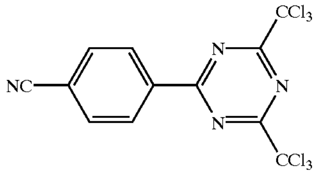
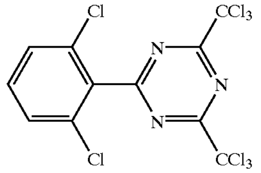
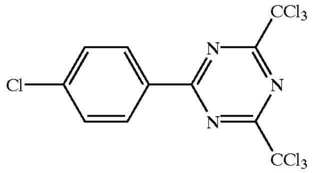
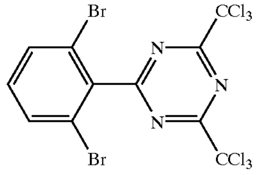
the compounds set forth below which can be easily synthesized by one skilled in the art according to the synthesis method described in M. P. Hutt, E. F. Elslager and L. M. Werbel, *Journal of Heterocyclic Chemistry*, Vol. 7 (No. 3), page 511 et seq. (1970):
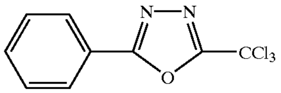
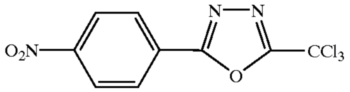
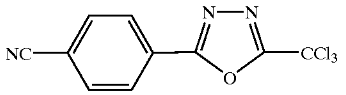
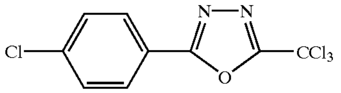
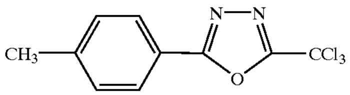
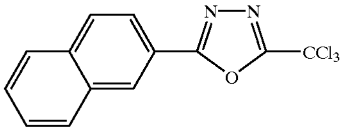
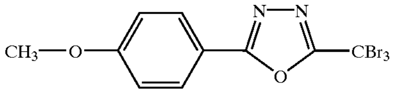
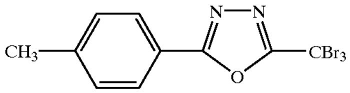
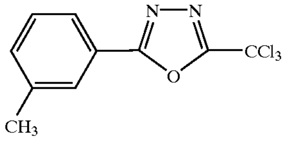
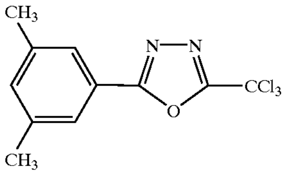
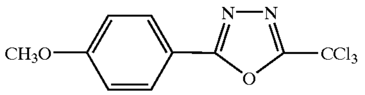
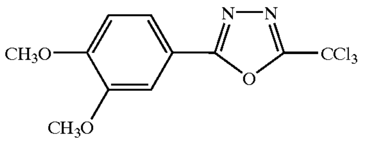
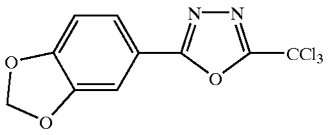
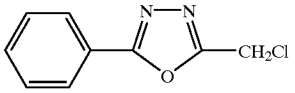

-continued
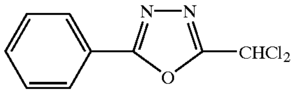
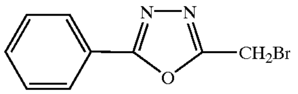
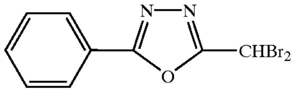
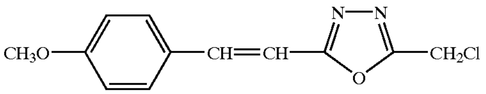
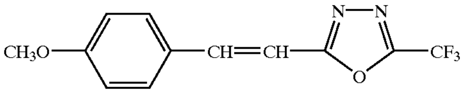
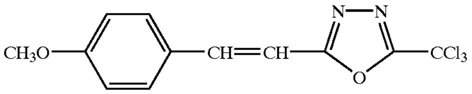
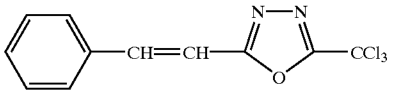
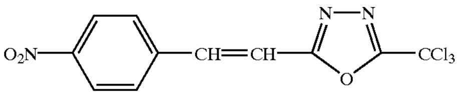
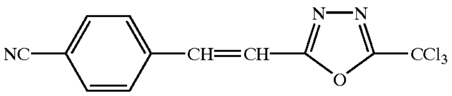
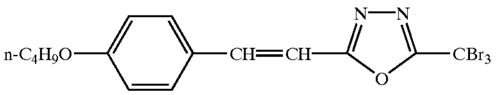
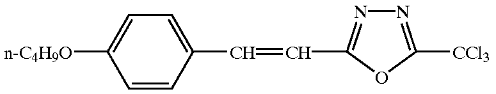
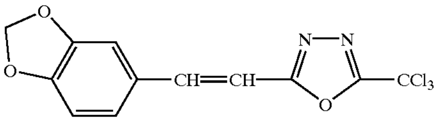
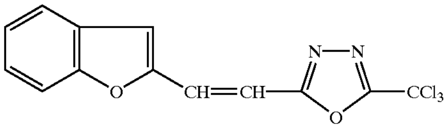
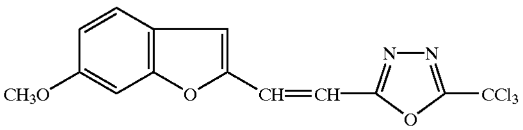
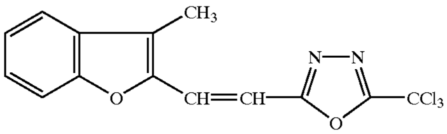
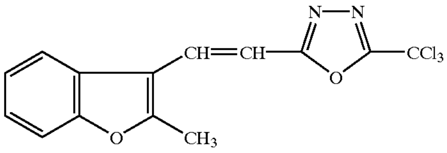
-continued
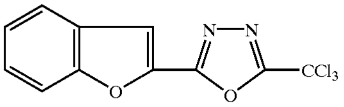
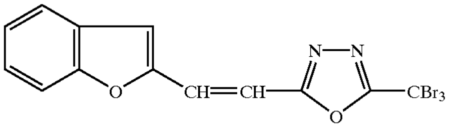
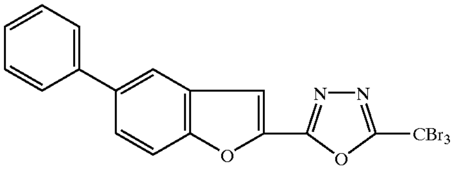
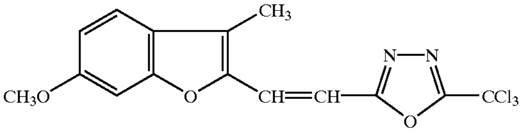
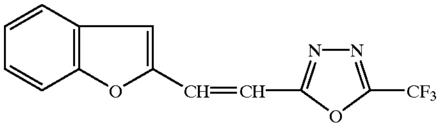
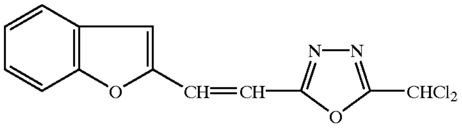
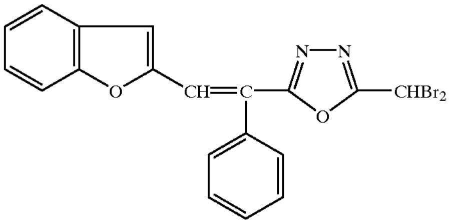
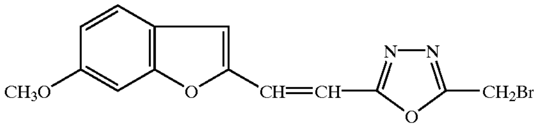
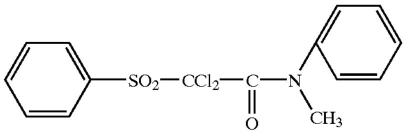
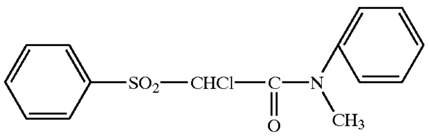
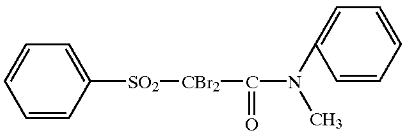
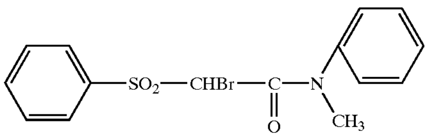

-continued

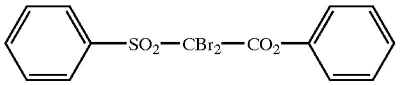

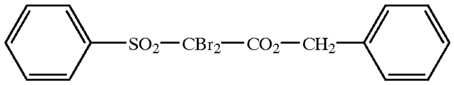

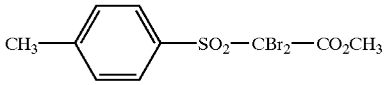

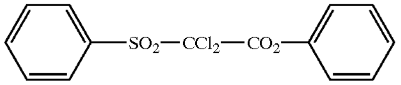

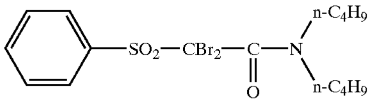

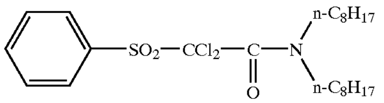

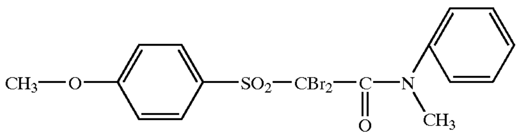

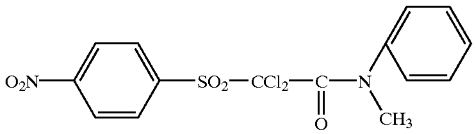

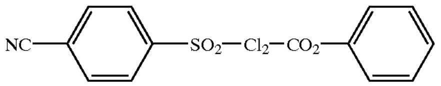

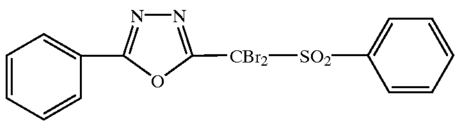

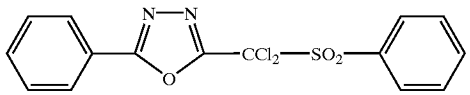

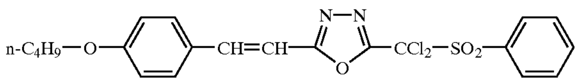

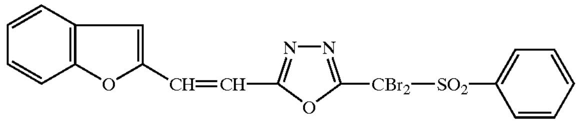

the compounds described in German Patent No. 2,641,100, such as 4-(4-methoxystyryl)-6-(3,3,3-trichloropropenyl)-2-pyrone and 4-(3,4,5-trimethoxystyryl)-6-trichloromethyl-2-pyrone; the compounds described in German Patent No. 3,333,450, for example, the compounds set forth below:

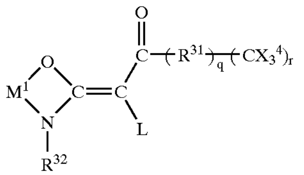

| | $R^{42}$ | M | L | a | $(CX^4_3)_r$ |
|---|---|---|---|---|---|
| 1 | $C_2H_5$ | 1,2-phenylene | H | 1 | 4-$CCl_3$ |
| 2 | $CH_2C_6H_5$ | 1,2-phenylene | H | 1 | 4-$CCl_3$ |
| 3 | $C_2H_5$ | 1,2-phenylene | H | 1 | 3-$CCl_3$ |
| 4 | $C_2H_5$ | 1,2-phenylene | H | 1 | 4-$CCl_3$ |
| 5 | $C_2H_5$ | 5-$CH_3$-1,2-phenylene | H | 0 | $CCl_3$ |
| 6 | $CH_2C_6H_5$ | 1,2-phenylene | H | 0 | $CCl_3$ |
| 7 | $C_2H_4OCH_3$ | 1,2-phenylene | H | 1 | 4-$CCl_3$ |

the compounds described in German Patent No. 3,021,590, for example, the compounds set forth below:

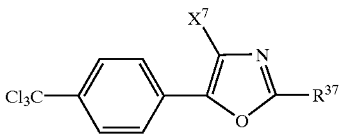

| | $R^{37}$ | $X^7$ |
|---|---|---|
| 1 | 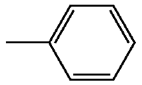 | Cl |
| 2 | 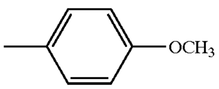 | Cl |
| 3 | 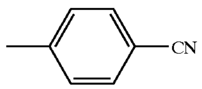 | Cl |

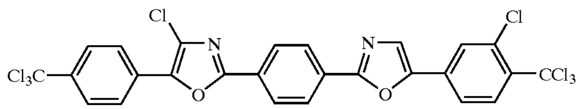

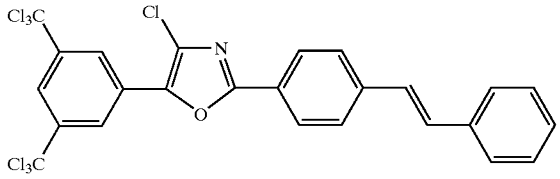

and, the compounds described in German Patent No. 3,021,599, for example, the compounds set forth below:

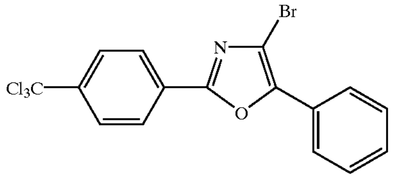

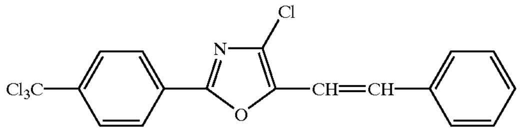

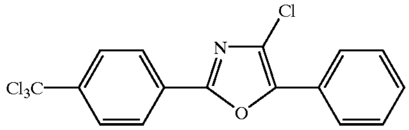

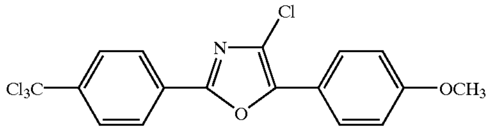

Examples of (k) the metallocene compound as still another example of the radical activator in the component iii) include titanocene compounds described in JP-A-59-152396, JP-A-61-151197, JP-A-63-41484, JP-A-2-249 and JP-A-2-4705, and iron-allene complexes described in JP-A-1-304453 and JP-A-1-152109.

Specific examples of the titanocene compound include dicyclopentadienyl-Ti-dichloride, dicyclopentadienyl-Ti-bis-phenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, bis(cyclopentadienyl)-bis(2,6-difluoro-3-(pyr-1-yl)phenyl]titanium, bis(cyclopentadienyl)bis[2,6-difluoro-3-(methylsulfonamido)phenyl]titanium, bis(cyclopentadienyl)bis[2,6-difluoro-3-(N-butylbiaroylamino)phenyl]titanium, bis(cyclopentadienyl)bis[2,6-difluoro-3-(N-ethylacetylamino)phenyl]titanium, bis(cyclopentadienyl)bis[2,6-difluoro-3-(N-methylacetylamino)phenyl]titanium, bis(cyclopentadienyl)bis[2,6-difluoro-3-(N-ethylpropionylamino)phenyl]titanium, bis(cyclopentadienyl)bis[2,6-difluoro-3-(N-ethyl-(2,2-dimethylbutanoyl)amino)phenyl]titanium, bis(cyclopentadienyl)bis[2,6-difluoro-3-(N-butyl-(2,2-dimethylbutanoyl)amino)phenyl]titanium, bis(cyclopentadienyl)bis[2,6-difluoro-3-(N-pentyl-(2,2-dimethylbutanoyl)amino)phenyl]titanium, bis(cyclopentadienyl)bis[2,6-difluoro-3-(N-hexyl)-(2,2-dimethylbutanoyl)phenyl]titanium, bis(cyclopentadienyl)bis[2,6-difluoro-3-(N-methylbutyrylamino)phenyl]titanium, bis(cyclopentadienyl)bis[2,6-difluoro-3-(N-methylpentanoylamino)phenyl]titanium, bis(cyclopentadienyl)bis[2,6-difluoro-3-(N-ethylcyclohexylcarbonylamino)phenyl]titanium, bis(cyclopentadienyl)bis[2,6-difluoro-3-(N-ethylisobutyrylamino)phenyl]titanium, bis(cyclopentadienyl)bis[2,6-difluoro-3-(N-ethylacetylamino)phenyl]titanium, bis(cyclopentadienyl)bis[2,6-difluoro-3-(2,2,5,5-tetramethyl-1,2,5-azadisilolidin-1-yl)phenyl]titanium, bis(cyclopentadienyl)bis[2,6-difluoro-3-(octylsulfonamido)phenyl]titanium, bis(cyclopentadienyl)bis[2,6-difluoro-3-(4-tolylsulfonamido)phenyl]titanium, bis(cyclopentadienyl)bis[2,6-difluoro-3-(4-dodecylphenylsulfonylamido)phenyl]titanium, bis(cyclopentadienyl)bis[2,6-difluoro-3-(4-(1-pentylheptyl)phenylsulfonylamido)phenyl]titanium, bis(cyclopentadienyl)bis[2,6-difluoro-3-(ethylsulfonylamido)phenyl]titanium, bis(cyclopentadienyl)bis[2,6-difluoro-3-((4-bromophenyl)sulfonylamido)phenyl]titanium, bis(cyclopentadienyl)bis[2,6-difluoro-3-(2-naphthylsulfonylamido)phenyl]titanium, bis(cyclopentadienyl)bis[2,6-difluoro-3-(hexadecylsulfonylamido)phenyl]titanium, bis(cyclopentadienyl)bis[2,6-difluoro-3-(N-methyl-(4-dodecylphenyl)sulfonylamido)phenyl]titanium, bis(cyclopentadienyl)bis[2,6-difluoro-3-(N-methyl-4-(1-pentylheptyl)phenyl)sulfonylamido)phenyl]titanium, bis(cyclopentadienyl)bis[2,6-difluoro-3-(N-hexyl-(4-tolyl)sulfonylamido)phenyl]titanium, bis(cyclopentadienyl)bis[2,6-difluoro-3-(pyrrolidine-2,5-dion-1-yl)phenyl]titanium, bis(cyclopentadienyl)bis[2,6-difluoro-3-(3,4-dimethyl-3-pyrrolidine-2,5-dion-1-yl)phenyl]titanium, bis(cyclopentadienyl)bis[2,6-difluoro-3-(phthalimido)phenyl]titanium, bis(cyclopentadienyl)bis[2,6-difluoro-3-(isobutoxycarbonylamino)phenyl]titanium, bis(cyclopentadienyl)bis[2,6-difluoro-3-(ethoxycarbonylamino)phenyl]titanium, bis(cyclopentadienyl)bis[2,6-difluoro-3-((2-chloroethoxy)carbonylamino)phenyl]titanium, bis(cyclopentadienyl)bis[2,6-difluoro-3-(phenoxycarbonylamino)phenyl]titanium, bis(cyclopentadienyl)bis[2,6-difluoro-3-(3-phenylthioureido)phenyl]titanium, bis(cyclopentadienyl)bis[2,6-difluoro-3-(3-butylthioureido)phenyl]titanium, bis(cyclopentadienyl)bis[2,6-difluoro-3-(3-phenylureido)phenyl]titanium, bis(cyclopentadienyl)bis[2,6-difluoro-3-(3-butylureido)phenyl]titanium, bis(cyclopentadienyl)bis[2,6-difluoro-3-(N,N-diacetylamino)phenyl]titanium, bis(cyclopentadienyl)bis[2,6-difluoro-3-(3,3-dimethylureido)phenyl]titanium, bis(cyclopentadienyl)bis[2,6-difluoro-3-(acetylamino)phenyl]titanium, bis(cyclopentadienyl)bis[2,6-difluoro-3-(butyrylamino)phenyl]titanium, bis(cyclopentadienyl)bis[2,6-difluoro-3-(decanoylamino)phenyl]titanium, bis(cyclopentadienyl)bis[2,6-difluoro-3-(octadecanoylamino)phenyl]titanium, bis(cyclopentadienyl)bis[2,6-difluoro-3-(isobutyrylamino)phenyl]titanium, bis(cyclopentadienyl)bis[2,6-difluoro-3-(2-ethylhexanoylamino)phenyl]titanium, bis(cyclopentadienyl)bis[2,6-difluoro-3-(2-methylbutanoylamino)phenyl]titanium, bis(cyclopentadienyl)bis[2,6-difluoro-3-(pivaloylamino)phenyl]titanium, bis(cyclopentadienyl)bis[2,6-difluoro-3-(2,2-dimethylbutanoylamino)phenyl]titanium, bis(cyclopentadienyl)bis[2,6-difluoro-3-(2-ethyl-2-methylheptanoylamino)phenyl]titanium, bis(cyclopentadienyl)bis[2,6-difluoro-3-(cyclohexylcarbonylamino)phenyl]titanium, bis(cyclopentadienyl)bis[2,6-difluoro-3-(2,2-dimethyl-3-chloropropanoylamino)phenyl]titanium, bis(cyclopentadienyl)bis[2,6-difluoro-3-(3-phenylpropanoylamino)phenyl]titanium, bis(cyclopentadienyl)bis[2,6-difluoro-3-(2-chloromethyl-2-methyl-3-chloropropanoylamino)phenyl]titanium, bis(cyclopentadienyl)bis[2,6-difluoro-3-(3,4-xyloylamino)phenyl]titanium, bis(cyclopentadienyl)bis[2,6-difluoro-3-(4-ethylbenzoylamino)phenyl]titanium, bis(cyclopentadienyl)bis[2,6-difluoro-3-(2,4,6-mesitylcarbonylamino)phenyl]titanium, bis(cyclopentadienyl)bis[2,6-difluoro-3-(benzoylamino)phenyl]titanium, bis(cyclopentadienyl)bis[2,6-difluoro-3-(N-(3-phenylpropyl)benzoylamino)phenyl]titanium, bis(cyclopentadienyl)bis[2,6-difluoro-3-(N-(3-ethylheptyl)-2,2-dimethylpentanoylamino)phenyl]titanium, bis(cyclopentadienyl)bis[2,6-difluoro-3-(N-isobutyl-(4-toluyl)amino)phenyl]titanium, bis(cyclopentadienyl)bis[2,6-difluoro-3-(N-isobutylbenzoylamino)phenyl]titanium, bis(cyclopentadienyl)bis[2,6-difluoro-3-(N-cyclohexylmethylpivaloylamino)phenyl]titanium, bis(cyclopentadienyl)bis[2,6-difluoro-3-(N-(oxolan-2-ylmethyl)benzoylamino)phenyl]titanium, bis(cyclopentadienyl)bis[2,6-difluoro-3-(N-(3-ethylheptyl)-2,2-dimethylbutanoylamino)phenyl]titanium, bis(cyclopentadienyl)bis[2,6-difluoro-3-(N-(3-phenylpropyl-(4-toluyl)amino)phenyl]titanium, bis(cyclopentadienyl)bis[2,6-difluoro-3-(N-(oxoran-2-ylmethyl)-(4-toluyl)amino)phenyl]titanium, bis(cyclopentadienyl)bis[2,6-difluoro-3-(N-(4-toluylmethyl)benzoylamino)phenyl]titanium, bis(cyclopentadienyl)bis[2,6-difluoro-3-(N-(4-toluylmethyl)-(4-toluyl)amino)phenyl]titanium, bis(cyclopentadienyl)bis[2,6-difluoro-3-(N-(butylbenzoylamino)phenyl]titanium, bis(cyclopentadienyl)bis[2,6-difluoro-3-(N-(butyl-(4-toluyl)amino)phenyl]titanium, bis(cyclopentadienyl)bis[2,6-difluoro-3-(N-(hexyl-(4-toluyl)amino)phenyl]titanium, bis(cyclopentadienyl)bis[2,6-difluoro-3-(N-(2,4-dimethylpentyl)-2,2-dimethylbutanoylamino)phenyl]titanium, bis(cyclopentadienyl)bis[2,6-difluoro-3-(2,4-dimethylpentyl)-2,2-dimethylpentanoylamino)phenyl]titanium, bis(cyclopentadienyl)bis[2,6-difluoro-3-((4-toluyl)amino)phenyl]titanium, bis(cyclopentadienyl)bis[2,6-difluoro-3-(2,2-dimethylpentanoylamino)phenyl]titanium, bis(cyclopentadienyl)bis[2,6-difluoro-3-(2,2-dimethyl-3-ethoxypropanoylamino)phenyl]titanium, bis(cyclopentadienyl)bis[2,6-difluoro-3-(2,2-dimethyl-3-allyloxypropanoylamino)phenyl]titanium, bis(cyclopentadienyl)bis[2,6-difluoro-3-(N-allylacetylamino)phenyl]titanium, bis(cyclopentadienyl)bis[2,6-difluoro-3-(2-ethylbutanoylamino)phenyl]titanium, bis(cyclopentadienyl)bis[2,6-difluoro-3-(N-cyclohexylmethylbenzoylamino)phenyl]titanium, bis(cyclopentadienyl)bis[2,6-difluoro-3-(N-cyclohexylmethyl-(4-toluyl)amino)phenyl]titanium, bis(cyclopentadienyl)bis[2,6-difluoro-3-(N-2-ethylhexyl)benzoylamino)phenyl]titanium, bis(cyclopentadienyl)bis[2,6-difluoro-3-(N-isopropylbenzoylamino)phenyl]titanium, bis(cyclopentadienyl)bis[2,6-difluoro-3-(N-(3-phenylpropyl)-2,2-dimethylpentanoylamino)phenyl]titanium, bis(cyclopentadienyl)bis[2,6-difluoro-3-(N-hexylbenzoylamino)phenyl]titanium, bis(cyclopentadienyl)bis[2,6-difluoro-3-(N-cyclohexylmethyl-2,2-dimethylpentanoylamino)phenyl]titanium, bis(cyclopentadienyl)bis[2,6-difluoro-3-(N-butylbenzoylamino)phenyl]titanium, bis (cyclopentadienyl)bis[2,6-difluoro-3-(N-(2-ethylhexyl)-2,2-dimethylpentanoylamino)phenyl]titanium, bis(cyclopentadienyl)bis[2,6-difluoro-3-(N-hexyl-2,2-dimethylpentanoylamino)phenyl]titanium, bis(cyclopentadienyl)bis[2,6-difluoro-3-(N-isopropyl-2,2-dimethylpentanoylamino)phenyl]titanium, bis(cyclopentadienyl)bis[2,6-difluoro-3-(N-(3-phenylpropyl)pivaloylamino)phenyl]titanium, bis (cyclopentadienyl)bis [2,6-difluoro-3-(N-butyl-2,2-dimethylpentanoylamino)phenyl]titanium, bis(cyclopentadienyl)bis[2,6-difluoro-3-(N-(2-methoxyethyl)benzoylamino)phenyl]titanium, bis(cyclopentadienyl)bis[2,6-difluoro-3-(N-benzylbenzoylamino)phenyl]titanium, bis(cyclopentadienyl)bis[2,6-difluoro-3-(N-benzyl-(4-toluyl)amino)phenyl]titanium, bis(cyclopentadienyl)bis[2,6-difluoro-3-(N-(2-methoxyethyl)-(4-toluyl)amino)phenyl]titanium, bis(cyclopentadienyl)bis[2,6-difluoro-3-(N-(4-methylphenylmethyl)-2,2-dimethylpentanoylamino)phenyl]titanium, bis(cyclopentadienyl)bis[2,6-difluoro-3-(N-(2-methoxyethyl)-2,2-dimethylpentanoylamino)phenyl]titanium, bis(cyclopentadienyl)bis[2,6-difluoro-3-(N-cyclohexylmethyl-(2-ethyl-2-methylheptanoyl)amino)phenyl]titanium, bis(cyclopentadienyl)bis[2,6-difluoro-3-(N-butyl-(4-chlorobenzoyl)amino)phenyl]titanium, bis(cyclopentadienyl)bis[2,6-difluoro-3-(N-hexyl-(2-ethyl-2-methylbutanoylamino)phenyl]titanium, bis(cyclopentadienyl)bis[2,6-difluoro-3-(N-cyclohexyl-2,2-dimethylpentanoylamino)phenyl]titanium, bis(cyclopentadienyl)bis[2,6-difluoro-3-(N-(oxoran-2-ylmethyl)-2,2-dimethylpentanoylamino)phenyl]titanium, bis(cyclopentadienyl)bis[2,6-difluoro-3-(N-cyclohexyl-(4-chlorobenzoyl)amino)phenyl]titanium, bis(cyclopentadienyl)bis[2,6-difluoro-3-(N-cyclohexyl-(2-chorobenzoylamino)phenyl]titanium, bis(cyclopentadienyl)bis[2,6-difluoro-3-(3,3-dimethyl-2,2-azetidinon-1-yl)phenyl]titanium, bis(cyclopentadienyl)bis(2,6-difluoro-3-isocyanaophenyl)titanium, bis(cyclopentadienyl)bis[2,6-difluoro-3-(N-ethyl-(4-tolylsulfonyl)amino)phenyl]titanium, bis(cyclopentadienyl)bis[2,6-difluoro-3-(N-hexyl-(4-tolylsulfonyl)amino)phenyl]titanium, bis(cyclopentadienyl)bis[2,6-difluoro-3-(N-butyl-(4-tolylsulfonyl)amino)phenyl]titanium, bis(cyclopentadienyl)bis[2,6-difluoro-3-(N-isobutyl-(4-tolylsulfonyl)amino)phenyl]titanium, bis(cyclopentadienyl)bis[2,6-difluoro-3-(N-butyl-(2,2-dimethyl-3-chloropropanoyl)amino)phenyl]titanium, bis(cyclopentadienyl)bis[2,6-difluoro-3-(N-(3-phenylpropyl)-2,2-dimethyl-3-choropropanoyl)amino)phenyl]titanium, bis(cyclopentadienyl)bis[2,6-difluoro-3-(N-cyclohexylmethyl-(2,2-dimethyl-3-choropropanoyl)amino)phenyl]titanium, bis(cyclopentadienyl)bis[2,6-difluoro-3-(N-isobutyl-(2,2-dimethyl-3-choropropanoyl)amino)phenyl]titanium, bis(cyclopentadienyl)bis[2,6-difluoro-3-(N-butyl-(2-chloromethyl-2-methyl-3-choropropanoyl)amino)phenyl]titanium, bis(cyclopentadienyl)bis[2,6-difluoro-3-(butylthiocarbonylamino)phenyl]titanium, bis(cyclopentadienyl)bis[2,6-difluoro-3-(phenylthiocarbonylamino)phenyl]titanium, bis(methylcyclopentadienyl)bis[2,6-difluoro-3-(N-hexyl-2,2-dimethylbutanoylamino)phenyl]titanium, bis(methylcyclopentadienyl)bis[2,6-difluoro-3-(N-hexyl-2,2-dimethylpentanoylamino)phenyl]titanium, bis(methylcyclopentadienyl)bis[2,6-difluoro-3-(N-ethylacetylamino)phenyl]titanium, bis(methylcyclopentadienyl)bis[2,6-difluoro-3-(N-ethylpropionylamino)phenyl]titanium, bis(trimethylsilylpentadienyl)bis[2,6-difluoro-3-(N-butyl-2,2-dimethylpropanoylamino)phenyl]titanium, bis(cyclopentadienyl)bis[2,6-difluoro-3-(N-(2-methoxyethyl)trimethylsilylamino)phenyl]titanium, bis(cyclopentadienyl)bis[2,6-difluoro-3-(N-butylhexyldimethylsilylamino)phenyl]titanium, bis(cyclopentadienyl)bis[2,6-difluoro-3-(N-ethyl-(1,1,2-tolylmethylpropyl)dimethylsilylamino)phenyl]titanium, bis(cyclopentadienyl)bis[2,6-difluoro-3-(3-ethoxymethyl-3-methyl-2-azetiodinon-1-yl)phenyl]titanium, bis(cyclopentadienyl)bis[2,6-difluoro-3-(3-allyloxymethyl-3-methyl-2-azetidinon-1-yl)phenyl]titanium, bis(cyclopentadienyl)bis[2,6-difluoro-3-(3-chloromethyl-3-methyl-2-azetidinon-1-yl)phenyl]titanium, bis(cyclopentadienyl)bis[2,6-difluoro-3-(N-benzyl-2,2-dimethylpropanoylamino)phenyl]titanium, bis(cyclopentadienyl)bis[2,6-difluoro-3-(5,5-dimethyl-2-pyrrolidinon-1-yl)phenyl]titanium, bis(cyclopentadienyl)bis[2,6-difluoro-3-(6,6-diphenyl-2-piperidinon-1-yl)phenyl]titanium, bis(cyclopentadienyl)bis[2,6-difluoro-3-(N-2,3-dihydro-1,2-benzinethiazolo-3-one-(1,1-dioxido)-2-yl)phenyl]titanium, bis(cyclopentadienyl)bis[2,6-difluoro-3-(N-hexyl-(4-chlorobenzoyl)amino)phenyl]titanium, bis(cyclopentadienyl)bis[2,6-difluoro-3-(N-hexyl-(2-chlorobenzoyl)amino)phenyl]titanium, bis(cyclopentadienyl)bis[2,6-difluoro-3-(N-isopropyl-(4-chlorobenzoyl)amino)phenyl]titanium, bis(cyclopentadienyl)bis[2,6-difluoro-3-(N-(4-methylphenylmethyl)-(4-chlorobenzoyl)amino)phenyl]titanium, bis(cyclopentadienyl)bis[2,6-difluoro-3-(N-(4-methylphenylmethyl)-(2-chlorobenzoyl)amino)phenyl]titanium, bis(cyclopentadienyl)bis[2,6-difluoro-3-(N-butyl-(4-chlorobenzoyl)amino)phenyl]titanium, bis(cyclopentadienyl)bis[2,6-difluoro-3-(N-benzyl-2,2-dimethylpentanoylamino)phenyl]titanium, bis(cyclopentadienyl)bis[2,6-difluoro-3-(N-(2-ethylhexyl)-4-tolylsulfonyl)amino)phenyl]titanium, bis(cyclopentadienyl)bis[2,6-difluoro-3-(N-(3-oxaheptyl)benzoylamino)phenyl]titanium, bis(cyclopentadienyl)bis[2,6-difluoro-3-(N-(3,6-dioxadecyl)benzoylamino)phenyl]titanium, bis(cyclopentadienyl)bis[2,6-difluoro-3-(trifluoromethylsulfonylamino)phenyl]titanium, bis(cyclopentadienyl)bis[2,6-difluoro-3-(trifluoroacetylamino)phenyl]titanium, bis(cyclopentadienyl)bis[2,6-difluoro-3-(2-chlorobenzoylamino)phenyl]titanium, bis(cyclopentadienyl)bis[2,6-difluoro-3-(4-chlorobenzoylamino)phenyl]titanium, bis(cyclopentadienyl)bis[2,6-difluoro-3-(N-(3,6-dioxadecyl)-2,2-dimethylpentanoylamino)phenyl]titanium, bis(cyclopentadienyl)bis[2,6-difluoro-3-(N-(3,7-dimethyl-7-methoxyoctyl)benzoylamino)phenyl]titanium, and bis(cyclopentadienyl)bis[2,6-difluoro-3-(N-cyclohexylbenzoylamino)phenyl]titanium, More preferred examples of the radical activator in the component iii) of the present invention are (j) the compound having a carbon-halogen bond and (k) the metallocene compound, and most preferred example is the titanocene compound.

The radical activators in the component iii) for use in the present invention are suitably used individually or in combination of two or more thereof.

The iii) photopolymerization initiation system for use in the present invention may contain, if desired, a sensitizing dye as component A). As the scan exposure light source at present, a visible ray laser having a wavelength of from 400 to 700 nm is superior and accordingly, a visible ray sensitizing dye is preferably added. A preferred example of the visible ray sensitizing dye is the compound represented by formula (A-1):

(A-1)

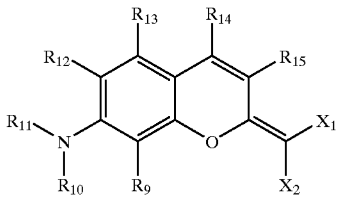

wherein $R_9$ to $R_{13}$ each independently represents a hydrogen atom, a halogen atom, an alkyl group, a substituted alkyl group, an aryl group, a substituted aryl group, an alkenyl group, a substituted alkenyl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group, a nitro group or a silyl group, and $R_9$ and $R_{10}$ or $R_{11}$ and $R_{12}$ may form a ring comprising a nonmetallic atom together with the carbon atoms to which $R_9$ and $R_{10}$ or $R_{11}$ and $R_{12}$ are bonded; $R_{14}$ and $R_{15}$ each independently represents a hydrogen atom, a halogen atom, an alkyl group, a substituted alkyl group, an aryl group, a substituted aryl group, an alkenyl group, a substituted alkenyl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group, a nitro group, a silyl group or a heterocyclic group, and $R_{13}$ and $R_{14}$ or $R_{14}$ and $R_{15}$ may form a ring comprising a nonmetallic atom together with the carbon atoms to which $R_{13}$ and $R_{14}$ or $R_{14}$ and $R_{15}$ are bonded; and $X_1$ and $X_2$ each represents a cyano group or a substituted carbonyl group, and $X_1$ and $X_2$ may be combined to each other to form a ring.

The alkyl group includes a linear, branched or cyclic alkyl group having from 1 to 20 carbon atoms and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group and 2-norbornyl group. Among these, a linear alkyl group having from 1 to 12 carbon atoms, a branched alkyl group having from 3 to 12 carbon atoms and a cyclic alkyl group having from 5 to 10 carbon atoms are more preferred.

As the substituent of the substituted alkyl group, a group comprising a monovalent nonmetallic atom group excluding a hydrogen atom is used, and preferred examples thereof include a halogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugate base group thereof (hereinafter referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and a conjugate base group thereof (hereinafter referred to as a phosphonato group), a dialkylphosphono group (—$PO_3$(alkyl)$_2$, wherein alkyl is an alkyl group, hereinafter the same), a diarylphosphono group (—$PO_3$(aryl)$_2$, wherein aryl is an aryl group, hereinafter the same), an alkylarylphosphono group (—$PO_3$(alkyl) (aryl)), a monoalkylphosphono group (—$PO_3$ (alkyl)) and a conjugate base group thereof (hereinafter referred to as an alkylphosphonato group), a monoarylphosphono group (—$PO_3H$(aryl)) and a conjugate base group thereof (hereinafter referred to as an aryl phosphonato group), a phosphonooxy group (—$OPO_3H_2$) and a conjugate base group thereof (hereinafter referred to as a phosphonatooxy group), a dialkylphosphonooxy group (—$OPO_3H$(alkyl)$_2$), a diarylphosphonooxy group (—$OPO_3$ (aryl)$_2$), an alkylarylphosphonooxy group (—$OPO_3$(alkyl) (aryl)), a monoalkylphosphonooxy group (—$OPO_3H$(alkyl)) and a conjugate base group thereof (hereinafter referred to as an alkylphosphonatooxy group), a monoarylphosphonooxy group (—$OPO_3H$(aryl)) and a conjugate base group thereof (hereinafter referred to as an arylphosphonatooxy group), a cyano group, a nitro group, an aryl group, an alkenyl group, an alkynyl group, a heterocyclic group and a silyl group.

Specific examples of the alkyl group in these substituents include the above-described alkyl groups and specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a cyanophenyl group, a sulfophenyl group, a sulfonatophenyl group, a phosphonophenyl group and a phosphonatophenyl group.

Examples of the alkenyl group include a vinyl group, a 1-propenyl group, a 1-butenyl group, a cinnamyl group and a 2-chloro-1-ethenyl group and examples of the alkynyl group include an ethynyl group, a 1-propynyl group, a 1-butynyl group and a trimethylsilylethynyl group.

$R_{01}$ in the acyl group ($R_{01}CO$—) includes a hydrogen atom and the above-described alkyl and aryl groups. Among these substituents, preferred are a halogen atom (—F, —Br, —Cl, —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkyphosphono group, a diarylphosphono group, a monoalkylphosphono group, an alkylphosphonato group, a monoarylphosphono group, an arylphosphonato group, a phosphonooxy group, a phosphonatooxy group, an aryl group and an alkenyl group.

The heterocyclic group includes a pyridyl group and a piperazinyl group.

The silyl group includes a trimethylsilyl group.

The alkylene group in the substituted alkyl group is a divalent organic residue resulting from eliminating any one of hydrogen atoms on the above-described alkyl group having from 1 to 20 carbon atoms, preferably a linear alkylene group having from 1 to 12 carbon atoms, a branched alkylene group having from 3 to 12 carbon atoms or a cyclic alkylene group having from 5 to 10 carbon atoms. Specific preferred examples of the substituted alkyl group obtained by combining a substituent and the alkylene group include a chloromethyl group, a bromomethyl group, a 2-chloroethyl group, a trifluoromethyl group, a methoxymethyl group, an isopropoxymethyl group, a butoxymethyl group, an s-butoxybutyl group, a methoxyethoxyethyl group, an allyloxymethyl group, a phenoxymethyl group, a methylthiomethyl group, a tolylthiomethyl group, a pyridylmethyl group, a tetramethylpiperidinylmethyl group, an N-acetyltetramethylpiperidinylmethyl group, a trimethylsilylmethyl group, a methoxyethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

The aryl group includes a condensed ring formed from 1 to 3 benzene rings and a condensed ring formed from a benzene ring and a 5-membered unsaturated ring. Specific examples thereof include a phenyl group, a naphthyl group, an anthryl group, a phenanthryl group, an indenyl group, an acenaphthenyl group and a fluorenyl group, with the phenyl group and the naphthyl group being preferred.

The substituted aryl group includes the above-described aryl groups having a group comprising a monovalent nonmetallic atom group exclusive of hydrogen, as a substituent on the ring-forming carbon atoms. Preferred examples of the substituent include the above-described alkyl groups, substituted alkyl groups and substituents of the substituted alkyl group. Specific preferred examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyl-oxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethylphenyl group, 2-butenylphenyl group, a 2-methylallylphenyl group, a 2-methylpropenylphenyl group, a 2-propenylphenyl group, a 2-butynylphenyl group and a 3-butynylphenyl group.

The alkenyl group, the substituted alkenyl group, the alkynyl group and the substituted alkynyl group (—C($R_{02}$)=C ($R_{03}$) ($R_{04}$) and —C≡C($R_{05}$)) which can be used include those where $R_{02}$, $R_{03}$, $R_{04}$ and $R_{05}$ each is a group comprising a monovalent nonmetallic atom group. Preferred examples of $R_{02}$, $R_{03}$, $R_{04}$ and $R_{05}$ include a hydrogen atom, a halogen atom, an alkyl group, a substituted alkyl group, an aryl group and a substituted aryl group and specific examples thereof include those described above. The groups $R_{02}$, $R_{03}$, $R_{04}$ and $R_{05}$ each is preferably- a hydrogen atom, a halogen atom or a linear, branched or cyclic alkyl group having from 1 to 10 carbon atoms. Specific preferred examples of the alkenyl group, the substituted alkenyl group, the alkynyl group and the substituted alkynyl group include a vinyl group, 1-propenyl group, a 1-butenyl group, a 1-pentenyl group, a 1-hexenyl group, a 1-octenyl group, a 1-methyl-1-propenyl group, a 2-methyl-1-propenyl group, a 2-methyl-1-butenyl group, a 2-phenyl-1-ethenyl group, a 2-chloro-1-ethenyl group, an ethynyl group, a 1-propynyl group, 1-butynyl group and a phenylethynyl group.

The substituted oxy group ($R_{06}O$—) which can be used includes those where $R_{06}$ is a group comprising a monovalent nonmetallic atom- group exclusive of hydrogen. Preferred examples of the substituted oxy group include an alkoxy group, an aryloxy group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonooxy group and a phosphonatooxy group. The alkyl group and the aryl group in these groups include those described above as the alkyl group and the substituted alkyl group and those as the aryl group and the substituted aryl group, respectively. The acyl group ($R_{07}CO$—) in the acyloxy group includes those where $R_{07}$ is the alkyl group, substituted alkyl group, aryl group or substituted aryl group described above for $R_1$ to $R_7$. Among those substituents, an alkoxy group, an aryloxy group, an acyloxy group and an arylsulfoxy group are preferred. Specific preferred examples of the substituted oxy group include a methoxy group, an ethoxy group, a propyloxy group, an isopropyloxy group, a butyloxy group, a pentyloxy group, a hexyloxy group, a dodecyloxy group, a benzyloxy group, an allyloxy group, a phenethyloxy group, a carboxyethyloxy group, a methoxycarbonylethyloxy group, an ethoxy-carbonylethyloxy group, a methoxyethoxy group, a phenoxyethoxy group, a methoxyethoxyethoxy group, an ethoxyethoxyethoxy group, a morpholinoethoxy group, a morpholinopropyloxy group, an allyloxyethoxyethoxy group, a phenoxy group, a tolyloxy group, a xylyloxy group, a mesityloxy group, a cumenyloxy group, a methoxyphenyloxy group, an ethoxyphenyloxy group, a chlorophenyloxy group, a bromophenyloxy group, an acetyloxy group, a benzoyloxy group, a naphthyloxy group, a phenylsulfonyloxy group, a phosphonooxy group and a phosphonatooxy group.

The substituted amino group including an amido group ($R_{08}NH$—, ($R_{09}$) ($R_{010}$)N—), which can be used, includes those where $R_{08}$, $R_{09}$ and $R_{010}$ each is a group comprising a monovalent nonmetallic atom group exclusive of hydrogen. $R_{09}$ and $R_{010}$ may be combined to form a ring. Preferred examples of the substituted amino group include an N-alkylamino group, an N,N-dialkylamino group, an N-arylamino group, an N,N-diarylamino group, an N-alkyl-N-arylamino group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N'-alkyl-N'-arylureido group, an N',N'-dialkyl-N-alkylureido group, an N',N'-dialkyl-N'-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group and an N-aryl-N-aryloxycarbonylamino group. The alkyl group and the aryl group in these groups include those described above as the alkyl group and the substituted alkyl group and those as the aryl group and the substituted aryl group, respectively. $R_{07}$ of the acyl group ($R_{07}CO$—) in the acylamino group, the N-alkylacylamino group and the N-arylacylamino group is the same as described above. Among these, an N-alkylamino group, an N,N-dialkylamino group, an N-arylamino group and an acylamino group are more preferred. Specific preferred examples of the substituted amino group include a methylamino group, an ethylamino group, a diethylamino group, a morpholino group, a piperidino group, a pyrrolidino group, a phenylamino group, a benzoylamino group and an acetylamino group.

The substituted sulfonyl group ($R_{011}$—$SO_2$—) include those where $R_{011}$ is a group comprising a monovalent nonmetallic atom group. More preferred examples thereof are an alkylsulfonyl group and an arylsulfonyl group. The alkyl group and the aryl group in these groups include those described above as the alkyl group and the substituted alkyl group and those as the aryl group and the substituted aryl group, respectively. Specific examples of the substituted sulfonyl group include a butylsulfonyl group and a chlorophenylsulfonyl group.

The heterocyclic group represented by $R_1$ or $R_2$ includes a pyridyl group and the like described above as the substituent of the substituted alkyl group.

The sulfonato group (—$SO_3^-$) means a conjugate base anion group of a sulfo group (—$SO_3H$) as described above and in usual, this group is preferably used in combination with a counter cation. Examples of the counter cation include commonly known cations, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

The substituted thio group ($R_{012}S$—) which can be includes those where $R_{012}$ is a monovalent nonmetallic atom group exclusive of hydrogen. Preferred examples of the substituted thio group include an alkylthio group, an arylthio group, an alkyldithio group, an aryldithio group and an acylthio group. The alkyl group and the aryl group in these groups include those described above as the alkyl group and the substituted alkyl group and those as the aryl group and the substituted aryl group, respectively. $R_{07}$ of the acyl group ($R_{07}CO$—) in the acylthio group is the same as described above. Among those, an alkylthio group and an arylthio group are more preferred. Specific preferred examples of the substituted thio group include a methylthio group, an ethylthio group, a phenylthio group, an ethoxyethylthio group, a carboxyethylthio group and a methoxycarbonylthio group.

The substituted carbonyl group ($R_{013}$—CO—) which can be used includes those where $R_{013}$ is a group comprising a monovalent nonmetallic atom group. Preferred examples of the substituted carbonyl group include a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group and an N-alkyl-N'-arylcarbamoyl group. The alkyl group and the aryl group in these groups include those described above as the alkyl group and the substituted alkyl group and those as the aryl group and the substituted aryl group, respectively. Among those substituted carbonyl groups, a formyl group, an acyl group, a carboxyl group, an alkoxycarbonyl group, an aryloxycarbonyl group, a carbamoyl group, an N-alkylcarbamoyl group, an N,N-dialkylcarbamoyl group and an N-arylcarbamoyl group are more preferred, and a formyl group, an acyl group, an alkoxycarbonyl group and an aryloxycarbonyl group are still more preferred. Specific preferred examples of the substituted carbonyl group include a formyl group, an acetyl group, a benzoyl group, a carboxyl group, a methoxycarbonyl group, an ethoxycarbonyl group, an allyloxycarbonyl group, a dimethylaminophenylcarbonyl group, a methoxycarbonylmethoxycarbonyl group, an N-methylcarbamoyl group, an N-phenylcarbamoyl group, an N,N-diethylcarbamoyl group and a morpholinocarbonyl group.

The substituted sulfinyl group ($R_{014}$—SO—) which can be used includes those where $R_{014}$ is a group comprising a monovalent nonmetallic atom group. Preferred examples thereof include an alkylsulfinyl group, an arylsulfinyl group, a sulfinamoyl group, an N-alkylsulfinamoyl group, an N,N-dialkylsulfinamoyl group, an N-arylsulfinamoyl group, an N,N-diarylsulfinamoyl group and an N-alkyl-N-arylsulfinamoyl group. The alkyl group and the aryl group in these groups include those described above as the alkyl group and the substituted alkyl group and those as the aryl group and the substituted aryl group, respectively. Among these, an alkylsulfinyl group and an arylsulfinyl group are more preferred. Specific examples of the substituted sulfinyl group include a hexylsulfinyl group, a benzylsulfinyl group and a tolylsulfinyl group.

The substituted phosphono group means a phosphono group on which one or two hydroxyl groups is(are) displaced by another organic oxo group. Preferred examples thereof include a dialkylphosphono group, a diarylphosphono group, an alkylarylphosphono group, a monoalkylphosphono group and a monoarylphosphono group. Among these, a dialkylphosphono group and a diarylphosphono group are preferred. Specific examples thereof include a diethylphosphono group, a dibutylphosphono group and a diphenylphosphono group.

The phosphonato group ($—PO_3^{2-}$, $—PO_3H^-$) means a conjugate base anion group derived from acid first dissociation or acid second dissociation of a phosphono group ($—PO_3H_2$) as described above. In usual, this group is preferably used in combination with a counter cation, Examples of the counter cation include commonly known cations, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

The substituted phosphonato group is a conjugate base anion group of the above-described substituted phosphono groups where one hydroxyl group is displaced by an organic oxo group. Specific examples thereof include a conjugate base of a monoalkylphosphono group ($—PO_3H$(alkyl)) and a conjugate base of a monoarylphosphono group ($—PO_3H$(aryl)).

The heterocyclic group represented by $R_{14}$ or $R_{15}$ includes a 5- or 6-membered heterocyclic group which may have a condensed ring. Specific examples thereof include a benzothiazolyl group, a benzimidazolyl group and a 2,5-dioxo-3-pyrrolinyl group.

$R_9$ and $R_{10}$ or $R_{11}$ and $R_{12}$ may be combined to form a ring and the ring formed is preferably a 5- or 6-membered alicyclic ring. These rings may further be condensed to each other.

$R_{13}$ and $R_{14}$ or $R_{14}$ and $R_{15}$ may be combined to form a ring and the ring formed is preferably a 5- or 6-membered alicyclic ring.

$R_9$, $R_{12}$ and $R_{13}$ each is preferably a hydrogen atom.

$R_{10}$ and $R_{11}$ each is preferably a hydrogen atom or an alkyl group.

$R_{14}$ and $R_{15}$ each is preferably a hydrogen atom, an alkyl group, a halogen-substituted alkyl group, a hydroxyl group, a cyano group, an alkenyl group, an aryl group, a heterocyclic group, a substituted oxy group or a substituted carbonyl group. More preferably, $R_{14}$ is a hydrogen atom, an alkyl group or a substituted oxy group and $R_{15}$ is a hydrogen atom.

$X_1$ and $X_2$ are preferably combined to form a ring and the ring formed is preferably a cyclic ketone.

Specific examples of the sensitizing dye as the component A) are set forth below, however, the present invention is by no means limited thereto.

(D-1)

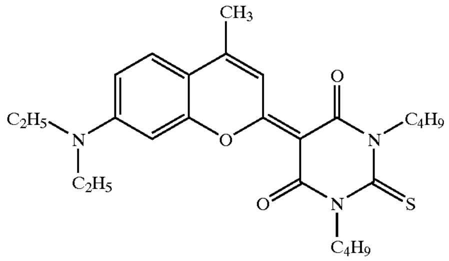

(D-2)

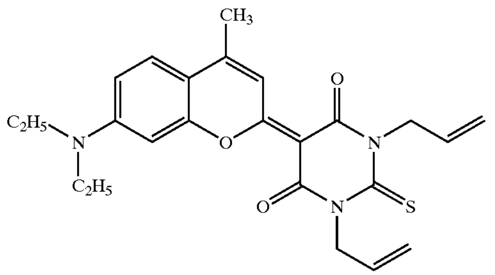

(D-3)

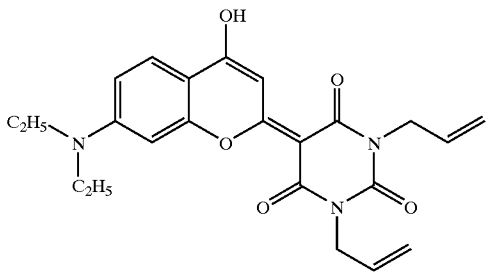

(D-4)

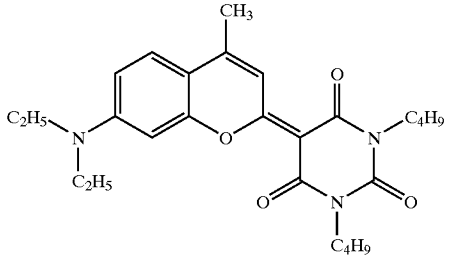

-continued
(D-5)
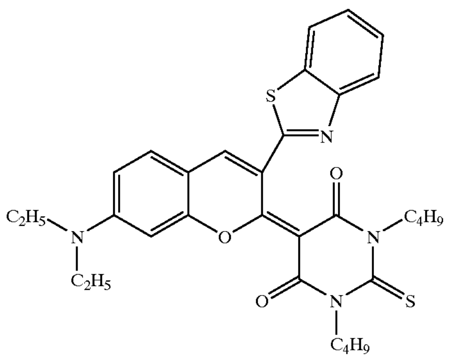
(D-6)
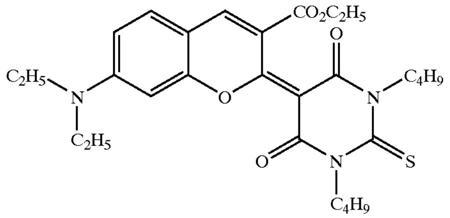
(D-7)
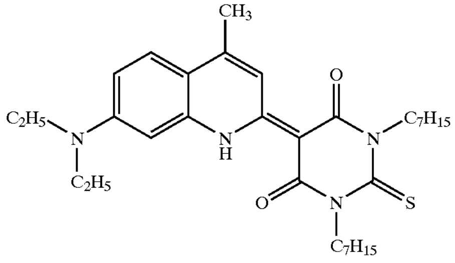
(D-8)
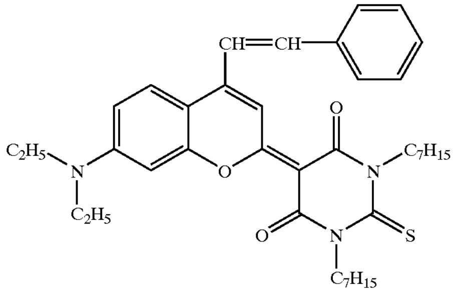
(D-9)
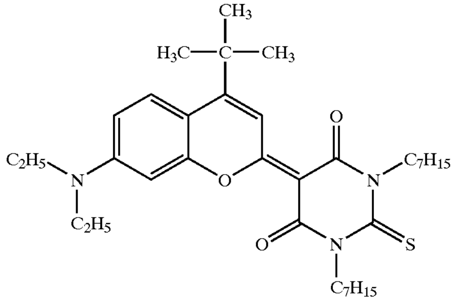
-continued
(D-10)
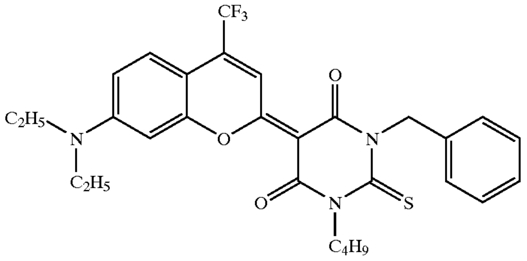
(D-11)
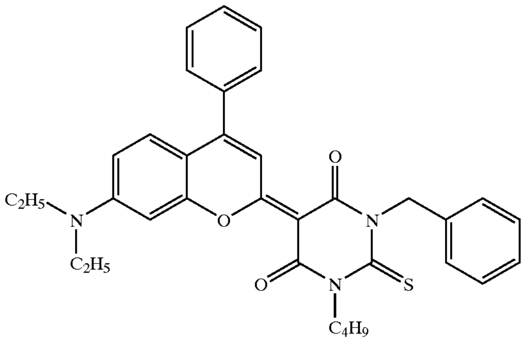
(D-12)
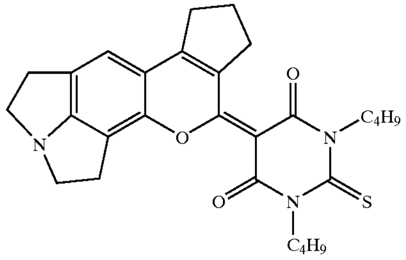
(D-13)
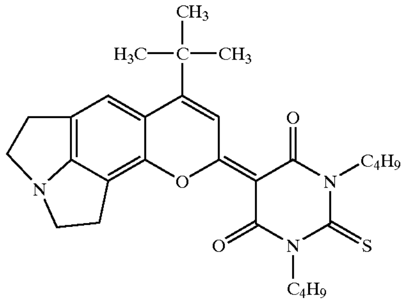
(D-14)
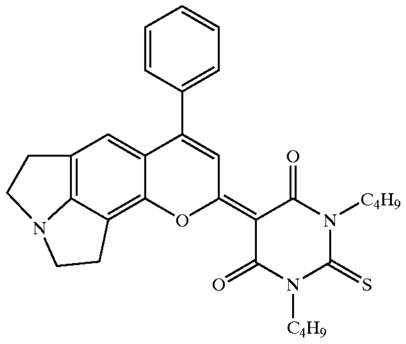

-continued
(D-15)
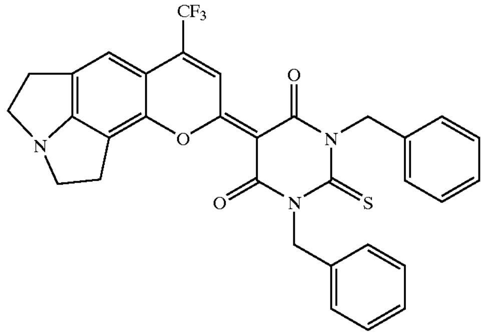
(D-16)
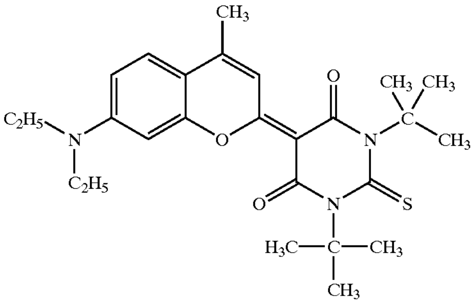
(D-17)
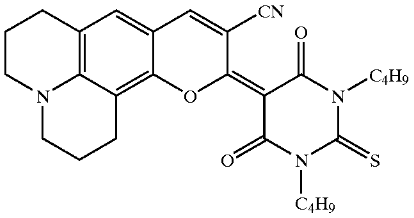
(D-18)
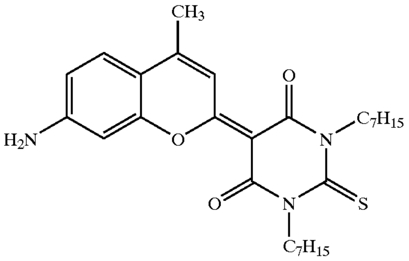
(D-19)
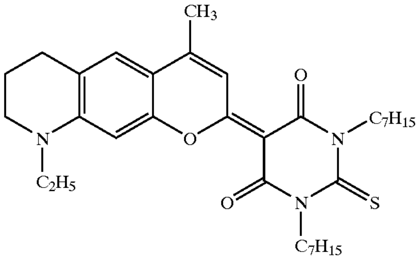
-continued
(D-20)
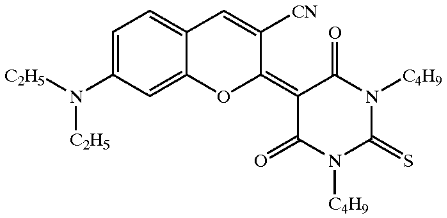
(D-21)
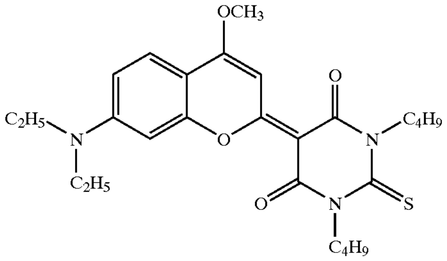
(D-22)
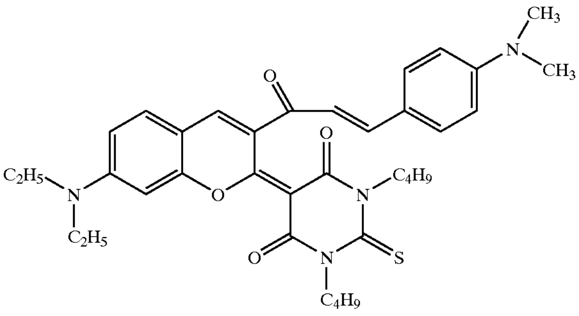
(D-23)
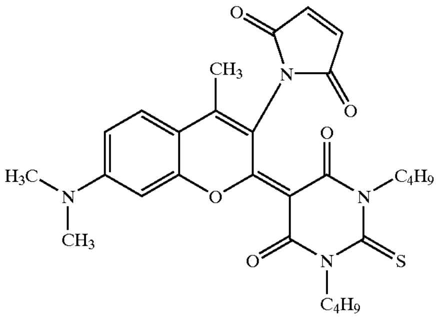
(D-24)
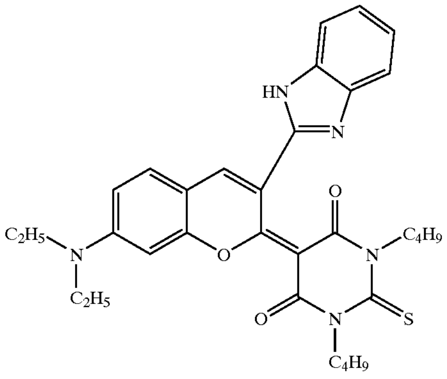

-continued (D-25)

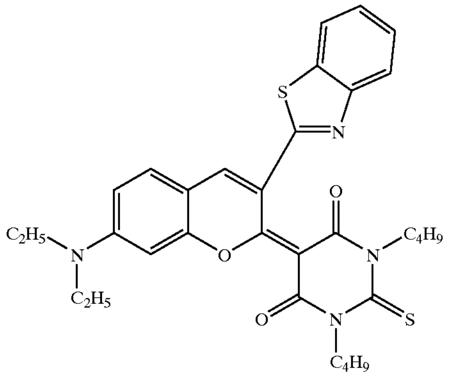

(D-26)

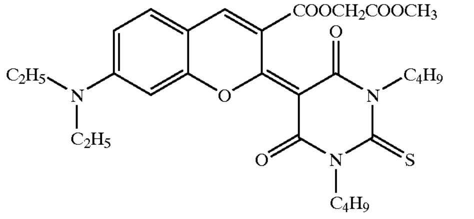

(D-27)

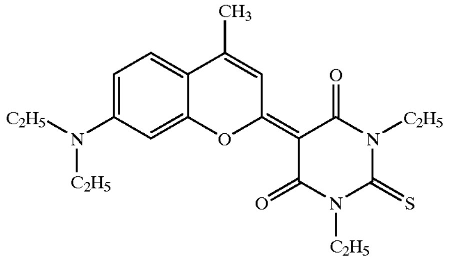

Other preferred examples of the sensitizing dye as the component A) include:

polynuclear aromatic compounds (e.g., pyrene, perylene, triphenylene);

xanthenes (e.g., fluorescein, eosine, erythrosine, Rhodamine B, Rose Bengal);

cyanines (e.g., thiacarbocyanine, oxacarbocyanine);

merocyanines (e.g., merocyanine, carbomerocyanine);

thiazines (e.g., thionine, methylene blue, toluidine blue);

acridines (e.g., Acridine orange, chloroflavin, acriflavine);

phthalocyanines (e.g., phthalocyanine, metallophthalocyanine);

porphyrins (e.g., tetraphenyl porphyrin, metal porphyrin);

chlorophylls (e.g., chlorophyll, chlorophyllin, center metal-substituted chlorophyll);

metal complexes such as

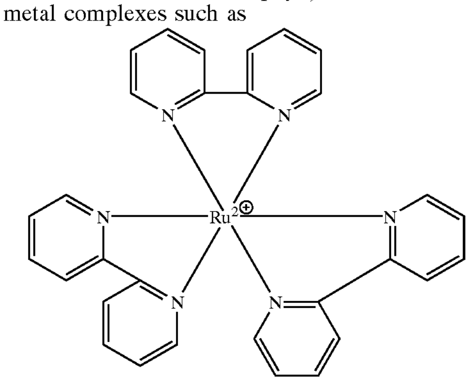

anthraquinones (e.g., anthraquinone); and squaliums (e.g., squalium).

More preferred examples of the sensitizing dye as the component A) include the styryl-based dyes described in JP-B-37-13034, such as

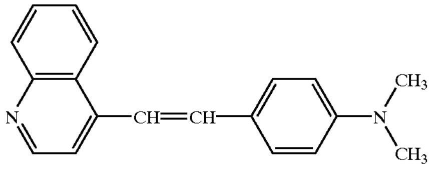

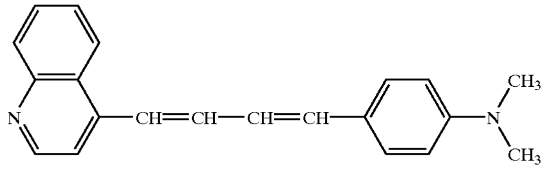

Another example includes the cation dyes described in JP-A-62-143044, such as

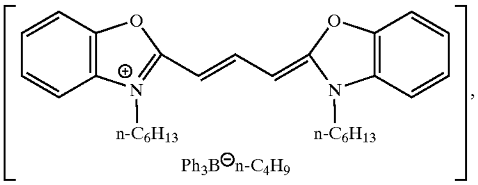

,

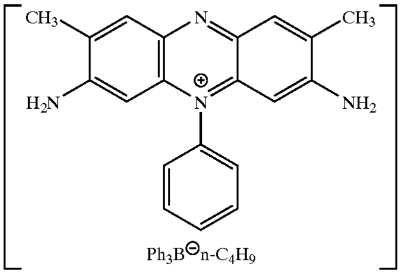

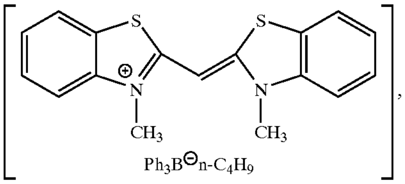

,

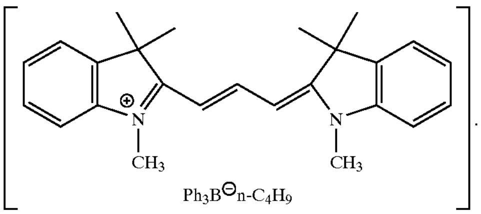

.

Another example includes the quinoxalium salts described in JP-B-59-24147, such as

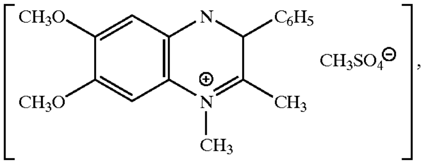
,
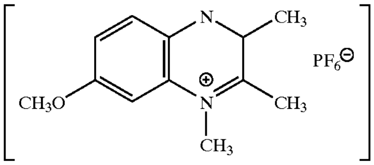
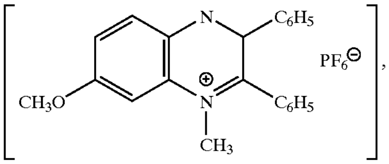
,
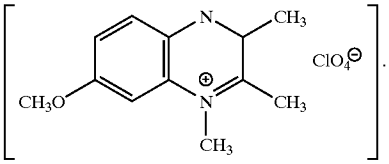
.
Another example includes the new Methylene Blue compounds described in JP-A-64-33104, such as
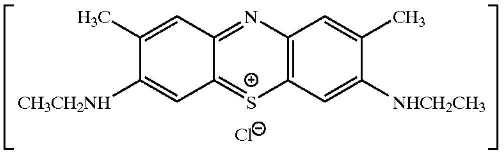
Another example includes the anthraquinones described in JP-A-64-56767, such as
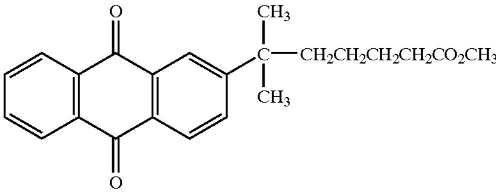
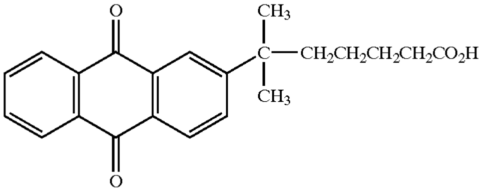
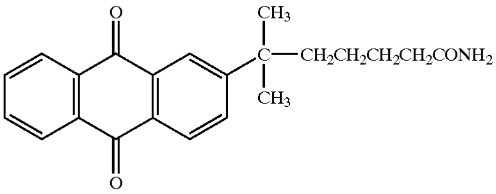
Other examples include the benzoxanthene dyes described in JP-A-2-1714, and acridines described in JP-A-2-226148 and JP-A-2-226149, such as
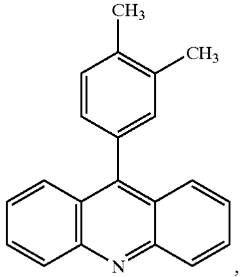
,
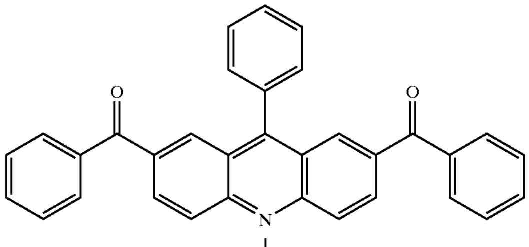
,
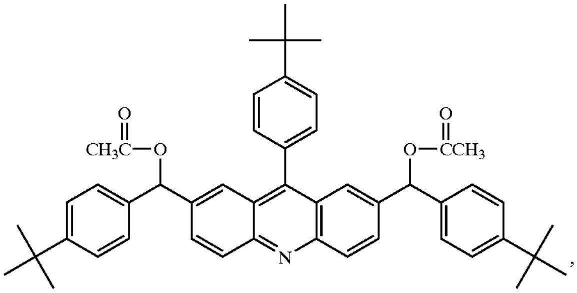
,
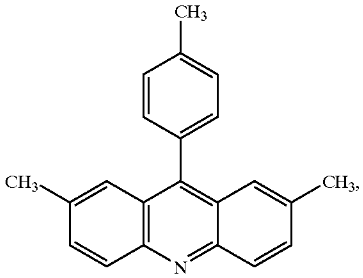
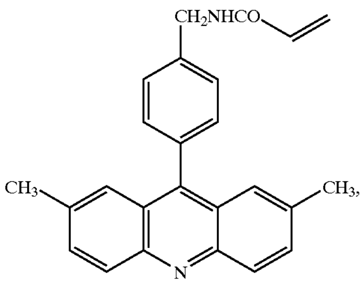
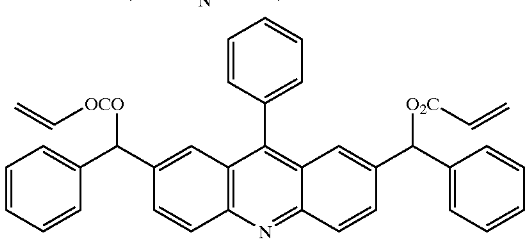
.
Still another example includes the pyrylium salts described in JP-B-40-28499, such as

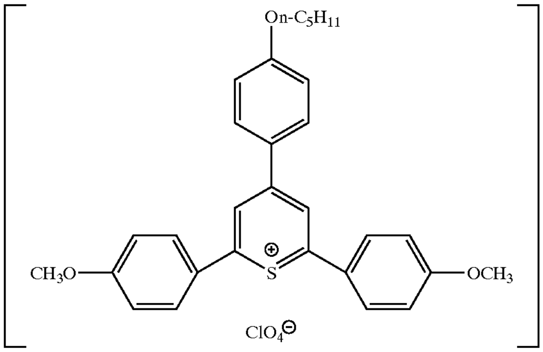
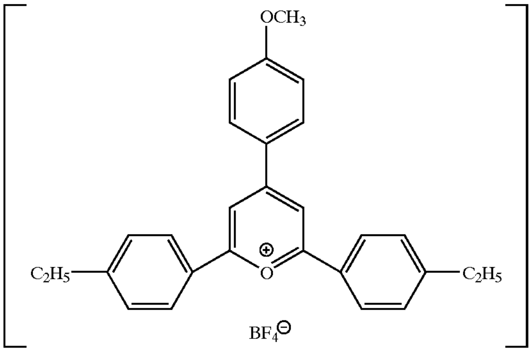
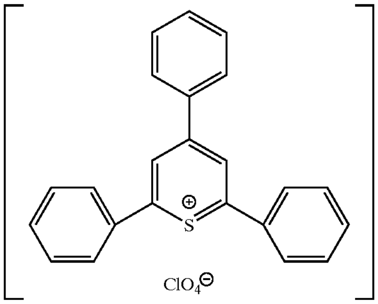
Still another example includes the cyanines described in JP-B-46-42363, such as
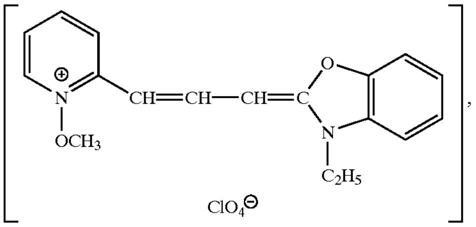
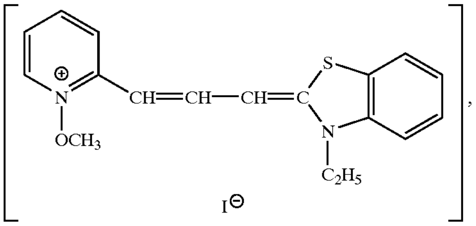
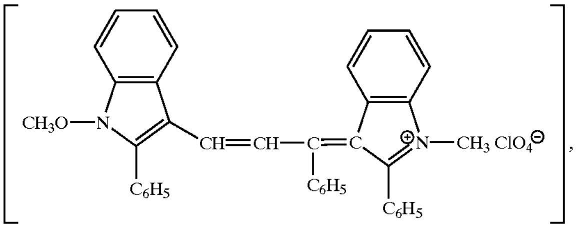
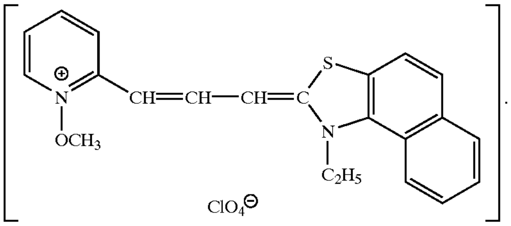
Still another example includes the benzofurane dyes described in JP-A-2-63053, such as
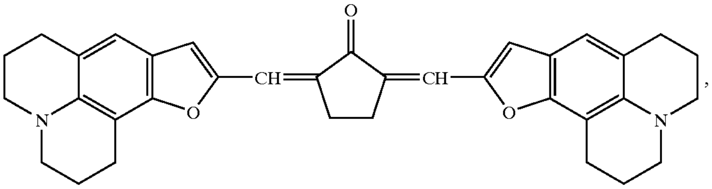
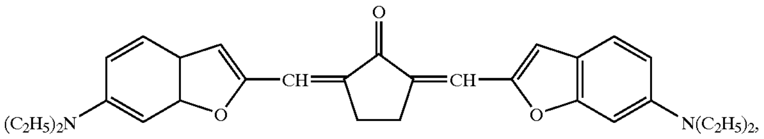
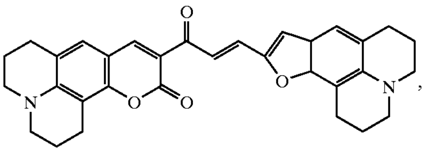
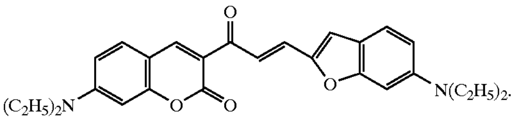

Still another example includes the conjugated ketone dyes described in JP-A-2-85858 and JP-A-2-216154, such as

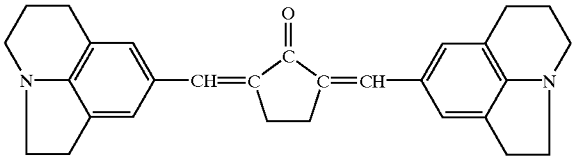

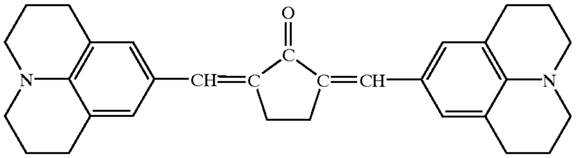

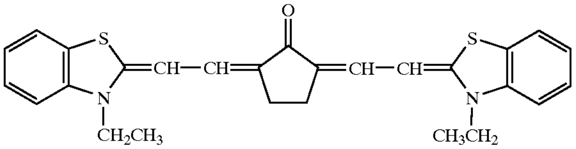

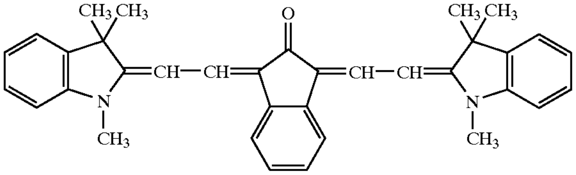

Other examples are the dyes described in JP-A-57-10605, and azocinnamylidene derivatives described in JP-B-2-30321, such as

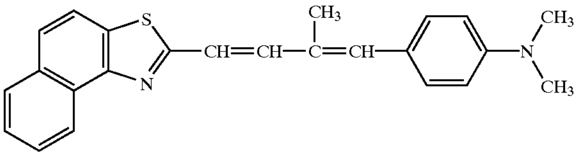

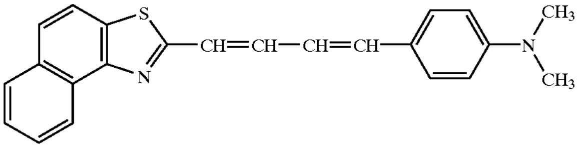

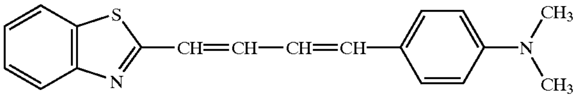

Another example includes the cyanine-based dyes described in JP-A-1-287105, such as

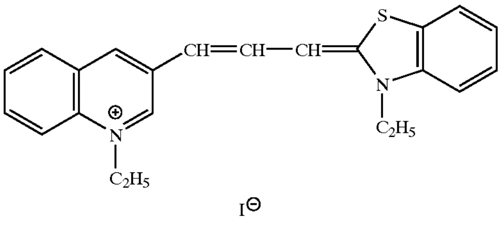

-continued

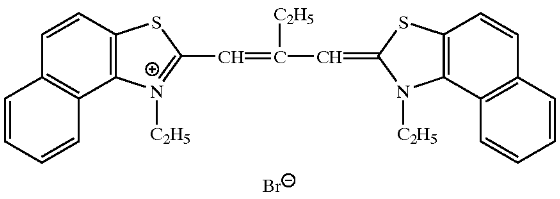

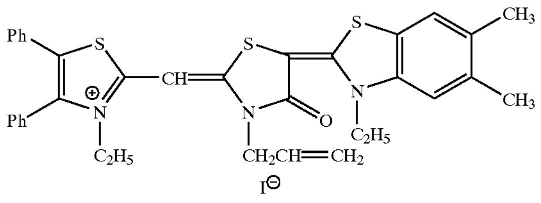

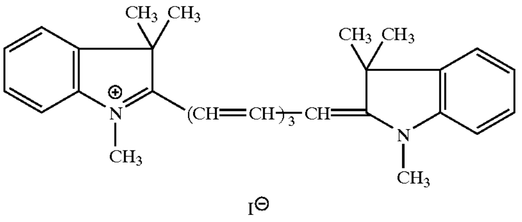

Another example includes the xanthene-based dyes described in JP-A-62-31844, JP-A-62-31848 and JP-A-62-143043, such as

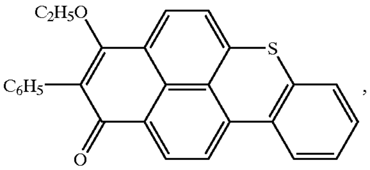

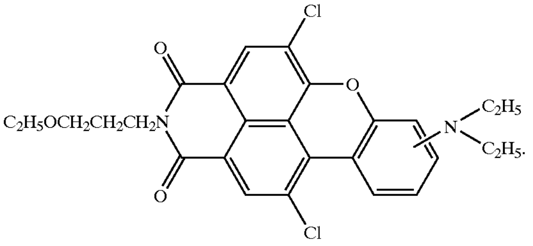

Another example includes the aminostyryl ketones described in JP-B-59-28325, such as

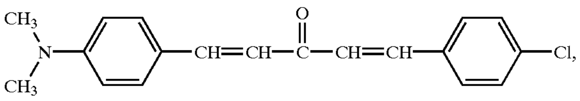

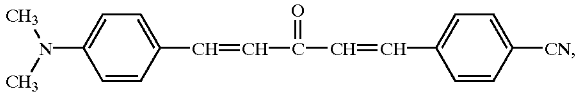

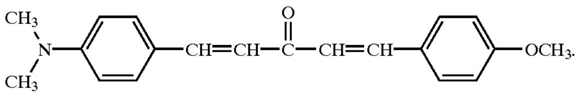

Another example includes the merocyanine dyes represented by the following formulae (A-2) to (A-9) described in JP-B-61-9621:

(A-2)

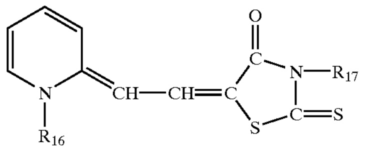

(A-3)

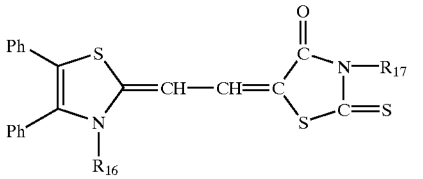

(A-4)

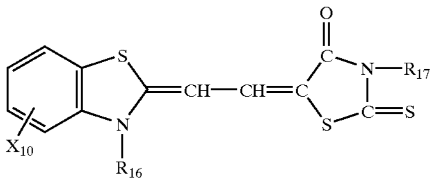

(A-5)

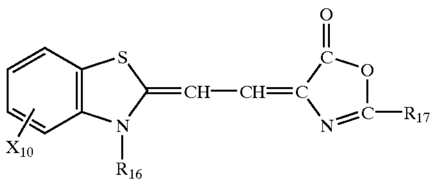

(A-6)

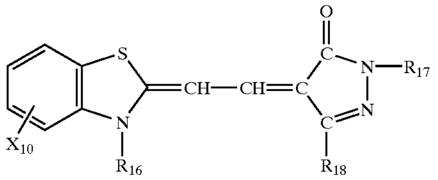

(A-7)

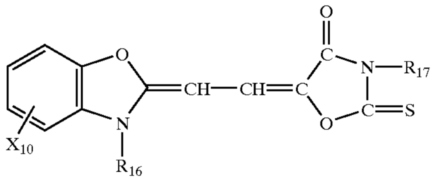

(A-8)

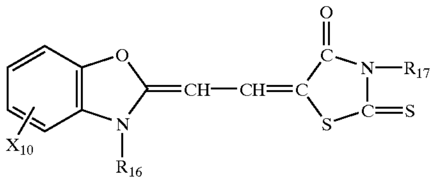

(A-9)

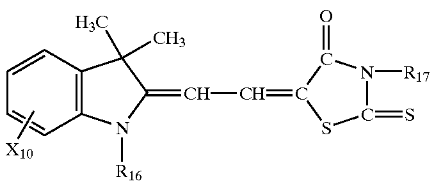

wherein in formulae (A-4) to (A-9), $X_{10}$ represents a hydrogen atom, an alkyl group, a substituted alkyl group, an alkoxy group, an aryl group, a substituted aryl group, an aryloxy group, an aralkyl group or a halogen atom; in formula (A-3), Ph represents a phenyl group; and in formulae (A-2) to (A-9), $R_{16}$, $R_{17}$ and $R_{18}$, which may be the same or different, each represents an alkyl group, a substituted alkyl group, an alkenyl group, an aryl group, a substituted aryl group or an aralkyl group.

Another example includes the merocyanine dyes represented by the following formulae (A-10) to (A-12) described in JP-A-2-179643:

(A-10)

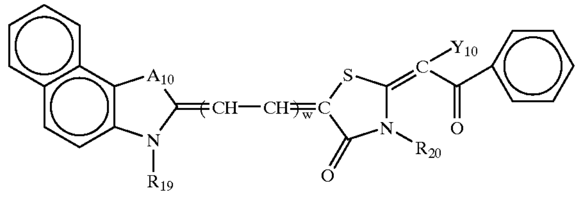

(A-11)

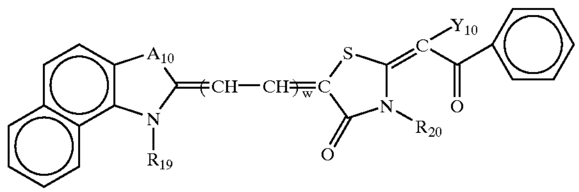

(A-12)

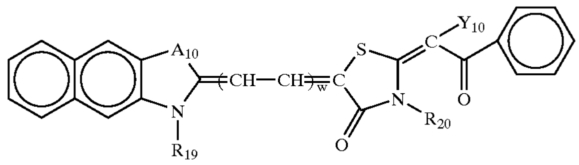

wherein $A_{10}$ represents an oxygen atom, a sulfur atom, a selenium atom, a tellurium atom, an alkyl- or aryl-substituted nitrogen atom or a dialkyl-substituted carbon atoms, $Y_{10}$ represents a hydrogen atom, an alkyl group, a substituted alkyl group, an aryl group, a substituted aryl group, an aralkyl group, an acyl group or a substituted alkoxycarbonyl group, $R_{19}$ and $R_{20}$ each represents a hydrogen atom, an alkyl group having from 1 to 18 carbon atoms or a substituted alkyl group having from 1 to 18 carbon atoms substituted by a halogen atom (e.g., F, Cl, Br, I), $R_{21}O$—, —$(CH_2CH_2O)_x$—$R_{21}$ or the following group:

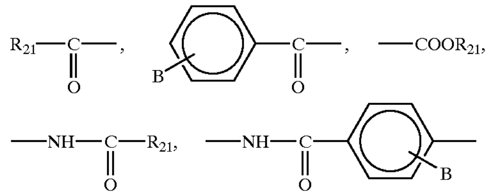

wherein $R_{21}$ represents a hydrogen atom or an alkyl group having from 1 to 10 carbon atoms, and B represents a dialkylamino group, a hydroxyl group, an acyloxy group, a halogen atom or a nitro group), and w represents an integer of from 0 to 4, and x represents an integer of from 1 to 20.

Another example includes the merocyanine dyes represented by the following formula (A-13) described in JP-A-2-244050:

(A-13)

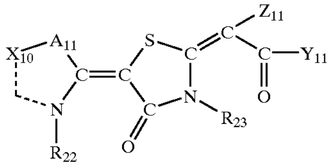

wherein $R_{22}$ and $R_{23}$ each independently represents a hydrogen atom, an alkyl group, a substituted alkyl group, an alkoxycarbonyl group, an aryl group, a substituted aryl group or an aralkyl group, $A_{11}$ represents an oxygen atom, a sulfur atom, a selenium atom, a tellurium atom, an alkyl- or aryl-substituted nitrogen atom or a dialkyl-substituted carbon atom, $X_{11}$ represents a nonmetallic atom group necessary for forming a 5-membered nitrogen-containing heterocyclic ring, $Y_{11}$ represents a substituted phenyl group, an unsubstituted or substituted polynuclear aromatic hydrocarbon group or an unsubstituted or substituted heteroaromatic ring, $Z_{11}$ represents a hydrogen atom, an alkyl group, a substituted alkyl group, an aryl group, a substituted aryl group, an aralkyl group, an alkoxy group, an alkylthio group, an arylthio group, a substituted amino group, an acyl group or an alkoxycarbonyl group, and $Z_{11}$ and $Y_{11}$ may be combined with each other to form a ring.

Specific preferred examples of the merocyanine dye represented by formula (A-13) are set forth below:

[化138]

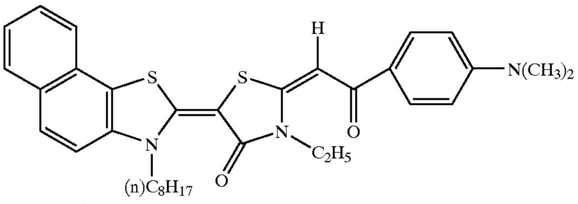

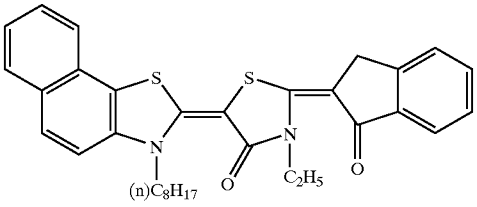

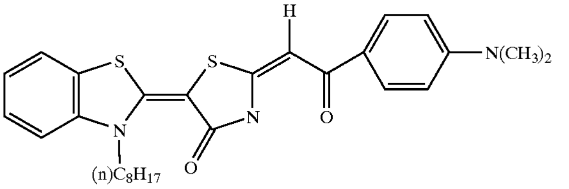

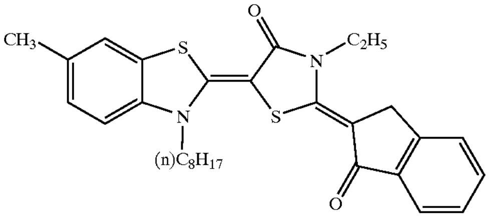

-continued

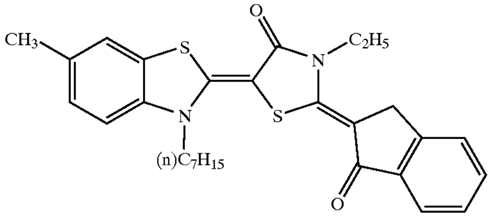

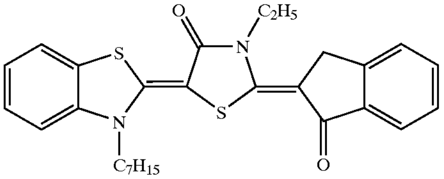

Still another example includes the merocyanine dyes represented by the following formula (A-14) described in JP-B-59-28326:

(A-14)

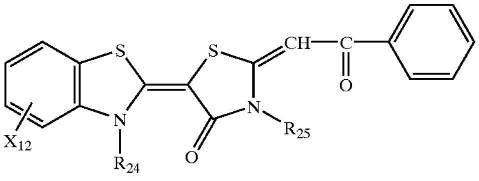

wherein $R_{24}$ and $R_{25}$, which may be the same or different, each represents a hydrogen atom, an alkyl group, a substituted alkyl group, an aryl group, a substituted aryl group or an aralkyl group, and $X_{12}$ represents a substituent having a Hammett's $\sigma$ value of from −0.9 to +0.5.

Still another example includes the merocyanine dyes represented by the following formula (A-15) described in JP-A-59-89303:

(A-15)

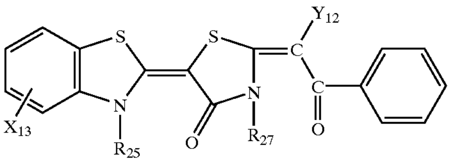

wherein $R_{26}$ and $R_{27}$ each independently represents a hydrogen atom, an alkyl group, a substituted alkyl group, an aryl group, a substituted aryl group or an aralkyl group, $X_{13}$ represents a substituent having a Hammett's $\sigma$ value of from −0.9 to +0.5, and $Y_{12}$ represents a hydrogen atom, an alkyl group, a substituted alkyl group, an aryl group, a substituted aryl group, an aralkyl group, an acyl group or an alkoxycarbonyl group.

Specific preferred examples of the merocyanine dye represented by formula (A-15) are set forth below:

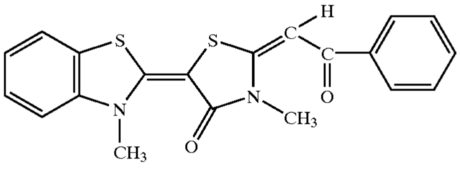

-continued

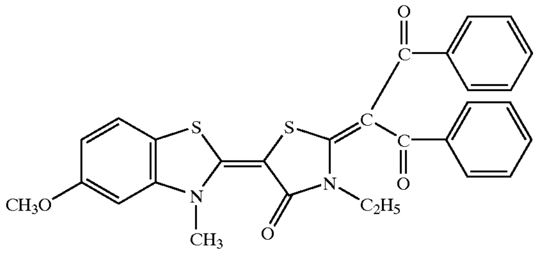

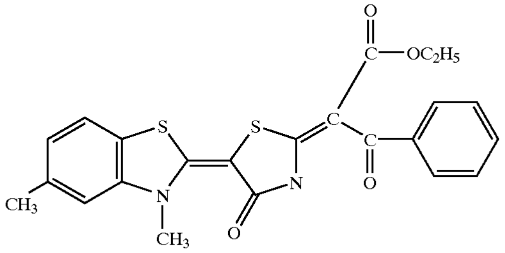

Another example includes the merocyanine dyes represented by the following formula (A-16) described in Japanese Patent Application No. 6-269047:

(A-16)

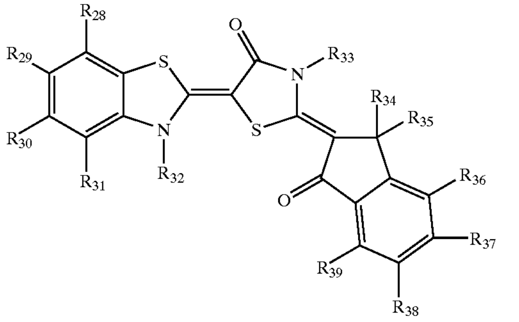

wherein $R_{28}$, $R_{29}$, $R_{30}$, $R_{31}$, $R_{36}$, $R_{37}$, $R_{38}$ and $R_{39}$ each independently represents a hydrogen atom, a halogen atom, an alkyl group, a substituted alkyl group, an aryl group, a substituted aryl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group or a nitro group, or $R_{28}$ and $R_{29}$, $R_{29}$ and $R_{30}$, $R_{30}$ and $R_{31}$, $R_{36}$ and $R_{37}$, $R_{37}$ and $R_{38}$ or $R_{38}$ and $R_{39}$ may be combined with each other to form an aliphatic or aromatic ring; $R_{32}$ represents a hydrogen atom, an alkyl group, a substituted alkyl group, an aryl group or a substituted aryl group; $R_{33}$ represents a substituted or unsubstituted alkenylalkyl group or a substituted or unsubstituted alkynylalkyl group; and $R_{34}$ and $R_{35}$ each independently represents a hydrogen atom, a halogen atom, an alkyl group, a substituted alkyl group, an aryl group, a substituted aryl group or a substituted carbonyl group.

Still more preferred examples of the sensitizing dye as the component A) for use in the present invention are the compound represented by formula (A-1) shown above, the merocyanine dyes described in JP-B-61-9621, the merocyanine dyes described in JP-A-2-179643, the merocyanine dyes described in JP-A-2-244050, the merocyanine dyes described in JP-B-59-28326, the merocyanine dyes described in JP-A-59-89303 and the merocyanine dyes described in Japanese Patent Application No. 6-269047. Among these, the compound represented by formula (A-1) is still more preferred.

The sensitizing dyes as the component A) for use in the present invention are suitably used individually or in combination of two or more thereof.

The sensitizing dye may be subjected to various chemical modification in order to improve the properties of the photosensitive layer. For example, the sensitizing dye may be bonded with an addition polymerizable compound structure (e.g., acryloyl group or methacryloyl group) by means of a covalent bond, an ionic bond, a hydrogen bond or the like, so that the exposed layer can have very high strength or the dye can be prevented from unnecessary deposition from the layer after the exposure. Also, by bonding the sensitizing dye with a titanocene compound which is described layer or other radical generating part (for example, a reduction decomposable moiety such as alkyl halide, onium, peroxide and biimidazole, or an oxidation cleavable moiety such as borate, amine, trimethylsilylmethyl, carboxymethyl, carbonyl and imine), the photosensitivity in the state where the initiation system is in a low concentration can be greatly increased. Furthermore, for the purpose of attaining adaptability for the processing with an (alkali) aqueous developer as a preferred use embodiment of the photosensitive layer according to the present invention, it is effective to introduce a hydrophilic moiety (an acid group or polar group such as a carboxyl group or an ester thereof, a sulfonic acid group or an ester thereof, and an ethylene oxide group). In particular, the ester-type hydrophilic group is advantageous in that the compatibility in the photosensitive layer is excellent because of its relatively hydrophobic structure, and the hydrophilicity increases in the developer due to generation of an acid group by the hydrolysis. In addition, an appropriate substituent may be introduced so as to improve the compatibility in the photosensitive layer or prevent the crystallization. For example, in a certain photosensitive system, an unsaturated bond such as an aryl group or an allyl group may be very effective in the improvement of- the compatibility, or the crystallization may be remarkably inhibited when a steric hindrance is interposed between the n planes of a dye by introducing a branched alkyl structure. Furthermore, by introducing a phosphonic acid group, an epoxy group or a trialkoxysi-lyl group, the adhesive-property to an inorganic substance such as a metal or a metal oxide may be improved. Also, formation of a sensitizing dye into a polymer or the like may be used according to the purpose.

The use form of the sensitizing dye can be freely selected according to the performance designed for the photosensitive material, similarly to the addition polymerizable compound described above. For example, by using two kinds of sensitizing dyes in combination, the compatibility with the photosensitive layer may be increased. In the selection of the sensitizing dye, the molar extinction coefficient at the emission wavelength of the light source used is an important factor in addition to the photosensitivity. By using dye having a large molar extinction coefficient, the amount of the dye added may be relatively reduced and this is profitable and advantageous in view of the physical properties of the photosensitive layer. The absorbance at the wavelength of the light source greatly affects on the photosensitivity and resolution of the photosensitive layer and on the physical properties of the exposed layer. Accordingly, the amount of the sensitizing dye added is appropriately selected taking account of these properties. For example, the sensitivity decreases in the region of low absorbance of 0.1 or less. Furthermore, low resolution results due to the effect of halation. However, the low absorbance is rather effective, for example, in order to cure a thick film of 5 μm or more. On the other hand, in the region of high absorbance of 3 or more, the light is mostly absorbed on the surface of the photosensitive layer and curing of the inner part may be inhibited, as a result, in the case of, for example, a printing plate, unsatisfactory layer strength or poor adhesion to the substrate results. When the composition is used for a lithographic printing plate having a relatively thin photosensitive layer, the amount of the sensitizing dye added is preferably selected such that the photosensitive layer has an absorbance of from 0.1 to 1.5, preferably from 0.25 to 1. In the case of a lithographic printing plate, this is usually from 0.05 to 30 parts by weight, preferably from 0.1 to 20 parts by weight, more preferably from 0.2 to 10 parts by weight, per 100 parts by weight of the photosensitive layer components.

The photopolymerizable composition in the photosensitive layer for use in the present invention may further contain a photopolymerization co-initiator as a component B) so as to improve the sensitivity. Examples Ewe thereof include halogenated hydrocarbon derivatives, ketone compounds, ketooxime compounds, organic peroxides, thio compounds, hexaarylbiimidazoles, aromatic onium salts and oxime ethers.

Of these, a system using an oxime ether compound is particularly preferred because it can provide good properties with respect to sensitivity, storability, adhesion of the coating to the substrate or the like.

Examples of the oxime ether compound which is suitably used in the present invention include the compound represented by the following formula (E):

(E)

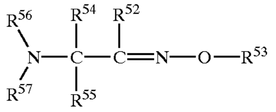

wherein $R^{52}$ and $R^{53}$, which may be the same or different, each represents a hydrocarbon group which may have a substituent or may contain an unsaturated bond, or a heterocyclic group;

$R^{54}$ and $R^{55}$, which may be the same or different, each represents a hydrogen atom, a hydrocarbon group which may have a substituent or may contain an unsaturated bond, a heterocyclic group, a hydroxyl group, a substituted oxy group, a mercapto group or a substituted thio group, and $R^{54}$ and $R^{55}$ may be bonded with each other to form a ring and represent an alkylene group having from 2 to 8 carbon atoms, which may contain —O—, —$NR^{56}$—, —O—CO—, —NH—CO—, —S— and/or —$SO_2$— on the linking main chain of the ring; and $R^{56}$ and $R^{57}$ each represents a hydrogen atom, a hydrocarbon group which may have a substituent or may contain an unsaturated bond, or a substituted carbonyl group.

Specific examples thereof include the following compounds described in JP-A-8-202035, however, the present invention is by no means limited thereto.

(III-1)

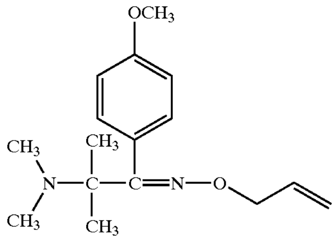

(III-2)

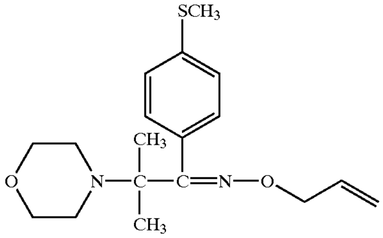

(III-3)

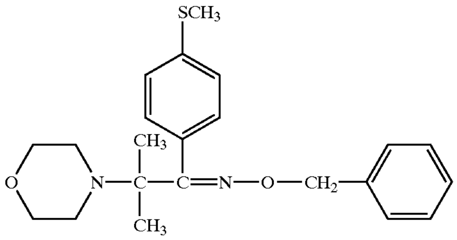

(III-4)

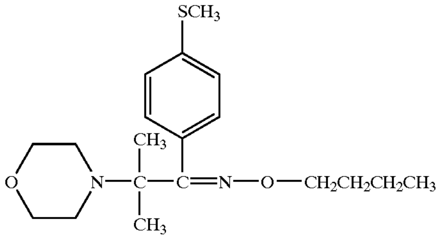

(III-5)

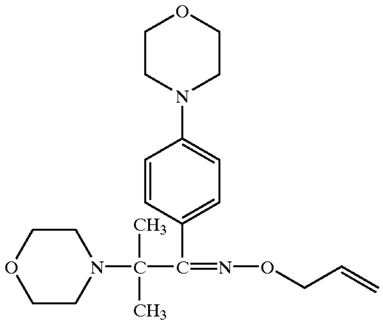

(III-6)

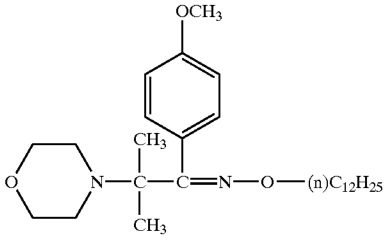

-continued (III-7)

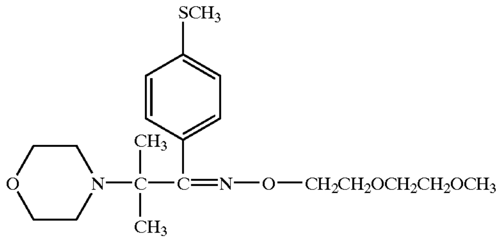

(III-8)

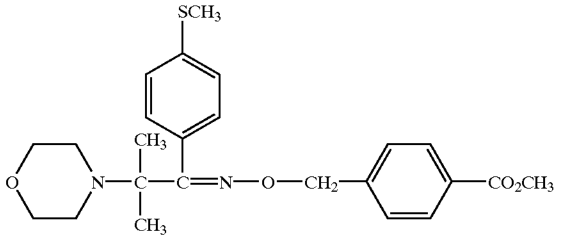

(III-9)

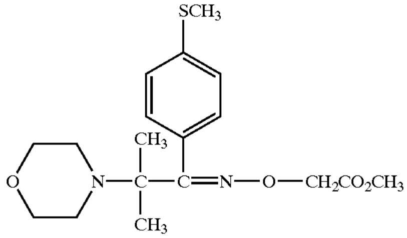

(III-10)

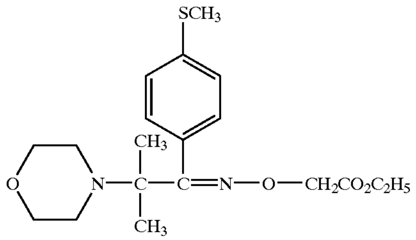

(III-11)

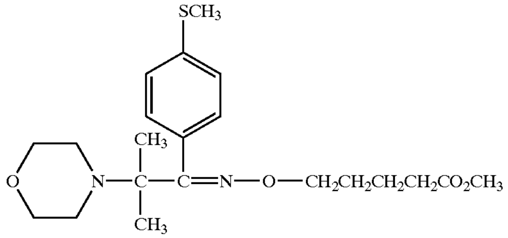

(III-12)

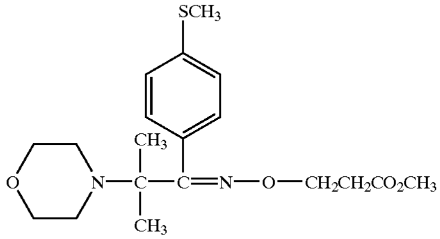

-continued (III-13)

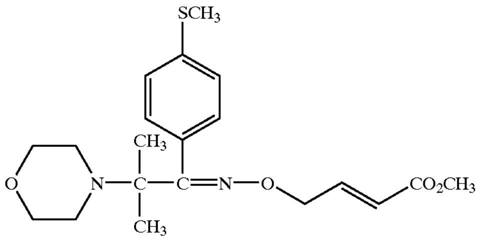

(III-14)

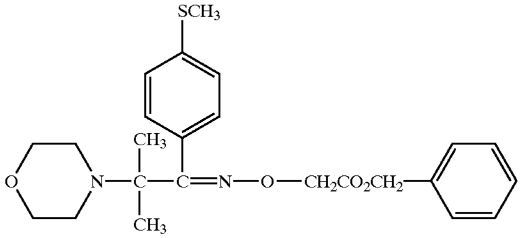

The oxime ether compound is more preferably a compound represented by the following formula (I):

(I)

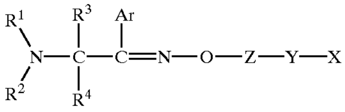

wherein $R^1$ to $R^4$ each represents an alkyl group or an aryl group, Ar represents an aryl group, $R^1$ and $R^2$ or $R^3$ and $R^4$ may be combined to each other to form a ring, Z represents a hydrocarbon-containing divalent linking group which may have a substituent, and Y represents a divalent linking group containing at least one of the following groups or a single bond:

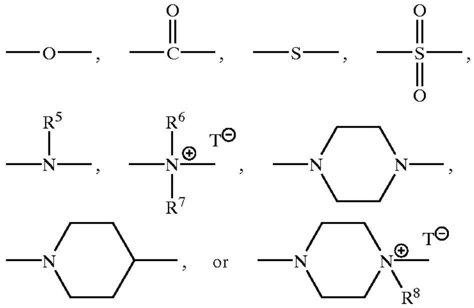

wherein $R^5$ represents a hydrogen atom, a hydrocarbon group which may have a substituent or may contain an unsaturated bond, a carbonyl group or a sulfonyl group; $R^5$ to $R^8$, which may be the same or different, each represents a hydrocarbon group which may have a substituent or may contain an unsaturated bond; $T^-$ represents a monovalent anion comprising a halogen atom or a monovalent sulfonate anion; and X represents a group having an addition polymerizable group represented by the following formula (I-a):

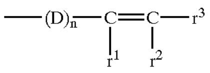

wherein D represents

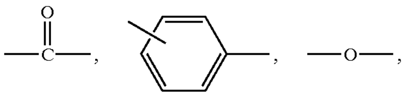

-continued (I-a)

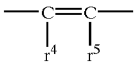

$r^1$ to $r^3$, which may be the same or different, each represents a hydrogen atom, a methyl group, an ethyl group, a phenyl group, a halogen atom, a cyano group or —C(=O)—$OR^9$; n represents 0 or 1, provided that when n is 0, $r^1$ to $r^3$ are not a hydrogen atom at the same time; $r^4$ and $r^5$, which may be the same or different, each represents a hydrogen atom, a methyl group, an ethyl group or a phenyl group; and $R^9$ represents an alkyl group or an aryl group.

Specific examples thereof include the following compounds described in Japanese Patent Application No. 9-40964, however, the present invention is by no means limited thereto.

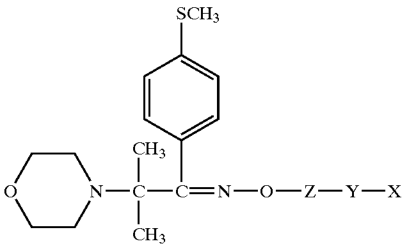

| Compound No. | Structure of -Z-Y-X |
|---|---|
| I-1 | 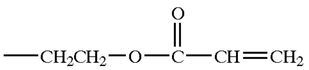 |
| I-2 | 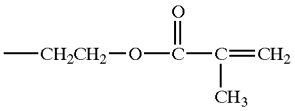 |
| I-3 | 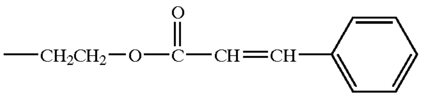 |
| I-4 | 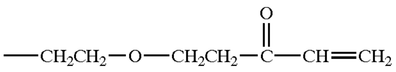 |
| I-5 | 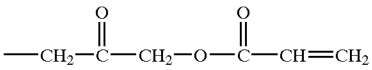 |
| I-6 | 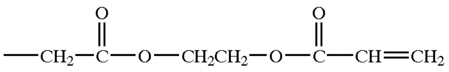 |
| I-7 | 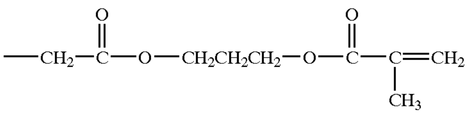 |
| I-8 | 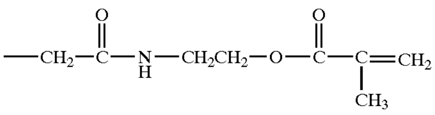 |

-continued
I-9
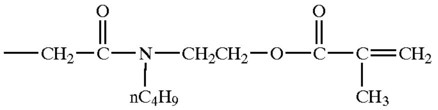
I-10
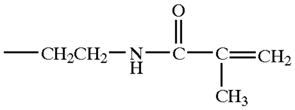
I-11
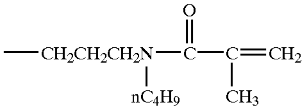
I-12
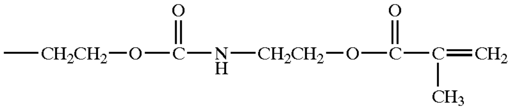
I-13
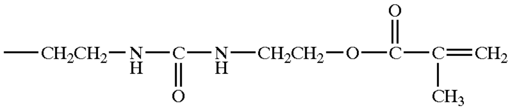
I-14
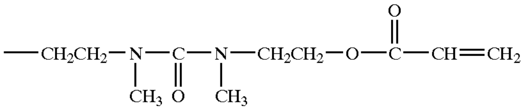
I-15
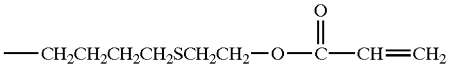
I-16
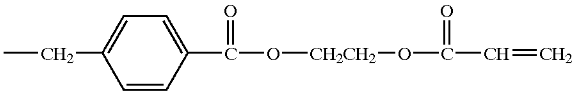
I-17
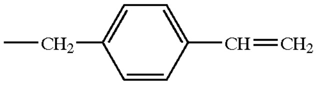
I-18
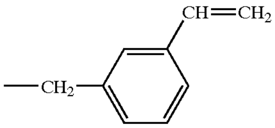
I-19
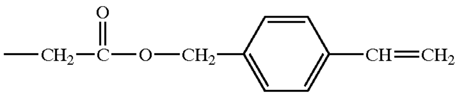
I-20
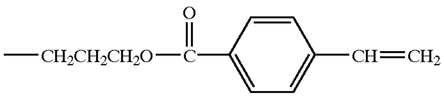
I-21
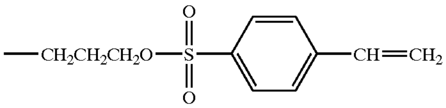

-continued
I-22
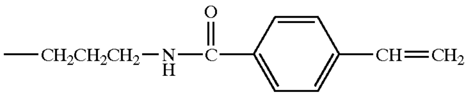
I-23
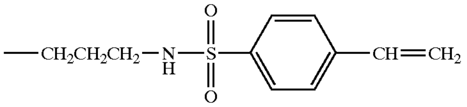
I-24
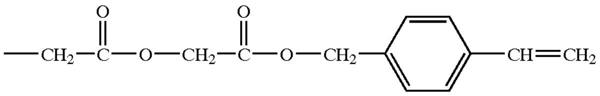
I-25
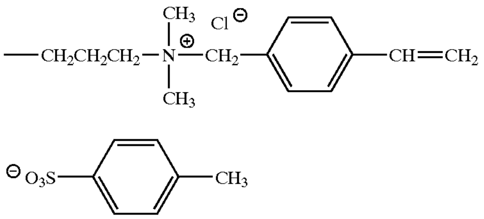
I-26
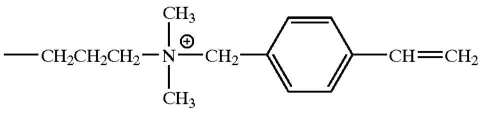
I-27
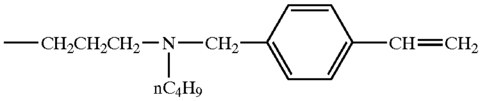
I-28
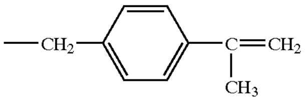
I-29
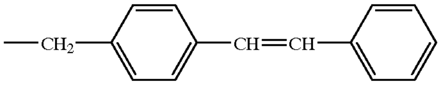
I-30
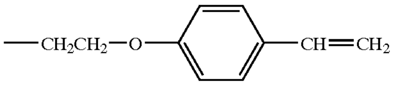
I-31
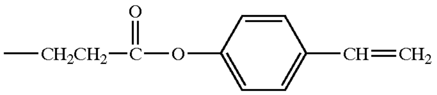
I-32
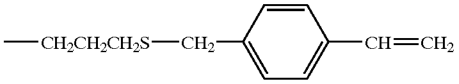
I-33
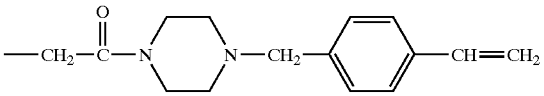
I-34
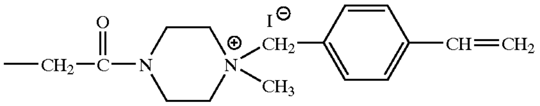

-continued
I-35
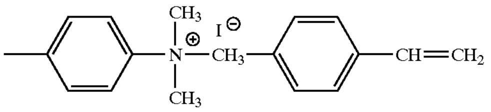
I-36
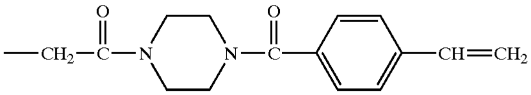
I-37
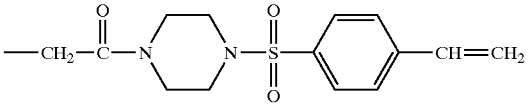
I-38 $-CH_2CH_2CH_2O-CH=CH_2$
I-39
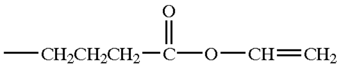
I-40
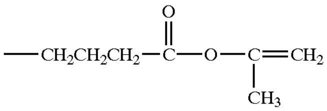
I-41
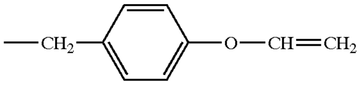
I-42
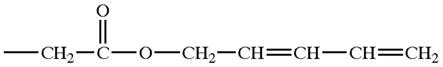
I-43
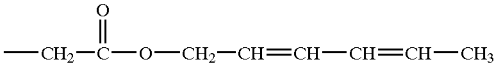
I-44 $-CH_2-CH=CH-CH=CH-CH_3$
I-45
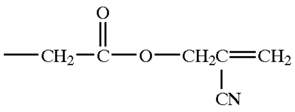
I-46
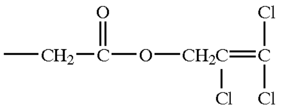
I-47
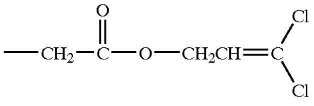
I-48
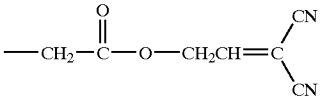
I-49
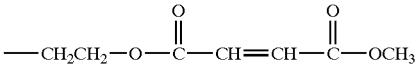
I-50
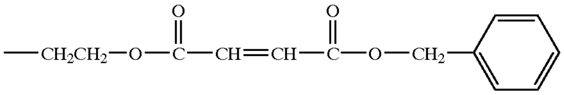

-continued
I-51
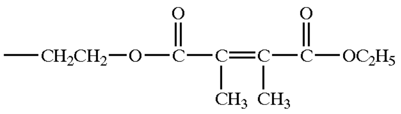
I-52
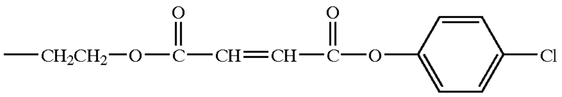
I-53
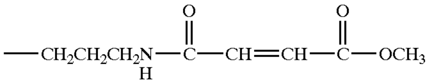
I-54
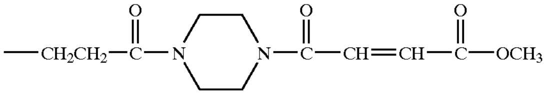
I-55
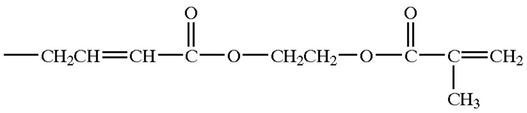
I-56
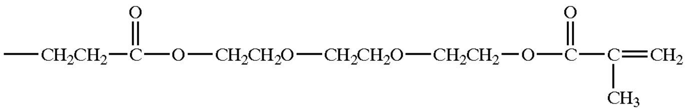
I-57
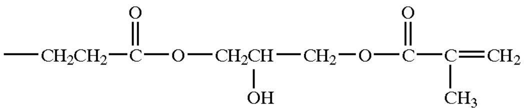
I-58
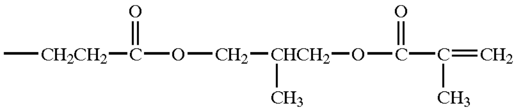
I-59
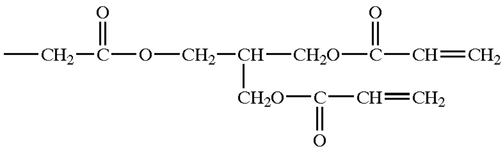
I-60
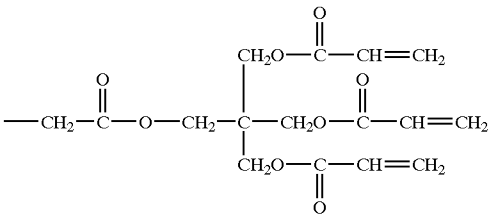

-continued
I-61
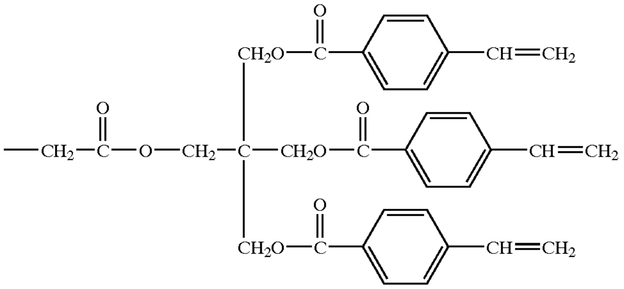
I-62
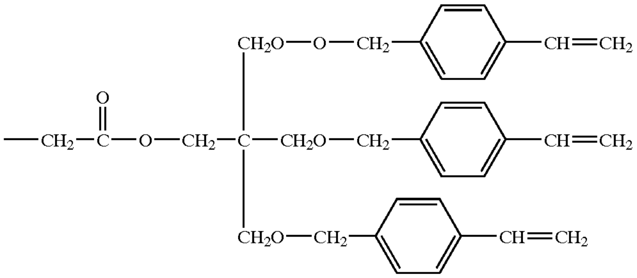
I-63
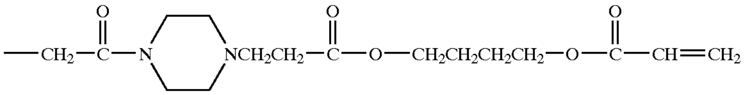
I-64
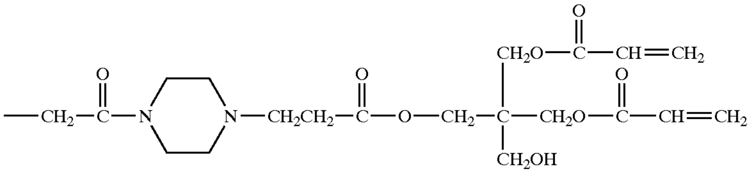
I-65
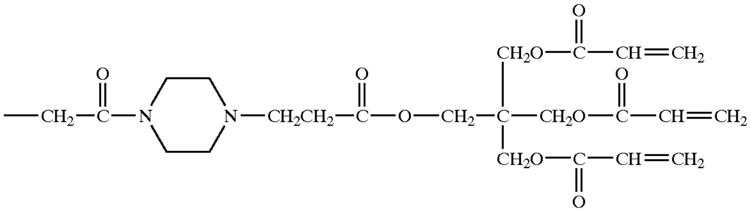
I-66
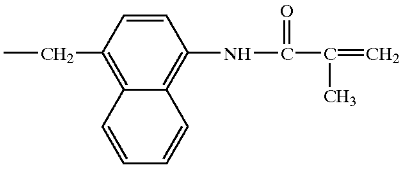
I-67
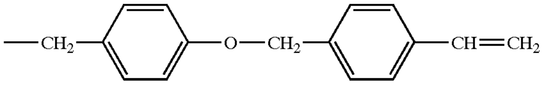
I-68
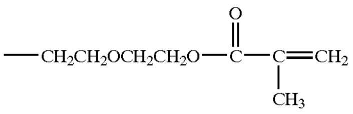

-continued
| | |
|---|---|
| I-69 | 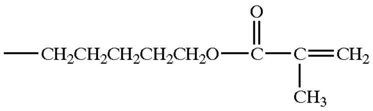 |
| I-70 | 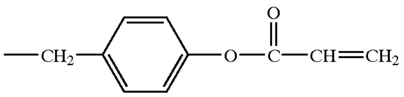 |
| I-71 | 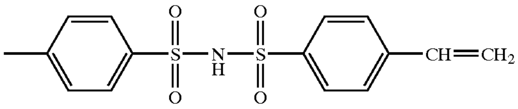 |
| I-72 | 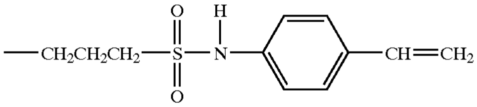 |
| I-73 | 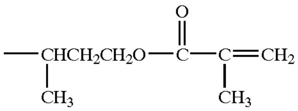 |
| I-74 | 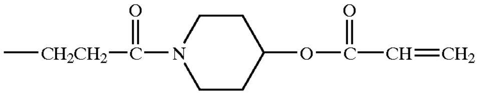 |
| I-75 | 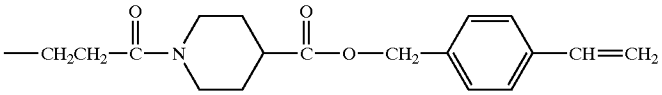 |
| I-76 | 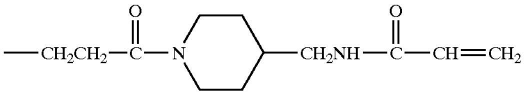 |
| I-77 | 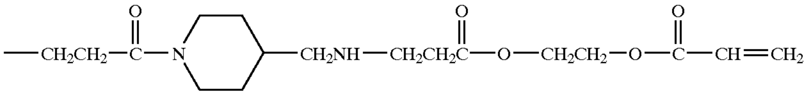 |
| I-78 | 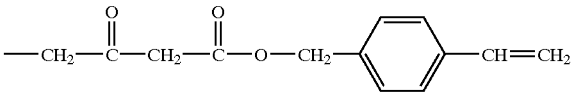 |
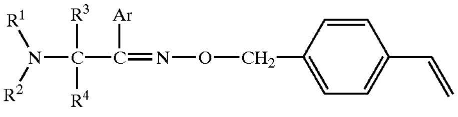
| Compound No. | -$R^1$ | -$R^2$ | -$R^3$ | -$R^4$ | —Ar |
|---|---|---|---|---|---|
| I-79 | —$CH_3$ | —$CH_3$ | —$CH_3$ | —$CH_3$ | 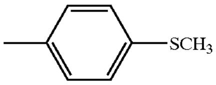 |
| I-80 | —$CH_3$ | —$CH_3$ | 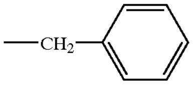 | —$CH_3$ | 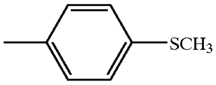 |

-continued
| | | | | | |
|---|---|---|---|---|---|
| I-81 | $—CH_3$ | $—CH_3$ | 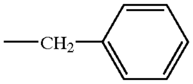 | $—^nC_3H_7$ | 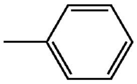 |
| I-82 | $—C_2H_5$ | $—CH_3$ | $—CH_3$ | $—CH_2CH_2OCH_3$ | 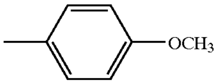 |
| I-83 | $—C_2H_5$ | $—C_2H_5$ | $—C_2H_5$ | $—C_2H_5$ | 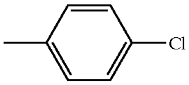 |
| I-84 | $—^nC_4H_9$ | $—^nC_4H_9$ | 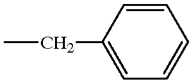 | 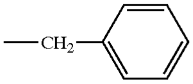 | 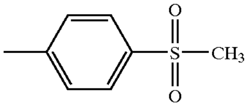 |
| I-85 | $—CH_2CH_2OH$ | $—CH_2CH_2OH$ | $—CH_3$ | $—CH_3$ | 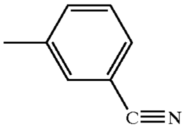 |
| I-86 | $—CH_2CH_2OCH_3$ | $—CH_2CH_2OCH_3$ | $—CH_3$ | $—CH_3$ | 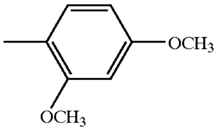 |
| I-87 | $—CH_2CH_2CN$ | $—CH_2CH_2CN$ | $—CH_3$ | $—CH_3$ | 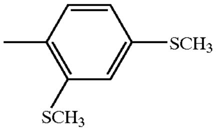 |
| I-88 | 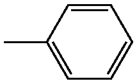 | $—CH_3$ | $—CH_3$ | $—CH_3$ | 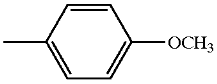 |
| | 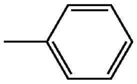 | $—C_2H_5$ | $—CH_2CH{=}CH_2$ | $—CH_3$ | 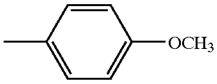 |
| I-89 | $—CH_3$ | $—CH_3$ | 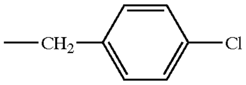 | $—CH_3$ | 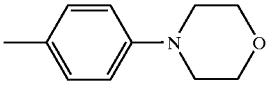 |
| I-90 | $—CH_3$ | $—^nC_4H_9$ | 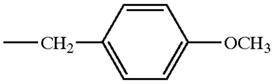 | $—CH_2$ | 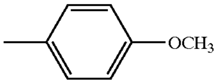 |
I-91
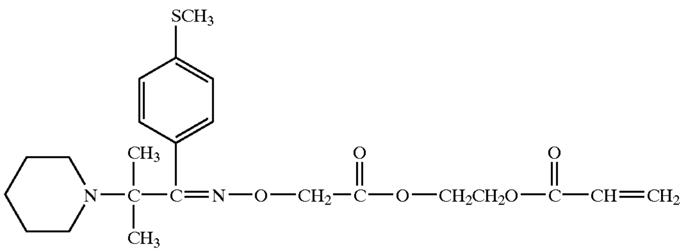

-continued

I-92

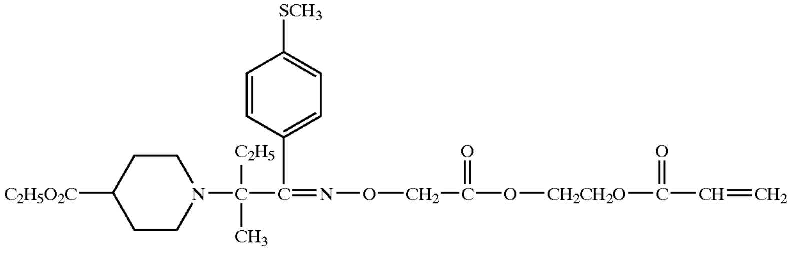

I-93

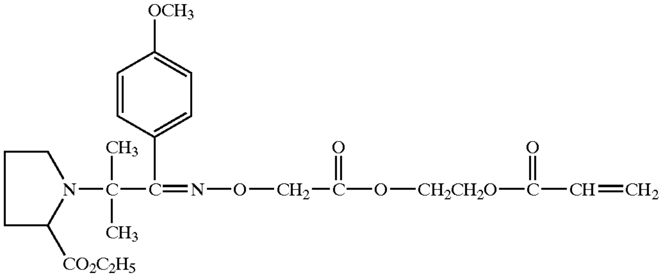

I-94

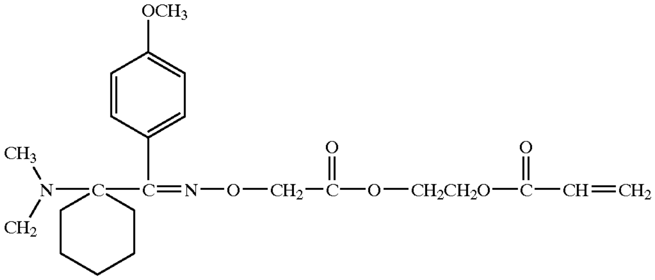

I-95

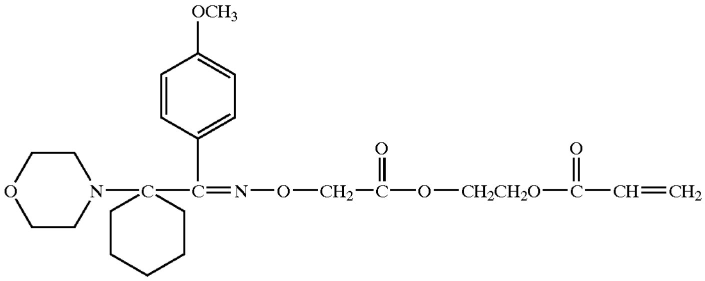

I-96

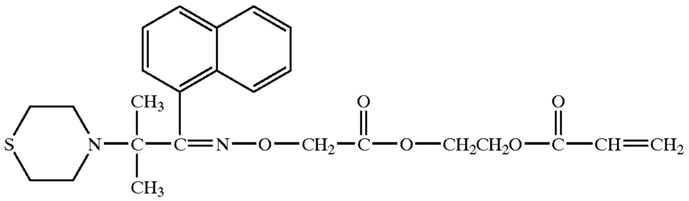

The co-initiator may also be subjected to various chemical modifications so as to improve the properties of the photosensitive layer, similarly to the sensitizing dye described above. For example, a sensitizing dye, titanocene, an addition polymerizable unsaturated compound or other radical generation part may be bonded; a hydrophilic moiety, a substituent for the improvement of compatibility or for the inhibition of crystallization, or a substituent for the improvement of adhesion may be introduced; or formation into a polymer may be used.

Those photopolymerization co-initiators may be used either individually or in combination of two or more thereof. The amount of the polymerization co-initiator used is from 0.1 to 50 wt %, preferably from 0.5 to 30 wt %, based on all components.

In addition to those fundamental components of the photopolymerizable composition constituting the photosensitive layer for use in the present invention described in the foregoing, a slight amount of thermopolymerization inhibitor is preferably added so as to inhibit unnecessary thermopolymerization of the polymerizable ethylenically unsaturated compound during preparation or storage of the photosensitive composition. Suitable examples of the thermopolymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2-methylenebis(4-methyl-6-t-butylphenol) and N-nitrosophenylhydroxyamine primary cerium salt. The amount of the thermopolymerization inhibitor added is preferably from about 0.01 wt % to about 5 wt % based on the weight of the entire composition. If desired, a higher fatty acid derivative such as behenic acid or behenic acid amide may be added and allowed to localize on the surface of the photosensitive layer in the process of drying after the coating, so as to prevent polymerization inhibition by oxygen. The amount of the higher fatty acid derivative added is preferably from about 0.5 to about 10 wt % based on the entire composition. Furthermore, a dyestuff or pigment may also be added for the purpose of coloring the photosensitive layer. Examples of the coloring agent include pigments such as phthalocyanine-based pigment, azo-based pigment, carbon black and titanium oxide, Ethyl Violet, Crystal Violet, azo-based dyes, anthraquinone-based dyes and cyanine-based dyes. The amount of the dyestuff or pigment added is preferably from about 0.5 to about 5 wt % based on the entire composition. In addition, in order to improve the physical properties of the cured coating, an inorganic filler or other known additives such as plasticizer may also be added.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerin, and when a binder is used, the plasticizer may be added in an amount of 10 wt % or less based on the total weight of the ethylenic compound and the binder.

Furthermore, for the purpose of improving the layer strength (press life) which is described later, a UV initiator or a thermal cross-linking agent may also be added to intensify the effect of heating or exposure after the development.

In addition, an additive or interlayer for improving the adhesion between the photosensitive layer and the support or for increasing the development separability of the unexposed photosensitive layer may be added or provided. For example, by adding or undercoating a compound having a diazonium structure or a phosphonic compound, which exhibit a relatively strong interaction with the substrate, the adhesion can be improved and the press life can be prolonged. On the other hand, when a hydrophilic polymer such as a polyacrylic acid or a polysulfonic acid is added or undercoated, the developability of the non-image area is improved and the scumming can be improved.

The photopolymerizable composition of the present invention is usually used by coating it on a support. In coating the photopolymerizable composition of the present invention on a support, the composition is dissolved in an organic solvent of various types before use. Examples of the solvent used here include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents may be used individually or in combination. The solid concentration in the coating solution is suitably from 2 to 50% by weight. The coverage thereof is, in terms of the weight after drying, preferably from about 0.1 to about 10 $g/m^2$, more preferably from 0.5 to 5 $g/m^2$.

An appropriate coverage of the photosensitive layer on the support is preferably selected according to the use end because it has an effect mainly on the sensitivity and developability of the photosensitive layer, and the strength and press life of the exposed area. If the coverage is too small, unsatisfactory press life results, whereas if it excessively large, the sensitivity decreases and the exposure takes a long time, moreover, the time is disadvantageously longer than the development time. For the scan exposure-type lithographic printing plate as a main object of the present invention, the coverage is, in terms of the weight after drying, preferably from about 0.1 to about 10 $g/m^2$, more preferably from 0.5 to 5 $g/m^2$.

Support

In order to obtain a lithographic printing plate as one of main objects of the present invention, the above-described photosensitive layer is preferably provided on a support having a hydrophilic surface. As the hydrophilic support, conventionally known hydrophilic supports for use in the lithographic printing plate can be used without any limitation. The support used is preferably a dimensionally stable, plate-like material. Examples thereof include paper, paper laminated with plastic (e.g., polyethylene, polypropylene, polystyrene), metal sheet (e.g., aluminum, zinc, copper), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal), and paper or plastic film laminated with or having evaporated thereon the above-described metal. If desired, the surface of the support may be subjected to an appropriate known physical or chemical treatment so as to impart hydrophilicity or improve the strength.

Among those supports, paper, polyester film and aluminum sheet are preferred, and aluminum sheet is more preferred because this is dimensionally stable and relatively inexpensive and can provide a hydrophilic or highly strong surface-by an appropriate surface treatment. Furthermore, a composite sheet obtained by bonding an aluminum sheet on a polyethylene terephthalate film described in JP-B-48-18327 is also preferred.

The aluminum plate is suitably a pure aluminum sheet or an alloy sheet mainly comprising aluminum and containing a trace amount of dissimilar elements. Also, a plastic film laminated with or having evaporated thereon aluminum may be used. Examples of the dissimilar element contained in the aluminum alloy include silicon, iron, manganese, copper, magnesium, chromium, zinc, bismuth, nickel and titanium. The dissimilar element content in the alloy is 10 wt % or less. In the present invention, pure aluminum is preferred, however, it is difficult in view of the smelting technology to produce a completely pure aluminum and therefore, an aluminum containing a trace amount of dissimilar elements may be used. As such, the aluminum sheet for use in the present invention cannot be specified about its composition and may be appropriately selected from conventionally known aluminum sheet materials. The aluminum sheet for use in the present invention has a thickness of approximately from 0.1 to 0.6 mm, preferably from 0.15 to 0.4 mm, more preferably from 0.2 to 0.3 mm.

In the case of a support having a metal surface, particularly aluminum surface, the support is preferably subjected to a surface treatment such as surface roughening (graining), soaked in an aqueous solution of sodium silicate, potassium fluorozirconate or phosphate, or anodic oxidation.

The surface roughening of the aluminum sheet is performed by various methods, for example, by a method of mechanically roughening the surface, a method of electrochemically dissolving and roughening the surface or a method of chemically dissolving the selected surface. In the mechanical surface roughening, a known method such as ball polishing, brush polishing, blast polishing or buff polishing may be used. The electrochemical surface roughening may be performed by passing an alternating current or direct current through the electrolytic solution such as hydrochloric acid or nitric acid. Both of these surface roughening treatments may be used in combination as disclosed in JP-A-54-63902. In advance of the surface roughening treatment of the aluminum sheet, degreasing with, for example, a surface active agent, an organic solvent or an alkaline aqueous solution may be performed, if desired, to remove the rolling oil on the surface.

An aluminum sheet subjected to surface roughening and then to soaking in an aqueous sodium silicate solution is preferably used. Furthermore, an aluminum sheet subjected to anodic oxidation and then to soaking in an aqueous alkali metal silicate solution described in JP-B-47-5125 is suitably used. The anodic oxidation is performed by passing a current using the aluminum sheet as an anode in an electrolytic solution comprising, for example, an aqueous or non-aqueous solution of an inorganic acid such as phosphoric acid, chromic acid, sulfuric acid or boric acid, or an organic acid such as oxalic acid or sulfamic acid. These aqueous or non-aqueous solutions may be used individually or in combination of two or more thereof.

The silicate electrodeposition described in U.S. Pat. No. 3,658,662 is also effective.

The surface treatment where the above-described anodic oxidation and sodium silicate treatment are combined with a support subjected to electrolysis graining, disclosed in JP-B-46-27481, JP-A-52-58602 and JP-A-52-30503 is also effective.

A support subjected in sequence to mechanical surface roughening, chemical etching, electrolysis graining, anodic oxidation and sodium silicate treatment, disclosed in JP-A-56-28893 is also preferred.

A support subjected to, after the above-described treatments, undercoating with a water-soluble resin such as a polymer or copolymer having a polyvinyl phosphonic acid or a sulfonic acid on the side chain or a polyacrylic acid, or with a water-soluble metal salt (e.g., zinc borate), a yellow dye or an amine salt, is also preferred.

A sol-gel treated substrate having conjugation-bonded thereto a functional group capable of causing addition reaction by radicals described in Japanese Patent Application No. 5-304358 is also preferred.

A substrate obtained by providing a water resistant hydrophilic layer as the surface layer on a support which may be any, is also preferred. Examples of the surface layer include a layer comprising an inorganic pigment and a binder described in U.S. Pat. No. 3,055,295 and JP-A-56-13168, a hydrophilic swelling layer described in JP-A-9-80744, and a sol-gel coating comprising titanium oxide, polyvinyl alcohol and a silicic acid described in Japanese Published Unexamined International Application No. 8-507727.

These hydrophilization treatments are performed not ionly to render the support surface hydrophilic but also to prevent harmful reaction of the photopolymerizable composition coated thereon and at the same time to improve the adhesion of the photosensitive layer.

Protective Layer:

The scan exposure-type lithographic printing plate which is a preferred embodiment of the present invention is usually exposed in an atmospheric air. Accordingly, a protective layer is preferably provided on the photopolymerizable composition layer. The protective layer prevents a low molecular compound such as oxygen or a basic substance present in an atmospheric air, which inhibits the image formation reaction caused by the exposure in the photosensitive layer, from mixing into the photosensitive layer and thereby enables the exposure in an atmospheric air. To this purpose, the protective layer is required to have a low permeability to low molecular compounds such as oxygen. Furthermore, it is preferred that the protective layer does not substantially inhibit the transmittance of light used for the exposure, has excellent adhesion to the photosensitive layer and can be easily removed at the development after the exposure. Techniques for obtaining such a protective layer have heretofore been proposed and are described in detail, for example, in U.S. Pat. No. 3,458,311 and JP-A-55-49729. The material which can be used for the protective layer is preferably a water-soluble polymer compound having relatively excellent crystallinity. Specifically, water-soluble polymers such as polyvinyl alcohol, polyvinyl pyrrolidone, acidic celluloses, gelatin, gum arabic and polyacrylic acid are known. Among these, when polyvinyl alcohol is. used as a main component, most preferred effects can be attained in view of the fundamental properties such as oxygen cutting property or development separability. The polyvinyl alcohol for use in the protective layer has the oxygen cutting property and water solubility required, accordingly, as far as it contains an unsubstituted vinyl alcohol unit, the polyvinyl alcohol may be partially substitute by an ester, ether or acetal. Also, the polyvinyl alcohol may partially have another copolymer component. Examples of the polyvinyl alcohol include those hydrolyzed at a ratio of from 71 to 100% and having a molecular weight of from 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-22E, PVA-405, PVA-420, PVA-613 and L-8, all produced by Kuraray.

The components (selection of PVA, use of additives) and coated amount of the protective layer are selected taking account of the oxygen cutting property, development separability, fogging property, adhesion and scratch resistance. In general, as the hydrolysis ratio of PVA used (namely, the content of unsubstituted vinyl alcohol unit in the protective layer) is higher and the layer thickness is larger, the oxygen cutting property is more intensified and this is advantageous in view of sensitivity. However, if the oxygen cutting property is intensified to an extreme extent, unnecessary polymerization reaction occurs during the production or stock storage or undesired fogging or thickening of the image line is disadvantageously caused. The adhesion to the image area and the scratch resistance are also very important in view of handling of the plate. More specifically, when a hydrophilic layer comprising a water-soluble polymer is laminated on a lipophilic polymerization layer, the coating is readily stripped due to the insufficient adhesive strength and the area from which the coating is stripped is subject to defects such as curing failure due to polymerization inhibition by oxygen. To solve this problem, various proposals have been made with an attempt to improve the adhesive property between these two layers. For example, U.S. Pat. Nos. 292,501 and 44,563 disclose a technique of mixing from 20 to 60 wt % of an acryl-based emulsion or a water-insoluble vinyl pyrrolidone-vinyl acetate copolymer in a hydrophilic polymer mainly comprising polyvinyl alcohol and coating it on a polymerization layer, thereby obtaining a sufficiently high adhesive property. Any of these known techniques can be applied to the present invention. The coating method of such a protective layer is described in detail, for example, in U.S. Pat. No. 3,458,311 and JP-A-55-49729.

The protective layer may further be imparted with another function. For example, by adding a coloring agent (e.g., water-soluble dye) having excellent transmittance of light at from 350 to 450 nm used for the exposure and capable of efficiently absorbing light at 500 nm or more, the safelight adaptability can be more improved without causing any reduction in the sensitivity.

The lithographic printing original plate (photosensitive material) according to the present invention exhibits particularly excellent properties in the plate-making process by scan exposure.

The general scan exposure method is described, for example, Yoshihiro Bukida (supervisor), *Hikari Printer Sekkei* (*Design of Photo-Printer*), TRIKEPPS (1985). More specifically, a light formed into a beam (usually from a few to tens of microns) is used as the light source. The main scanning is applied on the original plate in a certain direction and the laser scanning is applied in the direction perpendicular thereto, thereby exposing the entire plate. At this time, ON-OFF of the exposure is controlled according to the image information to perform the imagewise exposure. For achieving an imagewise exposure having higher resolution, a beam having a smaller radius must be used. In this case, in order to draw an image on the entire plate having a large area within a short time, the scanning rate must be elevated and/or the number of beams must be increased. For achieving a practical exposure time in a scan exposure system, the exposure time on respective points of the photosensitive material is usually as small as micro seconds or less. To this purpose, a high power light source capable of continuous oscillation must be used as the light source so that an exposure energy quantity large enough to the photosensitivity of the photosensitive material can be gained. As such a light source, various lasers capable of continuously oscillating from the visible light region to the infrared ray region (e.g., Ar, FD-YAG, He—Ne, LD, YAG) can be used at present. In the case of photopolymerization system, a visible light source having an output of approximately from tens to hundreds of mW such as Ar ion laser (488 nm) and FD-YAG (532 nm), is selected from the standpoint of balance between the photosensitivity and the power of a laser which is available at a low cost. However, as is apparent, the desired effect of the lithographic printing original plate of the present invention does not depend on the kind or wavelength of the light source and even in the scan exposure conditions of using, for example, a light source having a shorter wavelength (e.g., blue and/or ultraviolet laser), a light source having a longer wavelength (e.g., red, infrared laser) or another light source, the effect can be similarly obtained. In recent years, development of short wave semiconductor lasers (e.g., blue and/or ultraviolet) using a GaN-based material is aggressively proceeding and the original plate of the present invention can be suitably used for the scan exposure using such a laser.

The photopolymerizable composition of the present invention can also be used for normal photopolymerization reaction. Furthermore, the photopolymerizable composition can be versatilely used, for example, for the photoresist in the manufacture of a printing plate or a printed board.

The photosensitive material using the photopolymerizable composition of the present invention is imagewise exposed and then the unexposed area of the photosensitive layer is removed by a developer to obtain an image. When the photopolymerizable composition is used in the manufacture of a lithographic printing plate, a developer described in JP-B-57-7427 is preferably used. The developer is suitably an aqueous solution of an inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate and aqueous ammonia, or an aqueous solution of an organic alkali agent such as monoethanolamine and diethanolamine. The alkali agent is added such that the solution has a concentration of from 0.1 to 10 wt %, preferably from 0.5 to 5 wt %.

The above-described alkaline aqueous solution may contain, if desired, a small amount of a surface active agent or an organic solvent such as benzyl alcohol, 2-phenoxyethanol or 2-butoxyethanol. Examples thereof include those described in U.S. Pat. Nos. 3,375,171 and 3,615,480. Furthermore, the developers described in JP-A-50-26601, JP-A-58-54341, JP-B-56-39464 and JP-B-56-42860 are also excellent.

In the plate-making process of the lithographic printing original plate of the present invention, the entire surface may be heated, if desired, before or during the exposure or between the exposure and the development. This heating is advantageous in that the image formation reaction in the photosensitive layer is accelerated, the sensitivity and press life are improved, and the sensitivity is stabilized. Furthermore, for the purpose of improving the image strength or press life, it is effective to subject the developed image to entire heating or entire exposure. Usually, the heating before the development is preferably performed under a mild condition of 150° C. or less. If the temperature is excessively high, even the non-image area is disadvantageously fogged. The heating after the development uses a very severe condition of usually from 200 to 500° C. If the temperature is low, a sufficiently high effect of strengthening the image cannot be obtained, whereas if it is excessively high, there arise problems such as deterioration of the support or thermal decomposition of the image area.

The present invention is described in greater detail below by referring to Synthesis Examples, Examples and Comparative Examples, however, the present invention should not be construed as being limited thereto.

SYNTHESIS EXAMPLE 1

Polyurethane Resin (90)

In a 500 ml-volume three-necked round bottom flask equipped with a condenser and a stirrer, 12.1 g (0.09 mol) of 2,2-bis(hydroxymethyl)propionic acid and 20.0 g (0.01 mol) of a diol compound (hydroxyl group value: 56.9 mgKOH/g) of Compound No. 5 were dissolved in 100 ml of N,N-dimethylacetamide. Thereto, 20.0 g (0.08 mol) of 4,4'-diphenylmethane diisocyanate and 3.4 g (0.02 g) of hexamethylene diisocyanate were added. The resulting mixed solution was heated while stirring at 100° C. for 5 hours and then diluted with 200 ml of N,N-dimethylformamide and 400 ml of methyl alcohol. The reaction solution was charged into 4 λ of water while stirring to deposit a white polymer. This polymer was separated by filtration, washed with water and dried in a vacuum, as a result, 45 g of the objective polymer was obtained.

The polymer was measured on the molecular weight by gel permeation chromatography (GPC) and the weight average molecular weight (on a polystyrene basis) was found to be 50,000. Also, the carboxyl group content (acid value) was measured by titration and found to be 1.40 meq/g.

SYNTHESIS EXAMPLE 2

Polyurethane Resin (91)

18.1 g (0.14 mol) of 2,2-bis(hydroxymethyl)propionic acid and 30.0 g (0.02 mol) of a diol compound (hydroxyl group value: 56.9 mgKOH/g) of Compound No. 5 were dissolved in 100 ml of N,N-dimethylacetamide. The reaction and the processing subsequent thereto were performed in the same manner as in Synthesis Example 1 using 38.0 g (0.16 mol) of 4,4'-diphenylmethane diisocyanate. As a result, 80 g of the objective polymer was obtained. The polymer was measured on the molecular weight by GPC and the weight average molecular weight (on a polystyrene basis) was found to be 200,000. Also, the carboxyl group content (acid value) was measured by titration and found to be 1.30 meq/g.

Other polyurethane resins described as specific examples can also be synthesized using a diisocyanate compound and a diol compound shown above in the same manner as in Synthesis Examples 1 and 2.

Polyurethane resins 92, 96, 98 and 100 used in the Examples were measured on the weight average molecular weight Mw in the same manner as above, and the results are shown below.

| Polyurethane Resin | Mw |
|---|---|
| (92) | 80,000 |
| (96) | 75,000 |
| (98) | 90,000 |
| (100) | 100,000 |

EXAMPLE 1 AND COMPARATIVE EXAMPLE 1

A 0.30 mm-thick aluminum sheet was subjected to graining of the surface thereof using a nylon brush and a water suspension of 400-mesh pumice and then thoroughly washed with water. Thereafter, the sheet was etched by dipping it in a 10 wt % aqueous sodium hydroxide solution at 70° C. for 60 seconds, washed with flowing water, neutralization-washed-with a 20 wt % nitric acid and further washed with water. The resulting sheet was subjected to electrolysis surface roughening treatment using a sinewave-form alternating current under conditions of Va=12.7 V in a 1 wt % aqueous nitric acid solution with an anode time electricity quantity of 160 coulomb/$dm^2$. At this time, the surface roughness was measured and found to be 0.6 μm (Ra indication). Subsequently, the sheet was desmutted by dipping it in a 30 wt % aqueous sulfuric acid solution at 55° C. for 2 minutes and then subjected to anodic oxidation in a 20 wt % aqueous sulfuric acid solution at a current density of 2 A/$dm^2$ for 2 minutes to give an anodic oxide film having a thickness of 2.7 g/$m^2$.

On the thus-treated aluminum sheet, a photosensitive composition having the following composition was coated and then dried at 80° C. for 2 minutes to form a photosensitive layer.

| Composition (A) of Photosensitive Layer | |
|---|---|
| Pentaerythritol tetraacrylate | 1.5 g |
| Binder shown in Table 1 | 2.0 g |
| Dye-1 | 0.1 g |
| S-1 | 0.2 g |
| Fluorine-based nonionic surface active agent | 0.03 g |
| Copper phthalocyanine pigment (organic polymer dispersion) | 0.1 g |
| Methyl ethyl ketone | 20.0 g |
| Propylene glycol monomethyl ether acetate | 20.0 g |
| Dry coated weight | 1.5 g/$m^2$ |

On the thus-formed photosensitive layer, a 3 wt % aqueous solution of polyvinyl alcohol (saponification degree: 86.5–89 mol %, polymerization degree: 1,000) was coated to have a dry coated weight of 2 g/$m^2$ and dried at 100° C. for 2 minutes.

Then, a step tablet (manufactured by Fuji Photo Film Co., Ltd.) in which the intensity of light attenuates by 1/1.4 every one step elevation was tightly contacted onto the surface of the photosensitive lithographic printing original plate obtained above and exposure was applied thereon for 30 seconds while adjusting the intensity of light such that the illuminance on the photosensitive layer surface was 0.0132 mW/$cm^2$.

The visible light used was a monochromatic light from a xenon lamp light source, applied through Kenko Optical Filter BP-49.

Thereafter, the sheet was heated at 100° C. for 1 minute and developed by dipping it in the following developer at 25° C. for 20 seconds.

| | |
|---|---|
| 1K Potassium silicate | 30 g |
| Potassium hydroxide | 15 g |
| $C_{12}H_{25}—C_6H_4—O—C_6H_4—SO_3Na$ | 30 g |
| Water | 1,000 g |

The resulting sheet was evaluated on the following items and the results obtained are shown in Table 1.

Sensitivity:

The sensitivity was shown by the clear part step number of the step tablet. The higher the step number, the higher the sensitivity.

TABLE 1

| | Binder | Sensitivity, Step of Clear part |
|---|---|---|
| Example 1 | polyurethane resin (90) | 5.0 |
| Comparative Example 1 | B-1 | 5.0 |

EXAMPLE 2 AND COMPARATIVE EXAMPLE 2

Photosensitive lithographic printing plates were manufactured in the same manner as in Example 1 and Comparative Example 1, then scan-exposed by a scan exposure system using a 75 mW air cooled argon laser light source in an exposure amount shown in Table 2, developed with the developer shown above for 20 seconds, and washed with water. Thereafter, a gum solution obtained by two-fold diluting a protective gum GU-7 (produced by Fuji Photo Film Co., Ltd.) with water was coated by means of a sponge and then dried.

The thus-obtained printing plates each was subjected to printing in a printer, SOR-KZ manufactured by HEIDELBERG, and the press life and the fogging on the non-image area were evaluated. The results are shown in Tables 2 and 3.

Press Life:

Evaluated by the number of sheets printed until thinning of the line work part was started on the printed matter.

Fogging Property:

Evaluated by visually observing scumming in the non-image area of the halftone image part on the printed matter.

TABLE 2

| | | Press Life (sheets), Exposure Amount (mJ/m$^2$) | | |
|---|---|---|---|---|
| | Binder | 0.05 | 0.10 | 0.20 |
| Example 2 | polyurethane resin (90) | 50,000 | 60,000 | 80,000 |
| Comparative Example 2 | B-1 | 50,000 | 20,000 | 40,000 |

TABLE 3

| | | Fogging Property, Exposure Amount (mJ/m$^2$) | | |
|---|---|---|---|---|
| | Binder | 0.10 | 0.20 | 0.30 |
| Example 2 | polyurethane resin (90) | no problem | no problem | no problem |
| Comparative Example 2 | B-1 | no problem | fogged | fogged |

As is apparent from Tables 1 to 3, the lithographic printing original plates according to the present invention exhibit excellent press life particularly with a low exposure energy while maintaining the same photosensitivity as in conventional techniques. Also, the lithographic printing original plates according to the present invention are completely free of fogging even in the exposure conditions where a satisfactory press life can be obtained.

EXAMPLE 3 AND COMPARATIVE EXAMPLE 3

Photosensitive lithographic printing original plates were obtained in the same manner as in the Examples and Comparative Examples above except for changing the photosensitive composition to the following composition. The printing original plates obtained were exposed by laser scanning in the same manner as above to obtain printing plates having formed thereon a 50% halftone image to obtain a printing plate. The printing plates were subjected to printing and the fluctuation of the halftone image was evaluated in the same manner. The results are shown in Table 4.

Fluctuation of Halftone Image:

The image density of printed matter was measured on the 100th and 10,000th sheets by a Macbeth densitometer. In the Table, the halftone image in percentage of the 100th and 10,000th sheets are shown.

| Composition (B) of Photosensitive Layer | |
|---|---|
| Pentaerythritol tetraacrylate | 2.0 g |
| Binder shown in Table 4 | 2.0 g |
| Dye-1 | 0.1 g |
| S-1 | 0.2 g |
| Fluorine-based nonionic surface active agent | 0.03 g |
| Copper phthalocyanine pigment (organic polymer dispersion) | 0.1 g |
| Methyl ethyl ketone | 20.0 g |
| Propylene glycol monomethyl ether acetate | 20.0 g |
| Dry coated weight | 1.5 g/m$^2$ |

TABLE 4

| | | Fluctuation in Halftone Image (100th sheet → 10,000th sheet), Exposure Amount (mJ/m$^2$) | | |
|---|---|---|---|---|
| | Binder | 0.10 | 0.20 | 0.30 |
| Example 3 | polyurethane resin (92) | 50%→47% | 50%→48% | 50%→49% |
| Comparative Example 3 | B-1 | 50%→30% | 50%→40% | 50%→45% |

As is apparent from Table 4, the lithographic printing original plate according to the present invention provides a printing plate reduced in the fluctuation of the halftone image under the exposure conditions over a wide range.

EXAMPLES 4 TO 6 AND COMPARATIVE EXAMPLE 4

Photosensitive lithographic printing original plates were obtained in the same manner as in the Examples and Comparative Examples above except for changing the photosensitive composition to the following composition. From the printing original plates obtained, printing plates were obtained in the same manner as above by a laser scan exposure with an exposure amount of 0.15 mJ/cm$^2$. The printing plates were subjected to printing in the same manner and evaluated on the press life. The results are shown in Table 5.

| Composition (C) of Photosensitive Layer | |
|---|---|
| Pentaerythritol tetraacrylate | 2.5 g |
| Binder shown in Table 5 | 3.0 g |
| Dye-1 | 0.1 g |
| S-1 | 0.1 g |
| Fluorine-based nonionic surface active agent | 0.03 g |
| Copper phthalocyanine pigment (organic polymer dispersion) | 0.1 g |
| Methyl ethyl ketone | 20.0 g |
| Propylene glycol monomethyl ether acetate | 20.0 g |
| Dry coated weight | 1.5 g/m$^2$ |

TABLE 5

| | Binder | Press Life (sheets) |
|---|---|---|
| Example 4 | polyurethane resin (91) | 90,000 |
| Example 5 | polyurethane resin (96) | 80,000 |
| Example 6 | polyurethane resin (100) | 100,000 |
| Comparative Example 4 | B-1 | 30,000 |

EXAMPLES 7 TO 9

Photosensitive lithographic printing original plates were obtained in the same manner as in the Examples and Comparative Examples above except for changing the photosensitive composition to the following composition. From the printing original plates obtained, printing plates were obtained in the same manner as above by a laser scan exposure with an exposure amount of 0.15 mJ/cm$^2$. The printing plates were subjected to printing in the same manner and evaluated on the press life. The results are shown in Table 6.

| Composition (D) of Photosensitive Layer | |
|---|---|
| Pentaerythritol tetraacrylate | 1.5 g |
| Binder shown in Table 6 | 2.0 g |
| Sensitizing dye shown in Table 6 | 0.1 g |
| Photopolymerization initiator shown Table 6 | 0.1 g |
| Fluorine-based nonionic surface active agent | 0.03 g |
| Copper phthalocyanine pigment (organic polymer dispersion) | 0.1 g |
| Methyl ethyl ketone | 20.0 g |
| Propylene glycol monomethyl ether acetate | 20.0 g |
| Dry coated weight | 1.5 g/m$^2$ |

TABLE 6

| | Binder | Sensitizing Dye | Photopolymerization Initiator | Press Life (sheets) |
|---|---|---|---|---|
| Example 7 | polyurethane (98) | Dye-1 | S-1 | 95,000 |
| Example 8 | polyurethane (98) | Dye-2 | S-1 | 90,000 |
| Example 9 | polyurethane (98) | Dye-2 | S-2 | 95,000 |

EXAMPLE 10

Photosensitive lithographic printing original plate was obtained in the same manner as in the Examples and Comparative Examples above except for changing the photosensitive composition to the following composition. The printing original plate obtained was forcedly aged and then printing plates were obtained therefrom in the same manner as above by a laser scan exposure with an exposure amount of 0.15 mJ/cm$^2$. The printing plates were subjected to printing in the same manner and evaluated on the press life. The results are shown in Table 7.

| Composition (A) of Photosensitive Layer | |
|---|---|
| Pentaerythritol tetraacrylate | 1.5 g |
| Binder shown in Table 7 | 2.0 g |

-continued

| Composition (A) of Photosensitive Layer | |
|---|---|
| Dye-1 | 0.1 g |
| S-1 | 0.2 g |
| Fluorine-based nonionic surface active agent | 0.03 g |
| Copper phthalocyanine pigment (organic polymer dispersion) | 0.1 g |
| Methyl ethyl ketone | 20.0 g |
| Propylene glycol monomethyl ether acetate | 20.0 g |
| Dry coated weight | 1.5 g/m$^2$ |

TABLE 7

| | | Clear Part Step Number/Press Life | | |
|---|---|---|---|---|
| | Binder | No Forced Aging | 60° C., 3 Days | 45° C., Humidity of 75%, 3 Days |
| Example 10 | polyurethane (90) | 50,000/95,000 | 50,000/95,000 | 50,000/95,000 |

EXAMPLES 11 TO 25

Photosensitive lithographic printing original plates were obtained in the same manner as above except for changing the photosensitive composition to the following composition.

| Composition (E) of Photosensitive Layer | |
|---|---|
| Monomer | shown in Table 8 |
| Binder | shown in Table 8 |
| Dye-1 | shown in Table 8 |
| S-1 | shown in Table 8 |
| Co-initiator I-19 | shown in Table 8 |
| Fluorine-based nonionic surface active agent | 0.03 g |
| Copper phthalocyanine pigment (organic polymer dispersion) | 0.1 g |
| Methyl ethyl ketone | 20.0 g |
| Propylene glycol monomethyl ether acetate | 20.0 g |
| Dry coated weight | 1.5 g/m$^2$ |

The thus-obtained photopolymerizable lithographic printing original plates were exposed by laser scanning of 0.15 mJ/cm$^2$ using an SHG-YAG laser (532 nm) in a plate setter, Plate Jet 4 manufactured by CSI and then treated in the same manner as in Example 2 to obtain printing plates.

The printing plates obtained were subjected to printing in the same manner and evaluated on the press life.

Also, the tackiness of the photosensitive layer was evaluated and graded or the like.

Tackiness of Photosensitive Layer:

A roller of 5 kg/cm$^2$ was traveled at a temperature of 40° C. and a speed of 2 m/min on the photosensitive layer with no protective layer and the extent of transfer of the photosensitive layer to the roller was visually evaluated.

◎: Scarcely transferred.

○: Slightly transferred.

Δ: Somewhat heavily transferred.

X: Heavily transferred.

The results obtained are shown in Table 8.

TABLE 8

(Photosensitive Layer E)

| | Monomer Composition (g) | Binder [g] | Dye-1 (g) | S-1 (g) | I-19 (g) | Press Life (sheets) | Sticking of Photo-sensitive Layer |
|---|---|---|---|---|---|---|---|
| Example 11 | U-4HA*1) (1.5) | polyurethane resin (107) [2.0] | 0.1 | 0.1 | 0.2 | 100,000 | ○ |
| Example 12 | UA-101H*2) (1.5) | polyurethane resin (107) [2.0] | 0.1 | 0.1 | 0.2 | 160,000 | ○ |
| Example 13 | U-6HA*3) (1.5) | polyurethane resin (107) [2.0] | 0.1 | 0.1 | 0.2 | 100,000 | ○ |
| Example 14 | UA-101H (1.5) | polyurethane resin (107) [2.0] | 0.1 | 0.2 | 0.2 | 180,000 | ○ |
| Example 15 | UA-101H (1.5) | polyurethane resin (107) [2.0] | 0.1 | 0.3 | 0.2 | 200,000 | ○ |
| Example 16 | UA-101H (1.5) | polyurethane resin (107) [2.0] | 0.1 | 0.1 | 0.4 | 180,000 | ○ |
| Example 17 | UA-101H (1.5) | polyurethane resin (107) [2.0] | 0.1 | 0.1 | 0.6 | 200,000 | ○ |
| Example 18 | UA-101H (1.0)/penta-erythritol tetraacrylate (0.5) | polyurethane resin (107) [2.0] | 0.1 | 0.1 | 0.2 | 160,000 | ⊚ |
| Example 19 | UA-101H (1.0)/M-2*5) (0.5) | polyurethane resin (107) [2.0] | 0.1 | 0.1 | 0.2 | 120,000 | ⊚ |
| Example 20 | UA-101H (1.5) | polyurethane resin (107) [1.0] B-2 [0.1] | 0.1 | 0.1 | 0.2 | 180,000 | ○ |
| Example 21 | UA-101H (1.5) | polyurethane resin (107) [1.0] B-3 [0.1] | 0.1 | 0.1 | 0.2 | 180,000 | ○ |
| Example 22 | U-4HA (1.5) | polyurethane resin (90) [2.0] | 0.1 | 0.1 | 0.2 | 100,000 | ○ |
| Example 23 | UA-101H (1.5) | polyurethane resin (90) [2.0] | 0.1 | 0.1 | 0.2 | 160,000 | ○ |
| Example 24 | U-4HA (1.5) | polyurethane resin (96) [2.0] | 0.1 | 0.1 | 0.2 | 100,000 | ○ |
| Example 25 | M-1*4) (1.5) | polyurethane resin (96) [2.0] | 0.1 | 0.1 | 0.2 | 100,000 | ○ |

EXAMPLES 26 AND 27

A 0.30 mm-thick aluminum sheet was subjected to graining of the surface thereof using a nylon blush and a * water suspension of 400-mesh pumice and then thoroughly washed with water. Thereafter, the sheet was etched by dipping it in a 10 wt % aqueous sodium hydroxide solution at 70° C. for 60 seconds, washed with flowing water, neutralization-washed with a 20 wt % aqueous nitric acid solution and further washed with water. The resulting sheet was subjected to electrolysis surface roughening treatment using a sinewaveform alternating current under conditions of Va=12.7 V in a 1 wt % aqueous nitric acid solution with an anode time electricity quantity of 160 coulomb/dm$^2$. At this time, the surface roughness was measured and found to be 0.6 $\mu$m (Ra indication). Subsequently, the sheet was desmutted by dipping it in a 30 wt % aqueous sulfuric acid solution at 55° C. for 2 minutes and then subjected to anodic oxidation in a 20 wt % aqueous sulfuric acid solution at a current density of 2 A/dm$^2$ for 2 minutes to -give an anodic oxide film having a thickness of 2.7 g/m$^2$.

Then, a liquid composition (sol solution) was prepared by a SG process through the following procedure.

[Sol Solution]

| | |
|---|---|
| Methanol | 130 g |
| Water | 20 g |
| 85 wt % Phosphoric acid | 16 g |

-continued

| | |
|---|---|
| Tetraethoxysilane | 50 g |
| 3-Methacryloxypropyl trimethoxysiloxane (3-MPTMS) | see Table 9 |

These components were mixed and stirred. After about 5 minutes, heat was generated and the mixed solution was reacted for 60 minutes. Then, the contents were transferred to a separate vessel and thereto 3,000 parts by weight of methanol was added to obtain a sol solution.

The solution obtained was diluted with methanol/ethylene glycol (=9/1 by weight), boiler coated on substrate to have an Si amount of 3 mg/m$^2$, and then dried at 100° C. for 1 minute.

On the thus-treated substrate, a photosensitive composition having the composition E for the photosensitive layer was coated to have a dry coated amount of 1.4 g/m$^2$ and then dried at 80° C. for 2 minutes to form a photosensitive layer.

On the thus-formed photosensitive layer, a 3 wt % aqueous solution of polyvinyl alcohol (saponification: 86.5–89 mol %, polymerization degree: 1,000) was coated to have a dry coated weight of 2 g/m$^2$ and dried at 100° C. for 2 minutes.

Subsequently, the resulting substrate was exposed by laser scanning of 0.15 mJ/cm$^2$ to obtain a printing plate and the printing plate obtained was subjected to printing and evaluated on the press life. The results are shown in Table 9.

TABLE 9

(Photosensitive Layer E)

| | 3-MPTMS (g) | Monomer (g) | Binder [g] | Dye-1 (g) | S-1 (g) | I-19 (g) | Press Life (sheets) |
|---|---|---|---|---|---|---|---|
| Example 26 | 48 | UA-101H (1.5) | polyurethane resin (108) [2.0] | 0.1 | 0.1 | 0.2 | 120,000 |
| Example 27 | 60 | UA-101H (1.5) | polyurethane resin (108) [2.0] | 0.1 | 0.1 | 0.2 | 140,000 |
| Example 28 | 72 | UA-101H (1.5) | polyurethane resin (108) [2.0] | 0.1 | 0.1 | 0.2 | 160,000 |

EXAMPLE 29 AND COMPARATIVE EXAMPLE 5

Photosensitive lithographic printing original plates were obtained in the same manner as in the Examples and Comparative Examples above except for changing the photosensitive composition to the following composition. From the printing original plate obtained, printing plates were obtained in the same manner as above by a laser scan exposure with an exposure amount of 0.15 mJ/$cm^2$. The printing plates were subjected to printing in the same manner and evaluated on the press life. The results are shown in Table 10.

| Composition (F) of Photosensitive Layer | |
|---|---|
| Pentaerythritol tetraacrylate | 2.5 g |
| Binder shown in Table 10 | 3.0 g |
| Dye-2 | 0.1 g |
| S-2 | 0.1 g |
| Fluorine-based nonionic surface active agent | 0.03 g |
| Copper phthalocyanine pigment (organic polymer dispersion) | 0.1 g |
| Methyl ethyl ketone | 20.0 g |
| Propylene glycol monomethyl ether acetate | 20.0 g |
| Dry coated weight | 1.5 g/$m^2$ |

TABLE 10

| | Binder | Press Life (sheets) |
|---|---|---|
| Example 29 | polyurethane resin (12) | 50,000 |
| Comparative Example 5 | B-2 | 30,000 |

EXAMPLE 30 AND COMPARATIVE EXAMPLE 6

Photosensitive lithographic printing original plates were obtained in the same manner as in the Examples and Comparative Examples above except for changing the photosensitive composition to the following composition. The printing original plate obtained was forcedly aged and then printing plates were obtained therefrom in the same manner as above by a laser scan exposure with an exposure amount of 0.15 mJ/$cm^2$. The printing plates were subjected to printing in the same manner and evaluated on the press life. The results are shown in Table 11.

| Composition (G) of Photosensitive Layer | |
|---|---|
| Pentaerythritol tetraacrylate | 1.5 g |
| Binder shown in Table 11 | 2.0 g |
| Dye-1 | 0.1 g |
| S-1 | 0.2 g |
| III-10 | 0.2 g |
| Fluorine-based nonionic surface active agent | 0.03 g |
| Copper phthalocyanine pigment (organic polymer dispersion) | 0.1 g |
| Methyl ethyl ketone | 20.0 g |
| Propylene glycol monomethyl ether acetate | 20.0 g |
| Dry coated weight | 1.5 g/$m^2$ |

TABLE 11

| | | Clear Step Number/Press Life | | |
|---|---|---|---|---|
| | Binder | No Forced Aging | 60+ C., 3 Days | 45° C., Humidity of 75%, 3 Days |
| Example 30 | polyurethane resin (12) | 55,000/55,000 | 55,000/55,000 | 55,000/55,000 |
| Comparative Example 6 | B-2 | 55,000/40,000 | 55,000/35,000 | 40,000/25,000 |

EXAMPLES 31 TO 33 AND COMPARATIVE EXAMPLE 7

Photosensitive lithographic printing original plates were obtained in the same manner as in the Examples and Comparative Examples above except for changing the photosensitive composition to the following composition. From the printing original plate obtained, printing plates were obtained therefrom in the same manner as above by a laser scan exposure with an exposure amount of 0.15 mJ/$cm^2$. The printing plates were subjected to printing in the same manner and evaluated on the press life. The results are shown in Table 12.

| Composition (H) of Photosensitive Layer | |
|---|---|
| U-4HA | 2.5 g |
| Binder shown in Table 12 | 3.0 g |
| Dye-2 | 0.1 g |
| S-2 | 0.1 g |
| I-1 | 0.2 g |
| Fluorine-based nonionic surface active agent | 0.03 g |
| Copper phthalocyanine pigment (organic polymer dispersion) | 0.1 g |

-continued

| Composition (H) of Photosensitive Layer | |
|---|---|
| Methyl ethyl ketone | 20.0 g |
| Propylene glycol monomethyl ether acetate | 20.0 g |
| Dry coated weight | 1.5 $g/m^2$ |

TABLE 12

| | Binder | Press Life (sheets) |
|---|---|---|
| Example 31 | polyurethane resin (12) | 60,000 |
| Example 32 | polyurethane resin (107) | 70,000 |

TABLE 12-continued

| | Binder | Press Life (sheets) |
|---|---|---|
| Example 33 | polyurethane resin (85) | 60,000 |
| Comparative Example 7 | B-2 | 35,000 |

The compounds used in the Examples and Comparative Examples above are shown below. In Comparative Binder Resins B-1, B-2 and B-3, the Mw was a weight average molecular weight determined in the same manner as described in the foregoing and the acid value is a carboxy content.

(S-1)

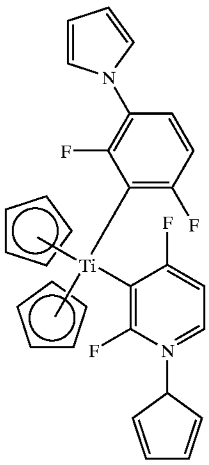

(S-2)

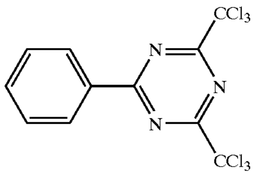

(Dye-1)

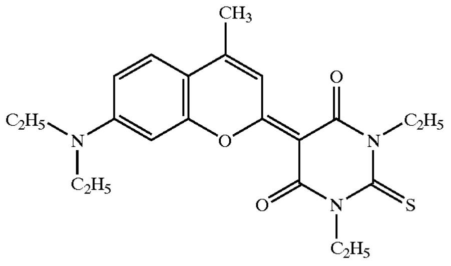

(Dye-2)

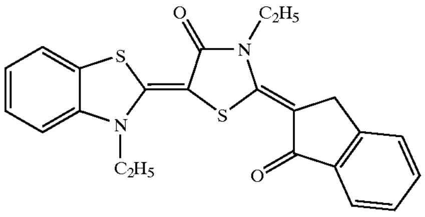

(B-1)

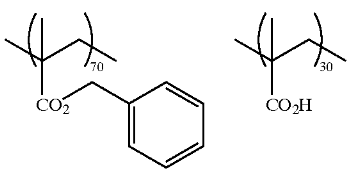

Acid value 1.97meq/g
Mw 42,000

*1)

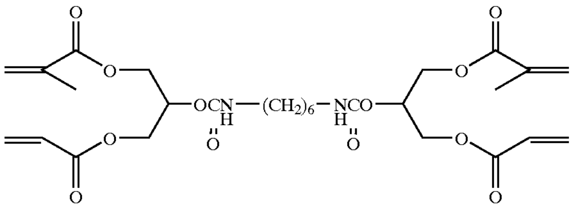

U-4HA
(Shin-Nakamura Kagaku K.K.)

-continued

*2)

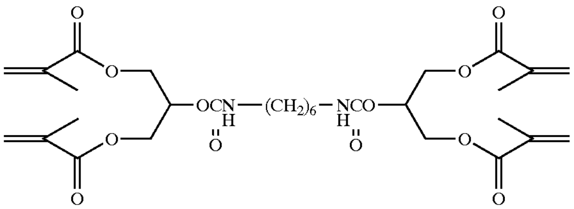

UA-101H
(Kyoeisha Chemical Co., Ltd.)

*3)

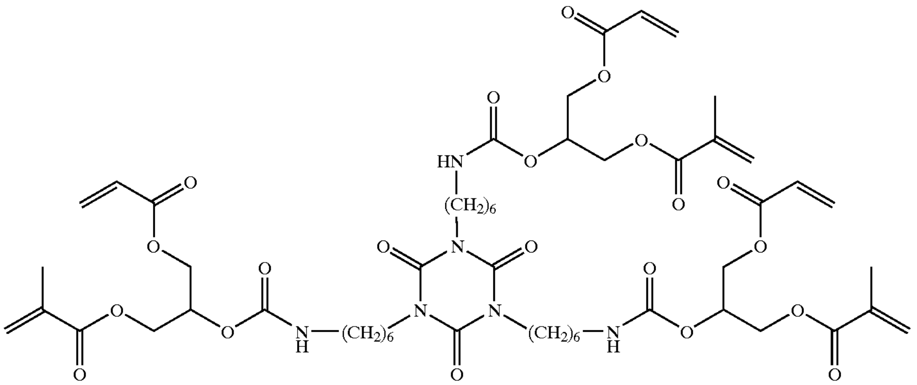

U-6HA
(Shin-Nakamura Kagaku K.K.)

(B-2)

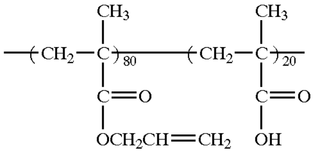

Acid value 1.84meq/g
Mw 40,000

(B-3)

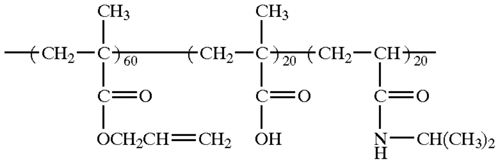

Acid value 1.89meq/g
Mw 136,000

*4)

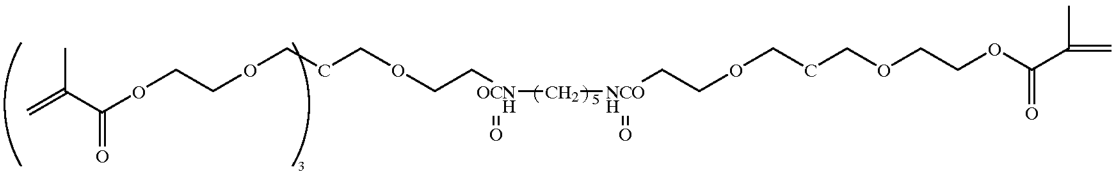

(M-1)

*5)

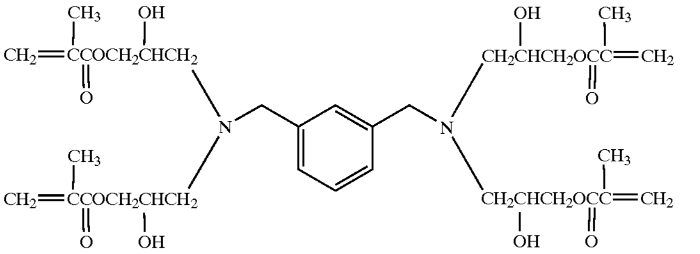

(M-2)

The scan exposure-type lithographic printing original plate of the present invention can provide a printing plate favored with a sufficiently long press life even by high-speed scanning exposure (with low exposure amount) and can reduce the fluctuation in the printing performance of the printing plate depending on the exposure condition.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising:

i) at least one polyurethane resin binder comprising a) at least one diisocyanate compound, b) at least one diol compound selected from the group consisting of polyether diol compound, polyester diol compound and polycarbonate diol compound, and c) at least one carboxylic acid-containing diol compound, ii) at least one compound having at least four addition polymerizable ethylenically unsaturated bonds and at least two urethane structures, and iii) at least one photopolymerization initiation system containing at least one titanocene compound, and iv) at least one sensitizing dye represented by the formula (A-1) or (A-13)

(A-1)

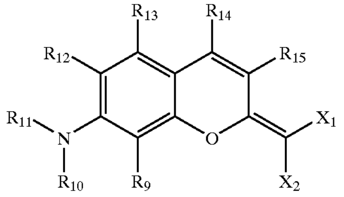

wherein $R_9$ to $R_{13}$ each independently represents a hydrogen atom, a halogen atom, an alkyl group, a substituted alkyl group, an aryl group, a substituted aryl group, an alkenyl group, a substituted alkenyl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group, a nitro group or a silyl group, and $R_9$ and $R_{10}$ or $R_{11}$ and $R_{12}$ may form a ring comprising a nonmetallic atom together with the carbon atoms to which $R_9$ and $R_{10}$ or $R_{11}$ and $R_{12}$ are bonded; $R_{14}$ and $R_{15}$ each independently represents a hydrogen atom, a halogen atom, an alkyl group, a substituted alkyl group, an aryl group, a substituted aryl group, an alkenyl group, a substituted alkenyl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group, a nitro group, a silyl group or a heterocyclic group, and $R_{13}$ and $R_{14}$ or $R_{14}$ and $R_{15}$ may form a ring comprising a nonmetallic atom together with the carbon atoms to which $R_{13}$ and $R_{14}$ or $R_{14}$ and $R_{15}$ are bonded; and $X_1$ and $X_2$ each represents a cyano group or a substituted carbonyl group, and $X_1$ and $X_2$ may be combined to each other to form a ring;

(A-13)

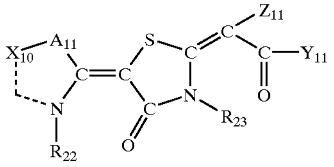

wherein $R_{22}$ and $R_{23}$ each independently represents a hydrogen atom, an alkyl group, a substituted alkyl group, an alkoxycarbonyl group, an aryl group, a substituted aryl group or an aralkyl group, $A_{11}$ represents an oxygen atom, a sulfur atom, a selenium atom, a tellurium atom, an alkyl- or aryl-substituted nitrogen atom or a dialkyl-substituted carbon atom, $X_{10}$ represents a nonmetallic atom group necessary for forming a 5-membered nitrogen-containing heterocyclic ring, $Y_{11}$ represents a substituted phenyl group, an unsubstituted or substituted polynuclear aromatic hydrocarbon group or an unsubstituted or substituted heteroaromatic ring, $Z_{11}$ represents a hydrogen atom, an alkyl group, a substituted alkyl group, an aryl group, a substituted aryl group, an aralkyl group, an alkoxy group, an alkylthio group, an arylthio group, a substituted amino group, an acyl group or an alkoxycarbonyl group, and $Z_{11}$ and $Y_{11}$ may be combined with each other to form a ring.

2. A photopolymerizable composition comprising:

i) at least one polyurethane resin binder comprising:

a) at least one diisocyanate compound, b) at least one diol compound selected from the group consisting of polyether diol compound, polyester diol compound and polycarbonate diol compound, and c) at least one carboxylic acid-containing diol compound, ii) at least one compound having at least four addition polymerizable ethylenically unsaturated bonds and at least two urethane structures, obtained by reacting:

A) a polyisocyanate compound containing at least two isocyanate groups, and

B) a monoalcohol compound having at least two addition polymerizable ethylenically unsaturated bonds, selected from group (2)

Group (2)

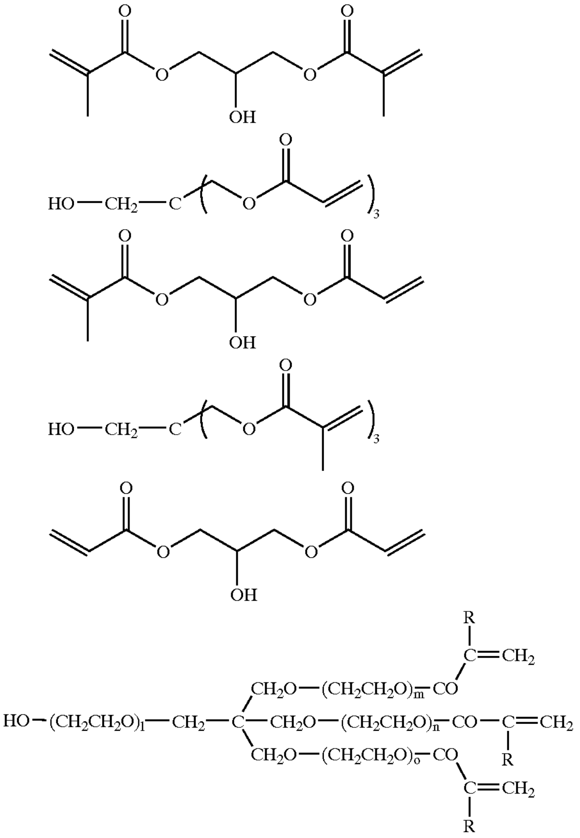

-continued

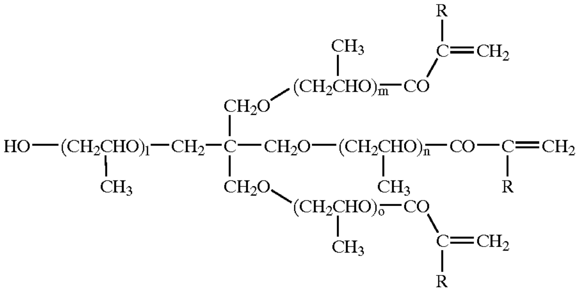

wherein R equals hydrogen or a methyl group l, m, n, o an integer of from 1 to 20, and iii) at least one photopolymerization initiation system containing at least one titanocene compound.

3. A photopolymerizable composition comprising:

i) at least one polyurethane resin binder comprising:

a) at least one diisocyanate compound, b) at least one diol compound selected from the group consisting of polyether diol compound, polyester diol compound and polycarbonate diol compound, and c) at least one carboxylic acid-containing diol compound, ii) at least one compound having at least four addition polymerizable ethylenically unsaturated bonds and at least two urethane structures, obtained by reacting:

A) a polyisocyanate compound containing at least two isocyanate groups, and

B) a monoalcohol compound having at least two addition polymerizable ethylenically unsaturated bonds, selected from group (2)

Group (2)

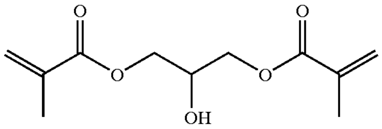

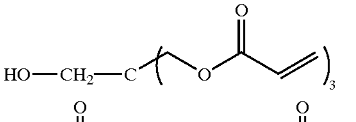

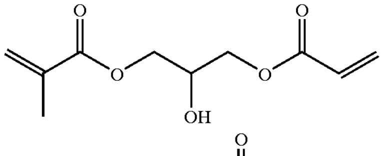

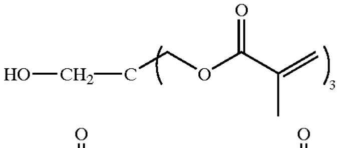

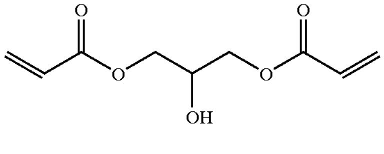

-continued

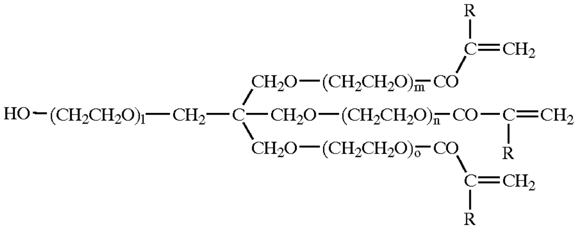

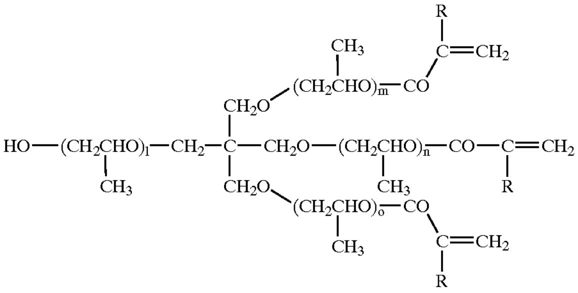

wherein R equals hydrogen or a methyl group 1, m, n, o an integer of from 1 to 20, iii) at least one photopolymerization initiation system containing at least one titanocene compound, and iv) at least one sensitizing dye represented by the formula (A-1) or (A-13).

(A-1)

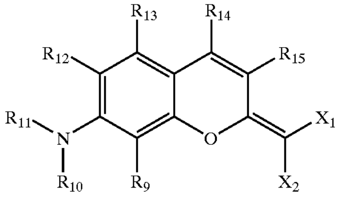

wherein $R_9$ to $R_{13}$ each independently represents a hydrogen atom, a halogen atom, an alkyl group, a substituted alkyl group, an aryl group, a substituted aryl group, an alkenyl group, a substituted alkenyl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group, a nitro group or a silyl group, and $R_9$ and $R_{10}$ or $R_{11}$ and $R_{12}$ may form a ring comprising a nonmetallic atom together with the carbon atoms to which $R_9$ and $R_{10}$ or $R_{11}$ and $R_{12}$ are bonded; $R_{14}$ and $R_{15}$ each independently represents a hydrogen atom, a halogen atom, an alkyl group, a substituted alkyl group, an aryl group, a substituted aryl group, an alkenyl group, a substituted alkenyl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group, a nitro group, a silyl group or a heterocyclic group, and $R_{13}$ and $R_{14}$ or $R_{14}$ and $R_{15}$ may form a ring comprising a nonmetallic atom together with the carbon atoms to which $R_{13}$ and $R_{14}$ or $R_{14}$ and $R_{15}$ are bonded; and $X_1$ and $X_2$ each represents a cyano group or a substituted carbonyl group, and $X_1$ and $X_2$ may be combined to each other to form a ring;

(A-13)

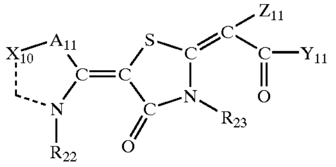

wherein $R_{22}$ and $R_{23}$ each independently represents a hydrogen atom, an alkyl group, a substituted alkyl group, an alkoxycarbonyl group, an aryl group, a substituted aryl group or an aralkyl group, $A_{11}$ represents an oxygen atom, a sulfur atom, a selenium atom, a tellurium atom, an alkyl- or aryl-substituted nitrogen atom or a dialkyl-substituted carbon atom, $X_{10}$ represents a nonmetallic atom group necessary for forming a 5-membered nitrogen-containing heterocyclic ring, $Y_{11}$ represents a substituted phenyl group, an unsubstituted or substituted polynuclear aromatic hydrocarbon group or an unsubstituted or substituted hetero-aromatic ring, $Z_{11}$ represents a hydrogen atom, an alkyl group, a substituted alkyl group, an aryl group, a substituted aryl group, an aralkyl group, an alkoxy group, an alkylthio group, an arylthio group, a substituted amino group, an acyl group or an alkoxycarbonyl group, and $Z_{11}$ and $Y_{11}$ may be combined with each other to form a ring.

4. A method for producing a lithographic printing plate, comprising performing the plate-making by scan exposing a lithographic printing plate original plate having a photosensitive layer comprising:

i) at least one polyurethane resin binder comprising:
  a) at least one diisocyanate compound,
  b) at least one diol compound selected from the group consisting of polyether diol compound, polyester diol compound and polycarbonate diol compound, and
  c) at least one carboxylic acid-containing diol compound, ii) at least one compound having at least four addition polymerizable ethylenically unsaturated bonds and at least two urethane structures, iii) at least one photopolymerization initiation system containing at least one titanocene compound, and iv) at least one sensitizing dye represented by the formula (A-1) or (A-13)

(A-1)

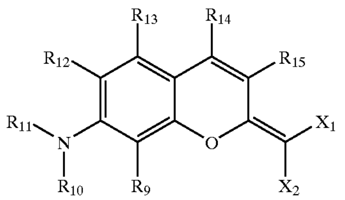

wherein $R_9$ to $R_{13}$ each independently represents a hydrogen atom, a halogen atom, an alkyl group, a substituted alkyl group, an aryl group, a substituted aryl group, an alkenyl group, a substituted alkenyl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group, a nitro group or a silyl group, and $R_9$ and $R_{10}$ or $R_{11}$ and $R_{12}$ may form a ring comprising a nonmetallic atom together with the carbon atoms to which $R_9$ and $R_{10}$ or $R_{11}$ and $R_{12}$ are bonded; $R_{14}$ and $R_{15}$ each independently represents a hydrogen atom, a halogen atom, an alkyl group, a substituted alkyl group, an aryl group, a substituted aryl group, an alkenyl group, a substituted alkenyl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group, a nitro group, a silyl group or a heterocyclic group, and $R_{13}$ and $R_{14}$ or $R_{14}$ and $R_{15}$ may form a ring comprising a nonmetallic atom together with the carbon atoms to which $R_{13}$ and $R_{14}$ or $R_{14}$ and $R_{15}$ are bonded; and $X_1$ and $X_2$ each represents a cyano group or a substituted carbonyl group, and $X_1$ and $X_2$ may be combined to each other to form a ring;

(A-13)

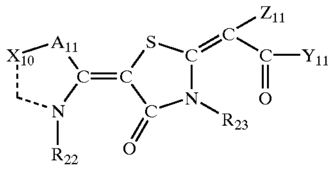

wherein $R_{22}$ and $R_{23}$ each independently represents a hydrogen atom, an alkyl group, a substituted alkyl group, an alkoxycarbonyl group, an aryl group, a substituted aryl group or an aralkyl group, $A_{11}$ represents an oxygen atom, a sulfur atom, a selenium atom, a tellurium atom, an alkyl- or aryl-substituted nitrogen atom or a dialkyl-substituted carbon atom, $X_{10}$ represents a nonmetallic atom group necessary for forming a 5-membered nitrogen-containing heterocyclic ring, $Y_{11}$ represents a substituted phenyl group, an unsubstituted or substituted polynuclear aromatic hydrocarbon group or an unsubstituted or substituted hetero-aromatic ring, $Z_{11}$ represents a hydrogen atom, an alkyl group, a substituted alkyl group, an aryl group, a substituted aryl group, an aralkyl group, an alkoxy group, an alkylthio group, an arylthio group, a substituted amino group, an acyl group or an alkoxycarbonyl group, and $Z_{11}$ and $Y_{11}$ may be combined with each other to form a ring.

5. A method for producing a lithographic printing plate, comprising performing the plate-making by scan exposing a lithographic printing plate original plate having a photosensitive layer comprising:

i) at least one polyurethane resin binder comprising:
  a) at least one diisocyanate compound,
  b) at least one diol compound selected from the group consisting of polyether diol compound, polyester diol compound and polycarbonate diol compound, and
  c) at least one carboxylic acid-containing diol compound, ii) at least one compound having at least four addition polymerizable ethylenically unsaturated bonds and at least two urethane structures, obtained by reacting:
  A) a polyisocyanate compound containing at least two isocyanate groups, and B) a monoalcohol compound having at least two addition polymerizable ethylenically unsaturated bonds, selected from group (2)

Group (2)

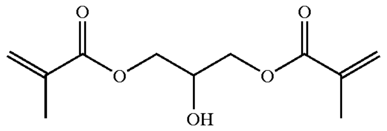

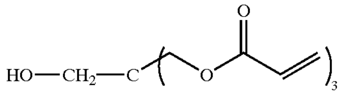

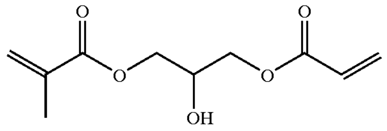

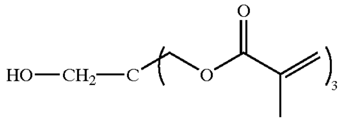

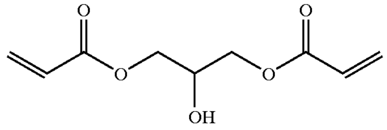

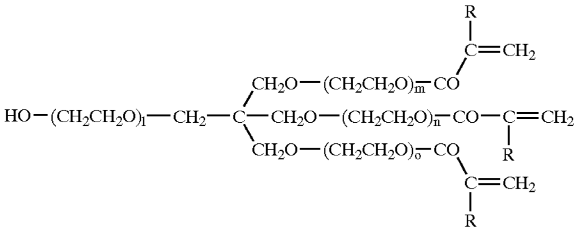

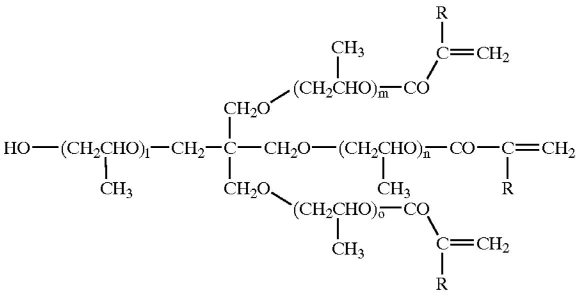

wherein R equals hydrogen or a methyl group l, m, n, o, an integer of from 1 to 20, and iii) at least one photopolymerization initiation system containing at least one titanocene compound.

6. A method for producing a lithographic printing plate, comprising performing the plate-making by scan exposing a lithographic printing plate original plate having a photosensitive layer comprising:

i) at least one polyurethane resin binder comprising:

a) at least one diisocyanate compound, b) at least one diol compound selected from the group consisting of polyether diol compound, polyester diol compound and polycarbonate diol compound, and c) at least one carboxylic acid-containing diol compound, ii) at least one compound having at least four addition polymerizable ethylenically unsaturated bonds and at least two urethane structures, obtained by reacting:

A) a polyisocyanate compound containing at least two isocyanate groups, and

B) a monoalcohol compound having at least two addition polymerizable ethylenically unsaturated bonds, selected from group (2)

Group (2)

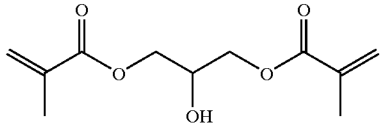

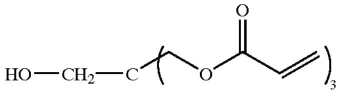

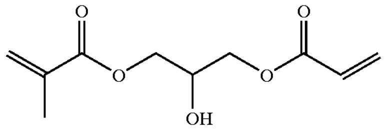

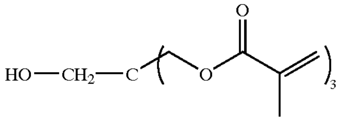

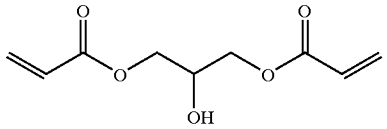

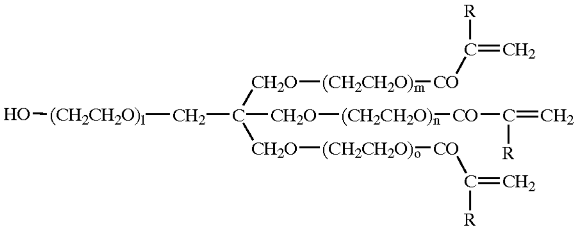

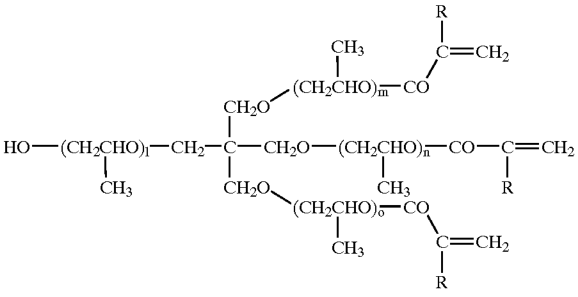

wherein R equals hydrogen or a methyl group l, m, n, o an integer of from 1 to 20;

iii) at least one photopolymerization initiation system containing at least one titanocene compound, and iv) at least one sensitizing dye represented by the formula (A-1) or (A-13).

(A-1)

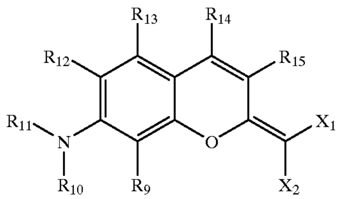

wherein $R_9$ to $R_{13}$ each independently represents a hydrogen atom, a halogen atom, an alkyl group, a substituted alkyl group, an aryl group, a substituted aryl group, an alkenyl group, a substituted alkenyl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group, a nitro group or a silyl group, and $R_9$ and $R_{10}$ or $R_{11}$ and $R_{12}$ may form a ring comprising a nonmetallic atom together with the carbon atoms to which $R_9$ and $R_{10}$ or $R_{11}$ and $R_{12}$ are bonded; $R_{14}$ and $R_{15}$ each independently represents a hydrogen atom, a halogen atom, an alkyl group, a substituted alkyl group, an aryl group, a substituted aryl group, an alkenyl group, a substituted alkenyl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group, a nitro group, a silyl group or a heterocyclic group, and $R_{13}$ and $R_{14}$ or $R_{14}$ and $R_{15}$ may form a ring comprising a nonmetallic atom together with the carbon atoms to which $R_{13}$ and $R_{14}$ or $R_{14}$ and $R_{15}$ are bonded; and $X_1$ and $X_2$ each represents a cyano group or a substituted carbonyl group, and $X_1$ and $X_2$ may be combined to each other to form a ring;

(A-13)

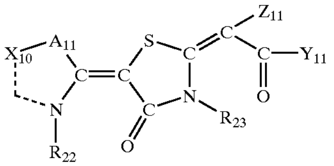

wherein $R_{22}$ and $R_{23}$ each independently represents a hydrogen atom, an alkyl group, a substituted alkyl group, an alkoxycarbonyl group, an aryl group, a substituted aryl group or an aralkyl group, $A_{11}$ represents an oxygen atom, a sulfur atom, a selenium atom, a tellurium atom, an alkyl- or aryl-substituted nitrogen atom or a dialkyl-substituted carbon atom, $X_{10}$ represents a nonmetallic atom group necessary for forming a 5-membered nitrogen-containing heterocyclic ring, $Y_{11}$ represents a substituted phenyl group, an unsubstituted or substituted polynuclear aromatic hydrocarbon group or an unsubstituted or substituted heteroaromatic ring, $Z_{11}$ represents a hydrogen atom, an alkyl group, a substituted alkyl group, an aryl group, a substituted aryl group, an aralkyl group, an alkoxy group, an alkylthio group, an arylthio group, a substituted amino group, an acyl group or an alkoxycarbonyl group, and $Z_{11}$ and $Y_{11}$ may be combined with each other to form a ring.

* * * * *